(12) United States Patent
Kim et al.

(10) Patent No.: US 12,160,961 B2
(45) Date of Patent: Dec. 3, 2024

(54) ELECTRONIC DEVICE INCLUDING FOLDABLE FLEXIBLE PLATE

(71) Applicant: Samsung Electronics Co., Ltd., Gyeonggi-do (KR)

(72) Inventors: Hoyeon Kim, Gyeonggi-do (KR); Seongjun Kim, Gyeonggi-do (KR); Kwanghee Ryu, Gyeonggi-do (KR); Jungchul An, Gyeonggi-do (KR); Youngjae Kwon, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 321 days.

(21) Appl. No.: 17/713,506

(22) Filed: Apr. 5, 2022

(65) Prior Publication Data

US 2022/0287189 A1 Sep. 8, 2022

Related U.S. Application Data

(63) Continuation of application No. PCT/KR2022/003033, filed on Mar. 3, 2022.

(30) Foreign Application Priority Data

Mar. 5, 2021 (KR) .................. 10-2021-0029533
Dec. 2, 2021 (KR) .................. 10-2021-0171175

(51) Int. Cl.
*H05K 5/00* (2006.01)
*H05K 5/02* (2006.01)

(52) U.S. Cl.
CPC ......... *H05K 5/0017* (2013.01); *H05K 5/0226* (2013.01)

(58) Field of Classification Search
CPC .. H05K 5/0226; H05K 5/0017; H05K 5/0018; G06F 1/1652; G06F 1/1681; H04M 1/0214; H04M 1/0268
See application file for complete search history.

(56) References Cited

U.S. PATENT DOCUMENTS 8,787,016 B2 * 7/2014 Rothkopf ............ H04M 1/0268
361/679.55
10,254,795 B2 * 4/2019 Huitema ............... G06F 1/1694
(Continued)

FOREIGN PATENT DOCUMENTS

JP 2018-112836 A 7/2018
KR 10-2018-0015225 A 2/2018
(Continued)

OTHER PUBLICATIONS

International Search Report Dated Jun. 3, 2022.
Extended European Search Report dated May 8, 2024.

*Primary Examiner* — Rockshana D Chowdhury
*Assistant Examiner* — Douglas R Burtner
(74) *Attorney, Agent, or Firm* — Cha & Reiter, LLC

(57) ABSTRACT

An electronic device is disclosed, including a hinge module, a first and second housing foldable about the hinge module, and a display spanning the housings. The display includes at least one polymer member, a flexible plate including a flexible portion that is bendable connecting first and second planar portions thereof. The flexible portion includes a plurality of support pieces spaced apart from each other via a plurality of slits, and a plurality of Velcro patterns extending lengthwise from the plurality of support pieces. The Velcro patterns of adjacent support pieces are disposed so as to be engaged with one another in a lattice form.

20 Claims, 43 Drawing Sheets

(56) References Cited

U.S. PATENT DOCUMENTS

| | | | |
|---|---|---|---|
| 11,079,620 B2* | 8/2021 | Inagaki | G04G 21/02 |
| 11,199,873 B2* | 12/2021 | Lim | G06F 1/1616 |
| 11,817,025 B1* | 11/2023 | Wang | G09G 3/03 |
| 11,830,391 B2* | 11/2023 | Eguchi | H05K 5/0226 |
| 2007/0138955 A1* | 6/2007 | Tuma | G02F 1/133308 |
| | | | 313/1 |
| 2011/0193829 A1* | 8/2011 | Tsai | G09F 9/30 |
| | | | 345/204 |
| 2016/0026297 A1 | 1/2016 | Shinkai et al. | |
| 2016/0155965 A1* | 6/2016 | Kusuura | H10K 71/50 |
| | | | 29/829 |
| 2016/0266672 A1* | 9/2016 | Inagaki | G04G 21/02 |
| 2018/0135674 A1* | 5/2018 | Cosgrove | H10K 77/111 |
| 2018/0277790 A1* | 9/2018 | Han | H05K 5/0017 |
| 2019/0207141 A1* | 7/2019 | Kim | H10K 50/841 |
| 2020/0233465 A1* | 7/2020 | Lim | G06F 1/1669 |
| 2021/0029841 A1 | 1/2021 | Kim et al. | |
| 2022/0051594 A1 | 2/2022 | Eguchi et al. | |
| 2022/0206613 A1 | 6/2022 | Choi et al. | |
| 2022/0256020 A1* | 8/2022 | Liu | H04M 1/0262 |
| 2023/0088689 A1* | 3/2023 | Ahn | G06F 1/1652 |
| | | | 361/679.02 |
| 2023/0373425 A1* | 11/2023 | Davis | B60R 21/12 |

FOREIGN PATENT DOCUMENTS

| | | |
|---|---|---|
| KR | 10-2019-0080740 A | 7/2019 |
| KR | 10-2121267 B1 | 6/2020 |
| KR | 10-2021-0012930 A | 2/2021 |
| KR | 10-2021-0016938 A | 2/2021 |
| KR | 10-2021-0016983 A | 2/2021 |
| KR | 10-2022-0096122 A | 7/2022 |
| KR | 10-2479942 B1 | 12/2022 |
| KR | 10-2023-0018755 A | 2/2023 |
| WO | 2020/121139 A1 | 6/2020 |
| WO | 2023/000445 A1 | 1/2023 |

* cited by examiner

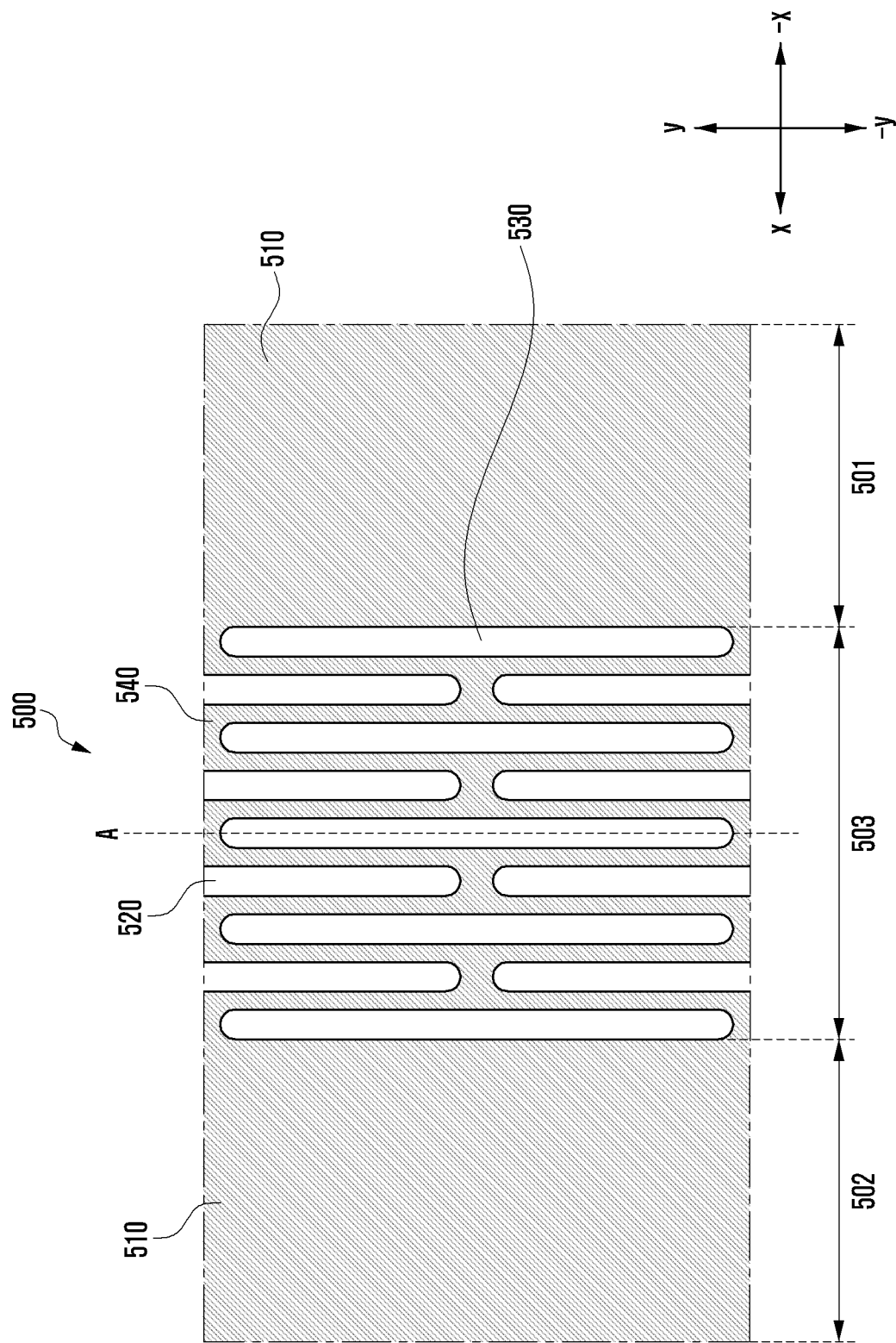

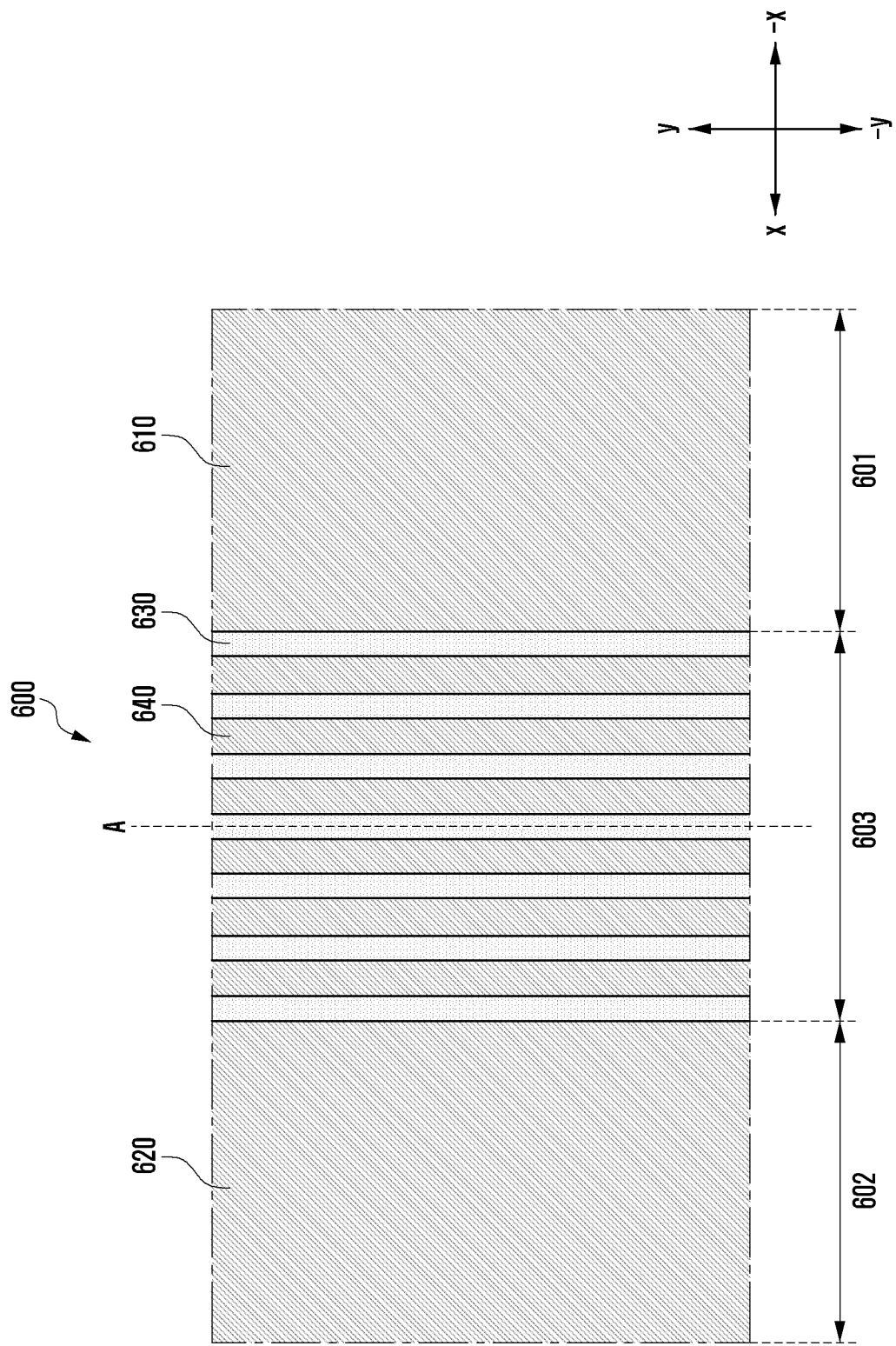

FIG. 7
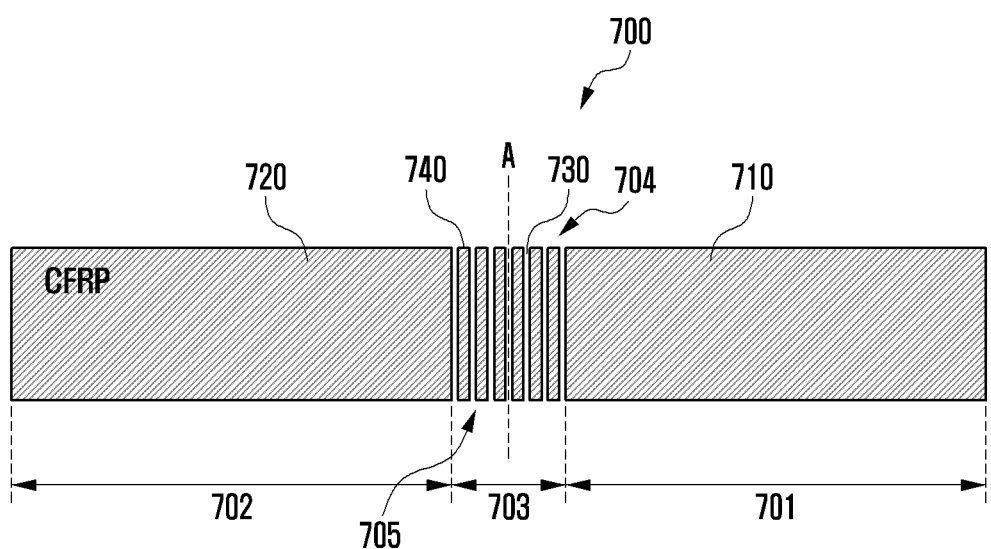
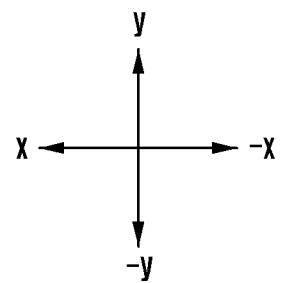

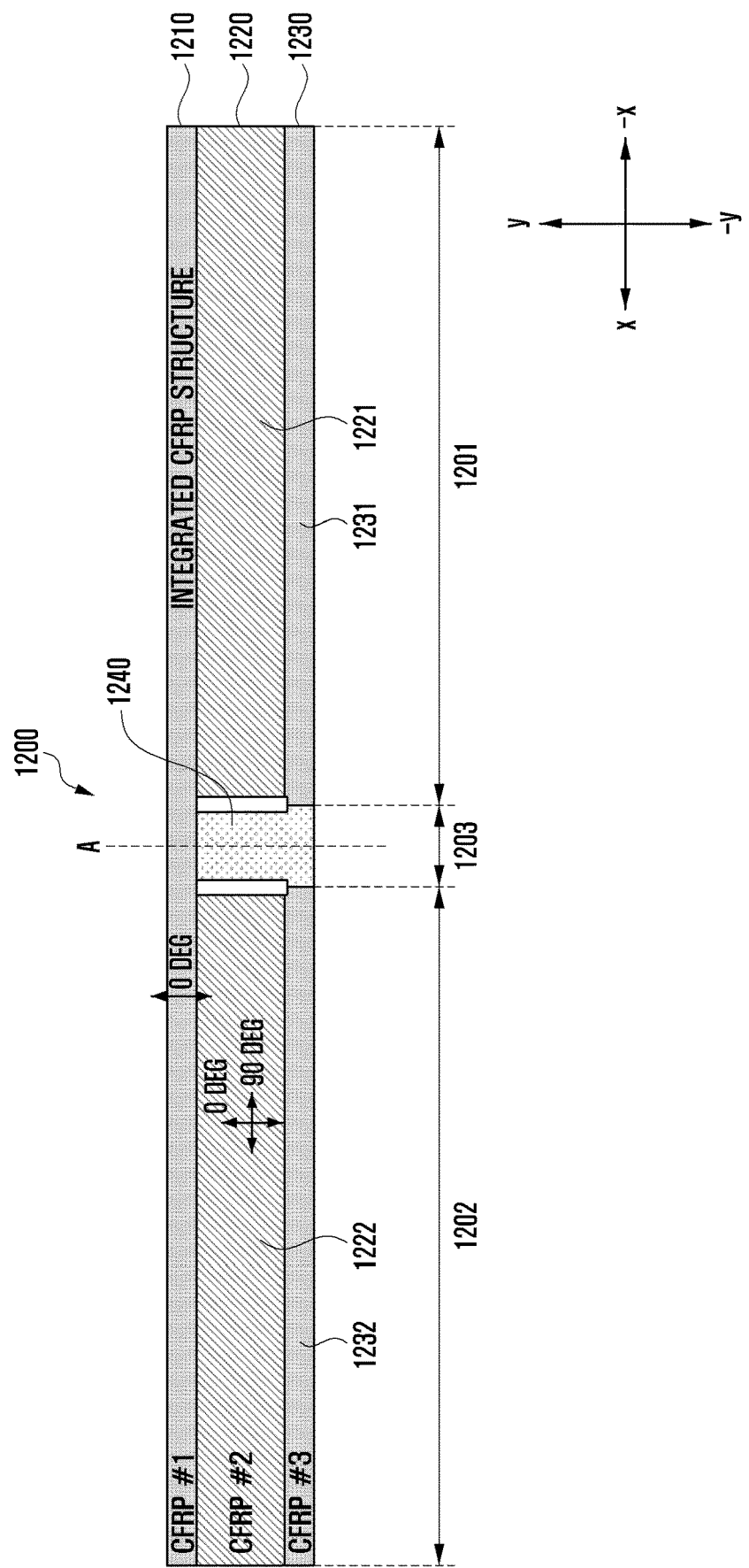

COMPRESSED STATE

LINE CUTTING METHOD

LINE CUTTING METHOD
(SHORTEN PROCESSING PATH)

ELECTRONIC DEVICE INCLUDING FOLDABLE FLEXIBLE PLATE

CROSS-REFERENCE TO RELATED APPLICATION(S)

This application is a Continuation of and claims priority under 35 U.S.C. § 120 to PCT International Application No. PCT/KR2022/003033, which was filed on Mar. 3, 2022, and claims priority to Korean Patent Application No. 10-2021-0029533, filed on Mar. 5, 2021, and Korean Patent Application No. 10-2021-0171175, filed on Dec. 2, 2021, in the Korean Intellectual Property Office, the disclosures of which are incorporated by reference herein their entirety.

TECHNICAL FIELD

Certain embodiments of the disclosure relate to an electronic device including a foldable flexible plate.

DESCRIPTION OF RELATED ART

Recent design trends for portable electronic devices include increased slimness, rigidity and improved aesthetics, in further attempts to match consumer preferences. Sometimes, these elements serve to differentiate functional elements of the devices. These evolutions include a gradual shift away from a plain rectangular form to a greater diversity of shapes. For example, an electronic device may be implemented with a deformable structure, allowing physical reconfiguration from the rectangular shape to another shape. For example, this may allow a portable device to utilize a large-screen display without impacting portability.

SUMMARY

Foldable electronic devices may benefit from an improved support structure.

A foldable electronic device may include a hinge structure, a first housing structure and a second housing structure operably connected to the hinge structure. The foldable electronic device may be operated in an in-folding type and/or in an out-folding type by rotating the first housing structure in a range of 0 to 360 degrees relative to the second housing structure via the hinge structure. The foldable electronic device may include a flexible display that spans across the first housing structure and the second housing structure when the device is opened to 180 degrees.

In general, an electronic device having a single housing (e.g., a bar-type electronic device) may include at least one flexible plate that is arranged on the rear surface of a display in an inner space thereof, which may help to reinforce rigidity by providing support for the display, and to shield electromagnetic noise. The flexible plate may be grounded to a printed circuit board ground that is disposed within the electronic device.

In the case of a foldable electronic device, a first housing structure and a second housing structure may be separated from one another by moving relative to one another using a hinge structure. Accordingly, in the case of a flexible plate that is not foldable, the two flexible plates may be separated and arranged in respective housing structures. In a structure in which the flexible plates are separated and arranged, folding marks may be generated in portions of a display facing the edge portions of respective flexible plates near the hinge structure, due to the frequent folding operation of the electronic device. These fold marks cause malfunctions within the electronic device and may deteriorate operational reliability.

According to certain embodiments of the disclosure, a flexible plate is provided, supporting a display panel capable of reducing weight, and increasing flexibility and durability.

According to certain embodiments of the disclosure, a flexible plate is provided, that improves the surface quality of a flexible display by forming a flat top surface of the flexible plate.

According to certain embodiments of the disclosure, an electronic device including a foldable flexible plate is disclosed.

According to certain embodiments of the disclosure, an electronic device including a foldable flexible plate is disclosed, the flexibility of which is adjustable for each area according to folding characteristics.

According to certain embodiments of the disclosure, an electronic device including a foldable flexible plate is disclosed, which may reduce manufacturing cost and increase the reliability of the final assembly.

An electronic device according to certain embodiments of the disclosure may include a hinge module forming a folding axis, a first housing operatively connected to the hinge module, a second housing operatively connected to the hinge module, so as to be foldable relative to the first housing, a display disposed on and spanning from at least a portion of the first housing to at least a portion of the second housing across the hinge module, wherein the display includes a display panel, at least one polymer member arranged on a rear surface of the display panel, and a flexible plate arranged on a rear surface of the at least one polymer member, wherein the flexible plate includes a first planar portion facing the first housing, a second planar portion facing the second housing, and a flexible portion that is bendable, and interconnecting the first planar portion and the second planar portion, wherein the flexible portion includes a plurality of support pieces spaced apart from each other via a plurality of slits, and a plurality of Velcro patterns extending lengthwise from the plurality of support pieces, and wherein the Velcro patterns of adjacent support pieces are disposed so as to be engaged with one another in a lattice form.

According to certain embodiments of the disclosure, by providing the foldable flexible plate into separate components to support the foldable flexible display, it is possible to increase strength in a folding area, and to adjust flexibility for each area according to various folding characteristics of the electronic device, so that operational reliability of the folding mechanism can be improved.

According to certain embodiments of the disclosure, it is possible to improve the surface quality of the display by breaking the foldable flexible plate into separate components to support the foldable flexible display.

BRIEF DESCRIPTION OF THE DRAWINGS

In connection with the description of the drawings, the same or similar components may be denoted by the same or similar reference numerals.

FIG. 5B is a view illustrating a flexible plate according to certain embodiments of the disclosure.

FIG. 6 is a view illustrating a flexible plate according to certain embodiments of the disclosure.

FIG. 7 is a view illustrating a flexible plate according to certain embodiments of the disclosure.

FIG. 12 is a view illustrating an orientation direction of a flexible plate along a folding axis according to certain embodiments of the disclosure.

DETAILED DESCRIPTION

Figure 1:
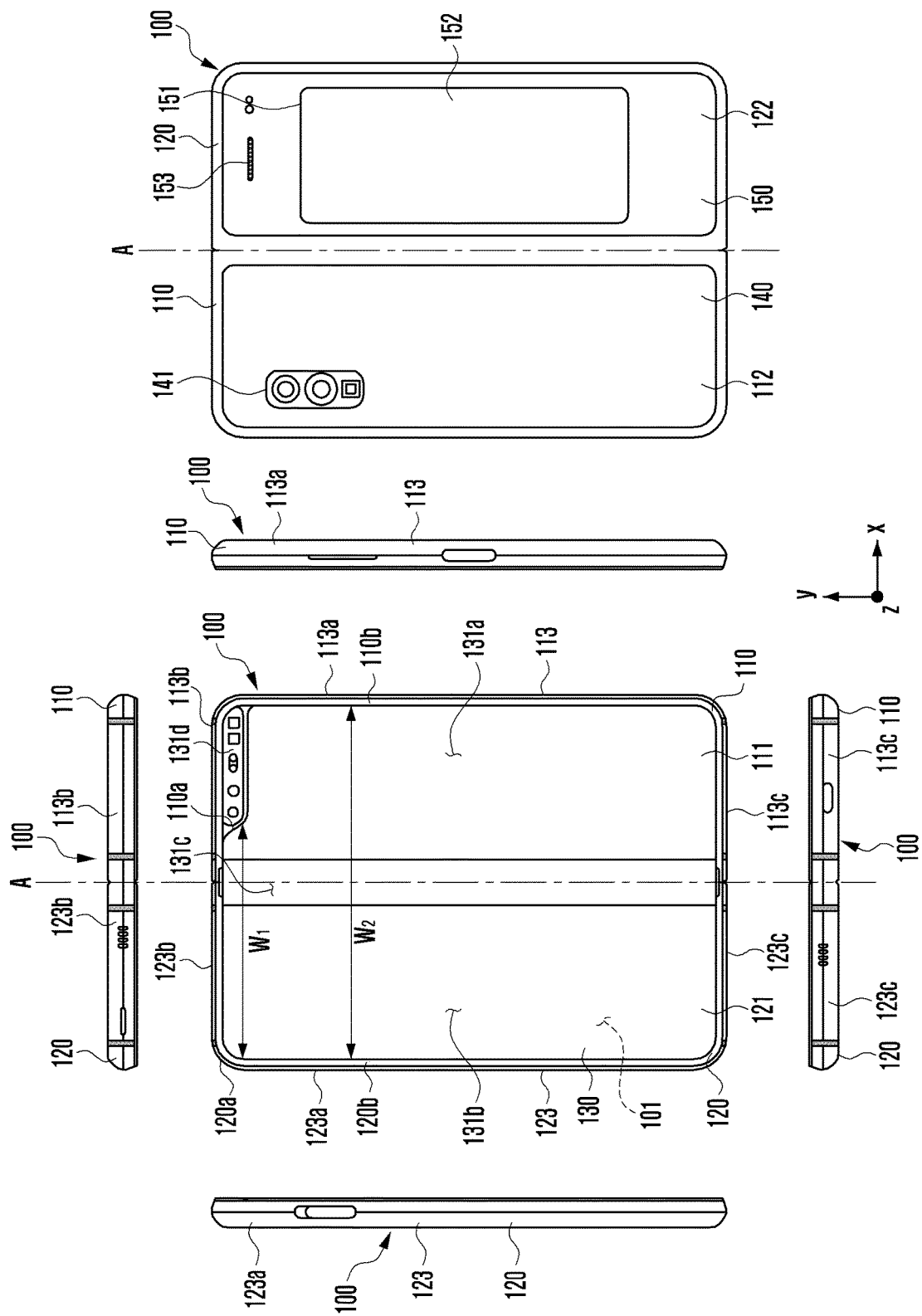
FIG. 1 is a view illustrating an unfolded state of an electronic device according to certain embodiments of the disclosure.
Figure 2:
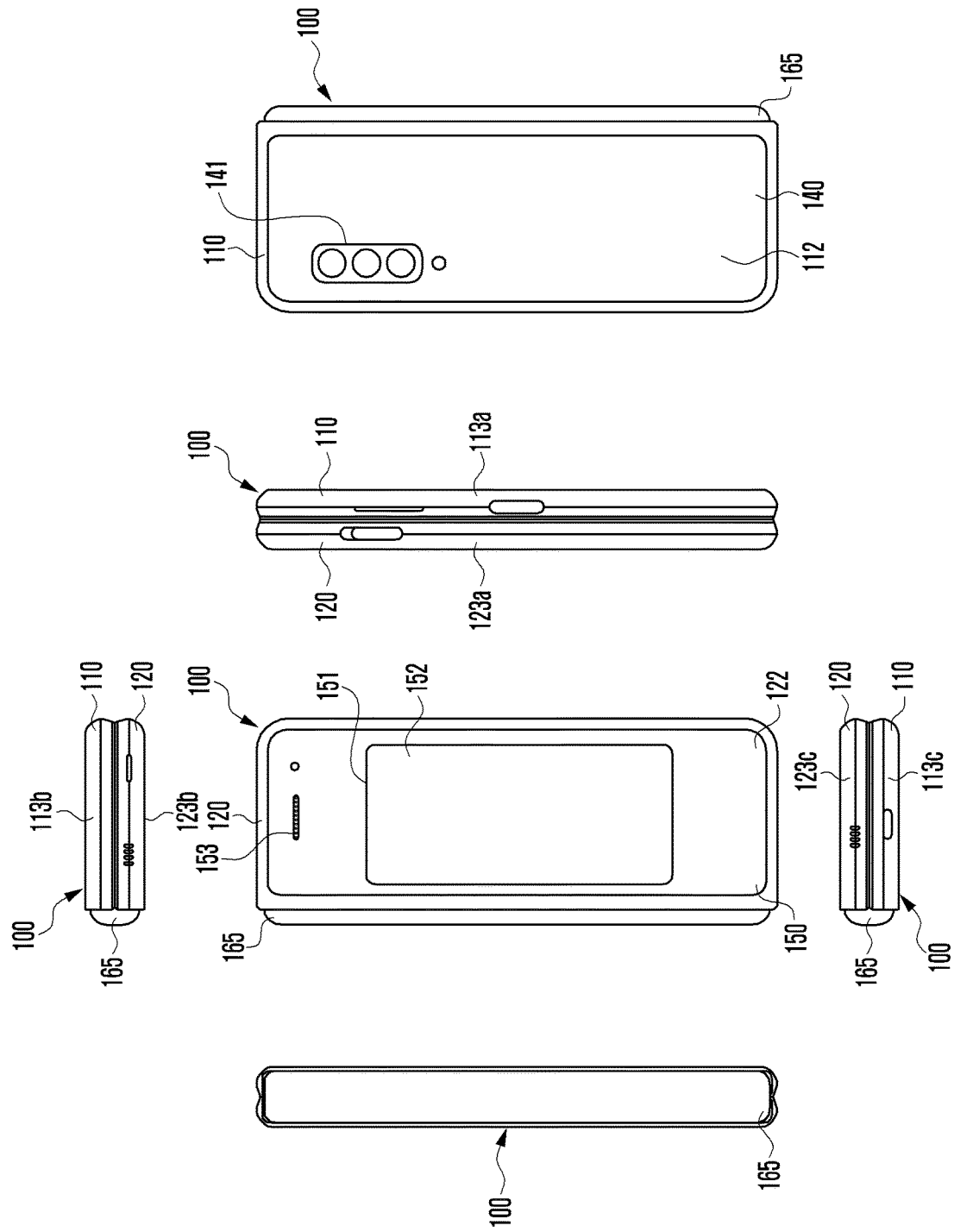
FIG. 2 is a view illustrating a folded state of the electronic device of FIG. 1 according to certain embodiments of the disclosure.

FIG. 1 is a view illustrating an unfolded state of an electronic device 100 according to certain embodiments of the disclosure. FIG. 2 is a view illustrating a folded state of the electronic device 100 of FIG. 1 according to certain embodiments of the disclosure.

Referring to FIGS. 1 and 2, the electronic device 100 may include a pair of housing structures 110 and 120 (e.g., foldable housing structures), a hinge cover 165, and a display 130 (e.g., a flexible display or a foldable display).

According to an embodiment, the pair of housing structures 110 and 120 (e.g., foldable housing structures) are rotatably coupled via a hinge structure (e.g., the hinge structure 164 in FIG. 3) to be folded relative to each other. According to an embodiment, the hinge cover 165 may cover foldable portions of the pair of housing structures 110 and 120. According to an embodiment, the display 130 (e.g., a flexible display or a foldable display) may be arranged in a space defined by a pair of housing structures 110 and 120.

Herein, the surface on which the display 130 is arranged may be defined as the front surface of the electronic device 100, and the surface opposite to the front surface may be defined as the rear surface of the electronic device 100. In addition, the surface surrounding the space between the front surface and the rear surface may be defined as the side surface of the electronic device 100.

In an embodiment, the pair of housing structures 110 and 120 may include a first housing structure 110 including a sensor area 131d, a second housing structure 120, a first rear cover 140, and a second rear cover 150. The pair of housing structures 110 and 120 of the electronic device 100 are not limited to the shape and assembly illustrated in FIGS. 1 and 2, but may be implemented by other combinations and/or assemblies of other shapes or components. For example, in another embodiment, the first housing structure 110 and the first rear cover 140 may be integrated with each other, and the second housing structure 120 and the second rear cover 150 may be integrated with each other.

According to an embodiment, the first housing structure 110 and the second housing structure 120 may be arranged on opposite sides about a folding axis (the axis A), and may have generally symmetrical shapes with respect to the folding axis (the axis A).

According to an embodiment, the angle or distance between the first housing structure 110 and the second housing structure 120 may vary depending on whether the electronic device 100 is in the unfolded state (the flat state), in the folded state (the closed state), or in the intermediate state.

According to an embodiment, the first housing structure 110 may further include a sensor area 131d in which various sensors are disposed, unlike the second housing structure 120. In an area other than the sensor area 131d, the first housing structure 110 and the second housing structure 120 may have mutually symmetrical shapes. As another embodiment, the sensor arrangement area 131d may be additionally arranged or replaced in at least a partial area of the second housing structure 120.

In a certain embodiment, the first housing structure 110 may be connected to the hinge structure (e.g., the hinge structure 164 in FIG. 3) in the unfolded state of the electronic device 100. The first housing structure 110 may include a first surface 111 arranged to face the front side of the electronic device 100, a second surface 112 facing the opposite side to the first surface 111, and a first side member 113 surrounding at least a portion of the space between the first surface 111 and the second surface 112.

In an embodiment, the first side member 113 may include a first side surface 113a arranged parallel to the folding axis (the axis A), a second side surface 113b extending from one end of the first side surface 113a in a direction perpendicular to the folding axis, and a third surface 113c extending from the other end of the first side surface 113a in a direction perpendicular to the folding axis (the axis A) and parallel to the second side surface 113b.

In a certain embodiment, the second housing structure 120 may be connected to the hinge structure (e.g., the hinge structure 164 in FIG. 3) in the unfolded state of the electronic device 100. The second housing structure 120 may include a third surface 121 arranged to face the front side of the electronic device 100, a fourth surface 122 facing the opposite side to the third surface 121, and a second side member 123 surrounding at least a portion of the space between the third surface 121 and the fourth surface 122. In a certain embodiment, the second side member 123 may include a fourth side surface 123a arranged parallel to the folding axis (the axis A), a fifth side surface 123b extending from one end of the fourth side surface 123a in a direction perpendicular to the folding axis (the axis A), and a sixth surface 123c extending from the other end of the fourth side surface 123a in a direction perpendicular to the folding axis (the axis A) and parallel to the fifth side surface 123b. In an embodiment, in the folded state, the first surface 111 may face the third surface 121.

In a certain embodiment, the electronic device 100 may include a recess 101 configured to accommodate the display 130 through structural coupling of the first housing structure 110 and the second housing structure 120. The recess 101 may have substantially the same size as the display 130.

In a certain embodiment, due to the sensor area 131d, the recess 101 may have two or more different widths in a direction perpendicular to the folding axis (the axis A). For example, the recess 101 may have a first width W1 between a first portion 110a provided at an edge of the sensor area 131d of the first housing structure 110 and a second portion 120a of the second housing structure 120 parallel to the folding axis (axis A), and a second width $W_2$ between a third portion 110b of the first housing structure 110 parallel to the folding axis (the axis A) while not corresponding to the sensor area 113d and a fourth portion 120b of the second housing structure 110. In this case, the second width $W_2$ may be longer than the first width $W_1$. For example, the recess 101 may be configured to have the first width $W_1$ from the first portion 110a of the first housing structure 110 to the second portion 120a of the second housing structure 120, in which the first and second portions are asymmetric to each other, and the second width $W_2$ from the third portion 110b of the first housing structure 110 to the fourth portion 120b of the second housing structure 120, such that the third and fourth portions are symmetric to each other.

In a certain embodiment, the first portion 110a and the third portion 110b of the first housing structure 110 may be configured to have different distances from the folding axis (the axis A). The widths of the recess 101 are not limited to the illustrated example. In certain embodiments, the recess 101 may have two or more different widths due to the shape of the sensor area 131d or the asymmetric portions of the first housing structure 110 and the second housing structure 120.

In a certain embodiment, at least a portion of the first housing structure 110 and at least a portion of the second housing structure 120 may be formed of a metal material or a non-metal material having rigidity, the level of which is selected in order to support the display 130.

In a certain embodiment, the electronic device 100 may include electronic components configured to perform various functions and arranged so as to be exposed to the front surface of the electronic device 100 through the sensor area 131d or one or more openings provided in the sensor area 131d. In certain embodiments, the electronic components may include, for example, at least one of a front camera device, a receiver, a proximity sensor, an illuminance sensor, an iris recognition sensor, an ultrasonic sensor, or an indicator.

In a certain embodiment, the first rear cover 140 may be arranged on the second surface 112 of the first housing structure 110. The first rear cover 140 may have a substantially rectangular periphery. In a certain embodiment, at least a portion of the edge may be enclosed by the first housing structure 110. Similarly, the second rear cover 150 may be arranged on the fourth surface 122 of the second housing structure 120, and at least a portion of the periphery of the second rear cover 150 may be at least partially enclosed by the second housing structure 120.

In a certain embodiment, the first rear cover 140 and the second rear cover 150 may have substantially symmetrical shapes with respect to the folding axis (axis A). As another embodiment, the first rear cover 140 and the second rear cover 150 may include various shapes different from each other. As another embodiment, the first rear cover 140 may be integrated with the first housing structure 110, and the second rear cover 150 may be integrated with the second housing structure 120.

In a certain embodiment, the first rear cover 140, the second rear cover 150, the first housing structure 110, and the second housing structure 120 may provide, through a mutually coupled structure, a space in which various components (e.g., a printed circuit board, an antenna module, a sensor module, or a battery) of the electronic device 100 are arranged. In a certain embodiment, one or more components may be arranged or visually exposed on the rear surface of the electronic device 100. For example, one or more components or sensors may be visually exposed through a first rear area 141 of the first rear cover 140. In certain embodiments, the sensors may include a proximity sensor, a rear camera device, and/or a flash. In another embodiment, at least a portion of a sub-display 152 may be visually exposed through a second rear area 151 of the second rear cover 150. In another embodiment, the electronic device 100 may include a speaker module 153, which is arranged so as to be exposed to at least a partial area of the second rear cover 150.

In a certain embodiment, the display 130 may be arranged in a space defined by the pair of housing structures 110 and 120. For example, the display 130 may be seated in the recess 101 defined by the pair of housing structures 110 and 120, and may be arranged to occupy substantially the majority of the front surface of the electronic device 100. Accordingly, the front surface of the electronic device 100 may include the display 130, as well as a partial area (e.g., a peripheral area) of the first housing structure 110 and a partial area (e.g., a peripheral area) of the second housing structure 120, which are adjacent to the display 130.

In a certain embodiment, the rear surface of the electronic device 100 may include the first rear cover 140 and a partial area (e.g., a peripheral area) of the first housing structure 110 adjacent to the first rear cover 140, as well as the second rear cover 150 and a partial area (e.g., a peripheral area) of the second housing structure 120 adjacent to the second rear cover 150.

In a certain embodiment, the display 130 may be a display in which at least a partial area is deformable into a planar surface or a curved surface. In a certain embodiment, the display 130 may include a folding area 131c, a first area 131a arranged on one side of the folding area 131c (e.g., the right area of the folding area 131c), and a second area 131b arranged on the other side of the folding area 131c (e.g., the left area of the folding area 131c). For example, the first area 131a may be arranged in the first surface 111 of the first housing structure 110, and the second area 131b may be arranged in the third surface 121 of the second housing structure 120.

In a certain embodiment, the area division of the display 130 given by way of example, and the display 130 may be divided into multiple areas (e.g., four or more areas or two areas) depending on the structure or functions thereof. As an example, in the embodiment illustrated in FIG. 1, the area of the display 130 may be divided by the folding area 131c extending parallel to the y-axis or the folding axis (A-axis). In another embodiment, the areas of the display 130 may be divided based on another folding area (e.g., a folding area parallel to the x axis) or another folding axis (e.g., a folding axis parallel to the x axis). The aforementioned area division of the display is merely physical division based on the pair of housing structures 110 and 120 and the hinge structure (e.g., the hinge structure 164 in FIG. 3), and the display 130 may display one full screen substantially through the pair of housing structures 110 and 120 and the hinge structure (e.g., the hinge structure 164 in FIG. 3). In a certain embodiment, the first area 131a and the second area 131b may have generally symmetrical shapes with respect to the folding area 131c. However, unlike the second area 131b, the first area 131a may include a cut notch area (e.g., the notch area 133 in FIG. 3), depending on the existence of the sensor area 131d, and may have a shape symmetrical to the second area 131b in the area other than the notch area. In other words, the first area 131a and the second area 131b may include mutually symmetrical portions and mutually asymmetrical portions.

Figure 3:
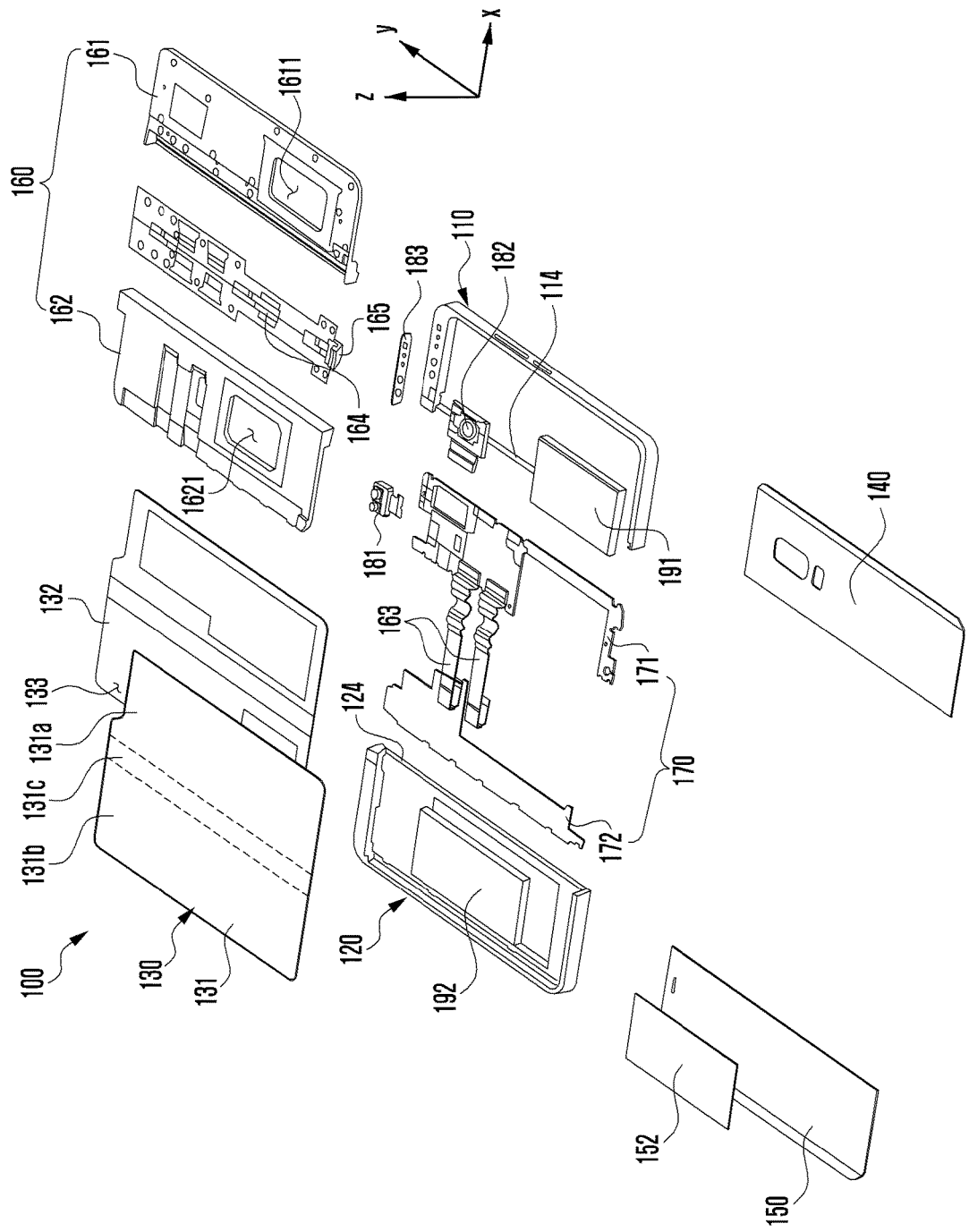
FIG. 3 is an exploded perspective view of the electronic device according to certain embodiments of the disclosure.

The hinge cover 165 illustrated in FIG. 2 may be arranged between the first housing structure 110 and the second housing structure 120 to cover an internal component (e.g., the hinge structure 164 in FIG. 3). In a certain embodiment, the hinge cover 165 may be covered by a portion of the first housing structure 110 and a portion of the second housing structure 120 or may be exposed to the outside depending on the operating state of the electronic device 100 (the unfolded state or the folded state).

As an example, as illustrated in FIG. 1, when the electronic device 100 is in the unfolded state, the hinge cover 165 may not be exposed by being covered by the first housing structure 110 and the second housing structure 120. As an example, as illustrated in FIG. 2, when the electronic device 100 is in the folded state (e.g., the completely folded state), the hinge cover 165 may be exposed to the outside between the first housing structure 110 and the second housing structure 120. As an example, when the first housing structure 110 and the second housing structure 120 are in the intermediate state in which the first housing structure 110 and the second housing structure 120 are folded with a certain angle therebetween, the hinge cover 165 may be partially exposed to the outside of the electronic device 100 between the first housing structure 110 and the second housing structure 120. In this case, the exposed area may be smaller than that in the completely folded state. In a certain embodiment, the hinge cover 165 may include a curved surface.

Hereinafter, the operations of the first housing structure 110 and the second housing structure 120 and respective areas of the display 130 according to the operating states (e.g., the unfolded state (the flat state) and the folded state) of the electronic device 100 will be described.

In a certain embodiment, when the electronic device 100 is in the unfolded state (the flat state) (e.g., the state of FIG. 1), the first housing structure 110 and the second housing structure 120 may form an angle of 180 degrees therebetween, and the first area 131a and the second area 131b of the display may be oriented in the same direction. In addition, the folding area 131c may form the same plane as the first area 131a and the second area 131b. As another embodiment, when the electronic device 100 is in the unfolded state (flat state), the first housing structure 110 may rotate by an angle of 360 degrees relative to the second housing structure 120 such that the second surface 112 and the fourth surface 122 are reversely folded to face each other.

In a certain embodiment, when the electronic device 100 is in the folded state (e.g., the state of FIG. 2), the first housing structure 110 and the second housing structure 120 may be arranged to face each other. The first area 131a and the second area 131b of the display 130 may face each other while forming a narrow angle (e.g., an angle between 0 and 10 degrees) relative to each other. At least a portion of the folding area 131c may be formed in a curved surface having a predetermined curvature.

In a certain embodiment, when the electronic device 100 is in the intermediate state, the first housing structure 110 and the second housing structure 120 may be arranged to form a predetermined angle therebetween. The first area 131*a* and the second area 131*b* of the display 130 may form therebetween an angle greater than that in the folded state and smaller than that in the unfolded state. At least a portion of the folding area 131*c* may be formed as a curved surface having a predetermined curvature, and the curvature in this case may be smaller than that in the folded state.

FIG. 3 is an exploded perspective view of an electronic device 100 according to certain embodiments of the disclosure.

Referring to FIG. 3, the electronic device 100 according to certain embodiments of the disclosure may include a display 130, a support member assembly 160, at least one printed circuit board 170, a first housing structure 110, a second housing structure 120, a first rear cover 140, and a second rear cover 150.

According to an embodiment, the display 130 may include a display panel 131 (e.g., a flexible display panel), and at least one plate 132 or layer on which the display panel 131 is seated. In a certain embodiment, the at least one plate 132 may include a flexible plate (e.g., the flexible plate 500 in FIGS. 4A and 5A) arranged between the display panel 131 and the support member assembly 160 (e.g., a Cu sheet or a SUS sheet). According to an embodiment, the flexible plate (e.g., the flexible plate 500 in FIGS. 4A and 5A) may include a conductive metal.

According to an embodiment, the flexible plate (e.g., the flexible plate 500 in FIGS. 4A and 5A) may have substantially the same area as the display 130, and the area facing the folding area of the display may be configured to be bendable. The plate 132 may include at least one auxiliary material layer (e.g., a graphite member) arranged on the rear surface of the display panel 131. In a certain embodiment, the plate 132 may have a shape corresponding to that of the display panel 131. For example, a partial area of the first plate 132 may have a shape corresponding to that of a notch area 133 in the display panel 131.

The support member assembly 160 may include a first support member 161 (e.g., the first support plate), a second support member 162 (e.g., the second support plate), a hinge structure 164 arranged between the first support member 161 and the second support member 162, a hinge cover 165 that covers the hinge structure 164 when the hinge structure 164 is viewed from the outside, and at least one wiring member 163 (e.g., a flexible printed circuit board (FPCB)) extending across the first and second support members 161 and 162.

In a certain embodiment, the support member assembly 160 may be arranged between the plate 132 and at least one printed circuit board 170. As an example, the first support member 161 may be arranged between the first area 131*a* of the display 130 and a first printed circuit board 171. The second support member 162 may be arranged between the second area 131*b* of the display 130 and a second printed circuit board 172.

In a certain embodiment, the wiring member 163 and the hinge structure 164 may be at least partially arranged inside the support member assembly 160. The wiring member 163 may be arranged in a direction across the first support member 161 and the second support member 162 (e.g., in the x-axis direction). The wiring member 163 may be arranged in a direction perpendicular to the folding axis (e.g., they axis or the folding axis A in FIG. 1) of the folding area 131*c* (e.g., in the x-axis direction).

In a certain embodiment, the at least one printed circuit board 170 may include a first printed circuit board 171 arranged on the first support member 161 side and a second printed circuit board 172 arranged on the second support member 162 side. The first printed circuit board 171 and the second printed circuit board 172 may be arranged in a space defined by the support member assembly 160, the first housing structure 110, the second housing structure 120, the first rear cover 140, and the second rear cover 150. Components for implementing various functions of the electronic device 100 may be mounted on the first printed circuit board 171 and the second printed circuit board 172.

In a certain embodiment, in a first space of the first housing structure 110 provided through the first support member 161, a first battery 191 may be arranged at a position facing the first printed circuit board 171 and a first swelling hole 1611 in the first support member 161. In addition, at least one sensor module 181 or at least one camera module 182 may be arranged in the first space of the first housing structure 110. The first housing structure 110 may include a window glass 183 disposed in order to protect the at least one sensor module 181 and the at least one camera module 182 at a position corresponding to the notch area 133 in the display 130.

In a certain embodiment, in a second space of the first housing structure 120 provided through the second support member 162, a second battery 192 may be arranged at a position facing the second printed circuit board 172 and a second swelling hole 1621 in the second support member 162.

According to an embodiment, the first housing structure 110 and the first support member 161 may be integrated with each other. According to an embodiment, the second housing structure 120 and the second support member 162 may also be integrated with each other. According to an embodiment, in the second space of the second housing structure 120, a sub-display 152 may be arranged. According to an embodiment, the sub-display 152 (e.g., a second display) may be arranged so as to be visible from the outside through at least a partial area of the second rear cover 150.

In a certain embodiment, the first housing structure 110 may include a first rotation support surface 114, and the second housing structure 120 may include a second rotation support surface 124, which corresponds to the first rotation support surface 114. The first rotation support surface 114 and the second rotation support surface 124 may include curved surfaces corresponding to curved surfaces included in the hinge cover 165.

In a certain embodiment, when the electronic device 100 is in the unfolded state (e.g., the state of FIG. 1), the first rotation support surface 114 and the second rotation support surface 124 may cover the hinge cover 165 such that the hinge cover 165 is not exposed to the rear surface of the electronic device 100 or is minimally exposed to the rear surface of the electronic device 100. In a certain embodiment, when the electronic device 100 is in the folded state (e.g., the state of FIG. 2B), the first rotation support surface 114 and the second rotation support surface 124 may rotate along the curved surface included in the hinge cover 165 such that the hinge cover 165 is exposed to the rear surface of the electronic device 100 as much as possible.

Figure 4A:
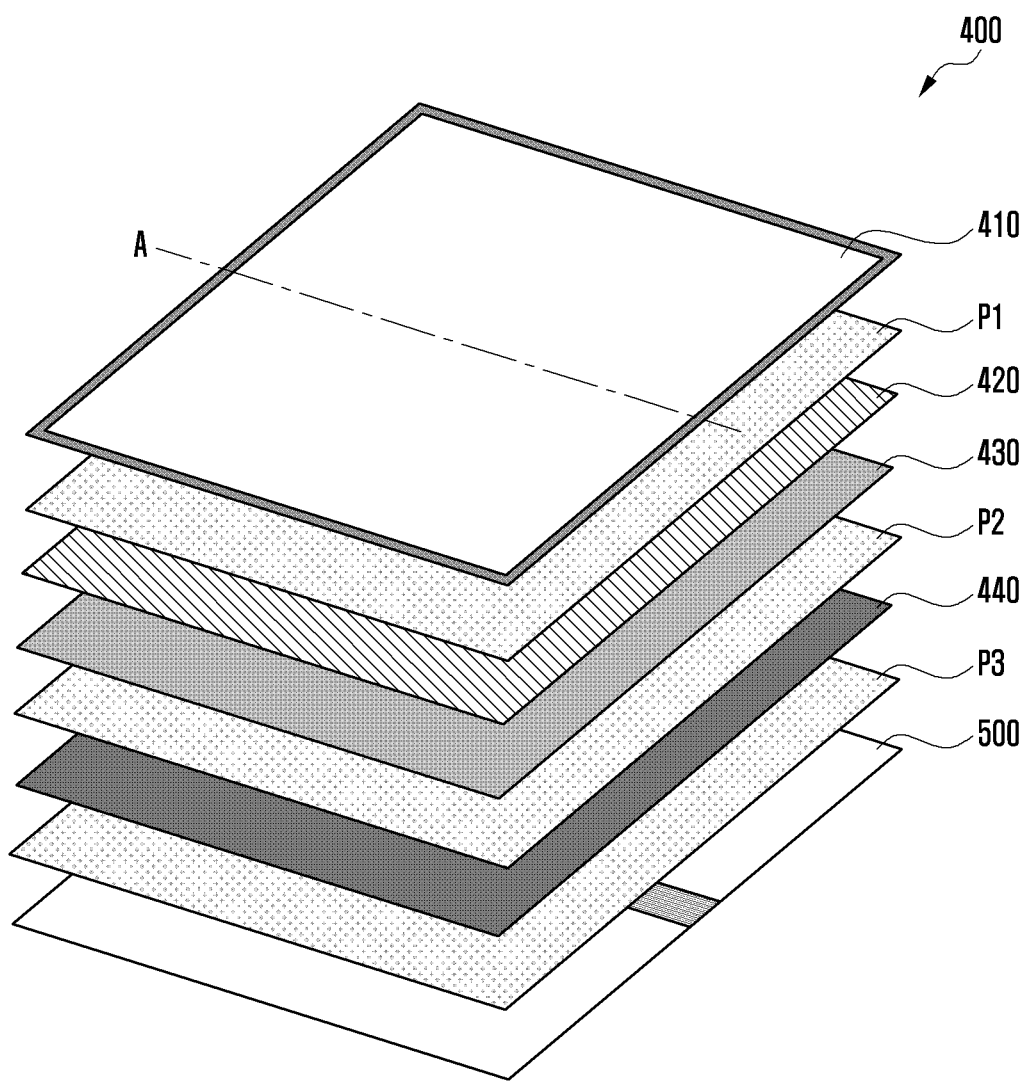
FIG. 4A is an exploded perspective view illustrating a stacked structure of a display according to certain embodiments of the disclosure.
Figure 4B:
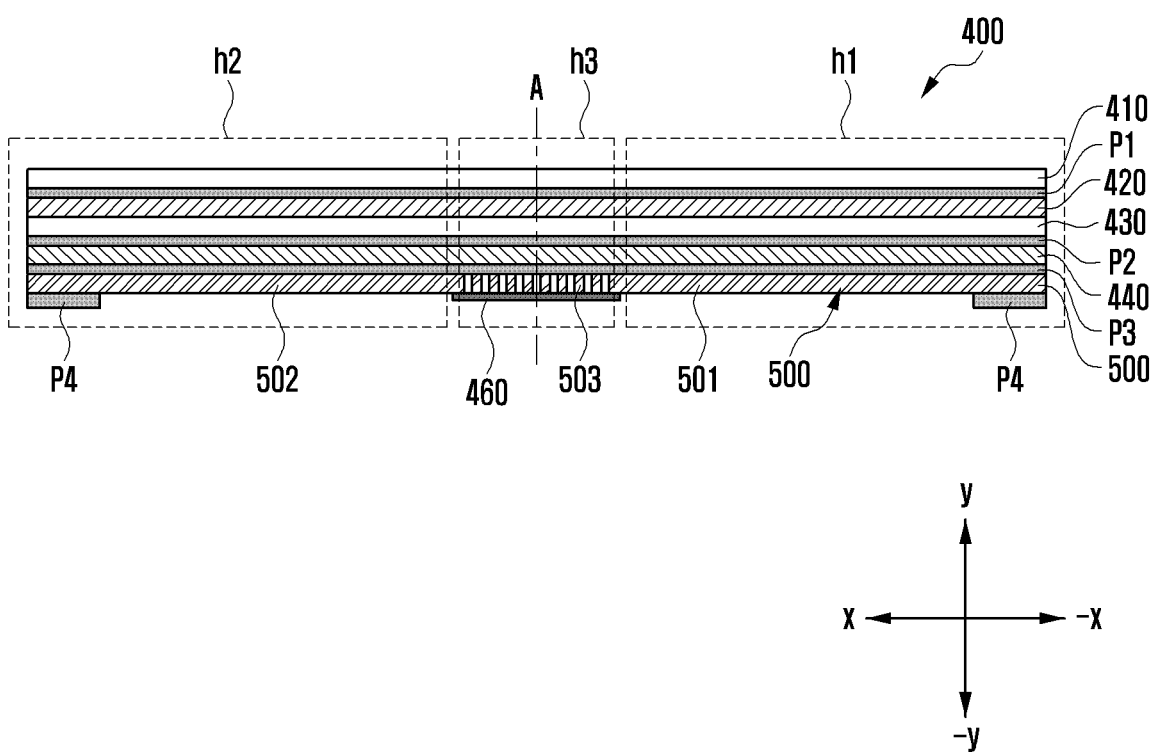
FIG. 4B is a cross-sectional view illustrating the stacked structure of the display according to certain embodiments of the disclosure.

FIG. 4A is an exploded perspective view illustrating a stacked structure of a display according to certain embodiments of the disclosure. FIG. 4B is a cross-sectional view illustrating the stacked structure of the display according to certain embodiments of the disclosure.

Referring to 4A and 4B, the display 400 may include a window 410 (e.g., a polyimide (PI) film or ultra-thin glass (UTG)), and a polarizer (POL) 420 (e.g., a polarizing film), a display panel 430, a polymer member 440, and a flexible plate 500 sequentially arranged on the rear surface of the window 410.

According to an embodiment, the window 410, the POL 420, the display panel 430, the polymer member 440, and the flexible plate 500 may be arranged to cross at least a portion of a first surface (e.g., the first surface 111 in FIG. 1) of a first housing structure (e.g., the first housing structure 110 in FIG. 1) and at least a portion of a third surface (e.g., the third surface 121 in FIG. 1) of a second housing structure (e.g., the second housing structure 120 in FIG. 1).

According to an embodiment, the display 400 may include a first area h1, a second area h2, and a third area h3 (e.g., an area corresponding to the flexible portion 503 in FIG. 5A) (e.g., a folding area). The first area h1 may be a planar area corresponding to the first housing structure 110 of an electronic device (e.g., the electronic device 100 in FIG. 1). The second area h2 may be a planar area corresponding to the second housing structure 120. The third area h3 (e.g., an area corresponding to the flexible portion 503 in FIG. 5A) (e.g., a folding area) may include an area that faces the hinge structure (e.g., the hinge structure 164 of FIG. 3) and is at least partially folded. The first area h1 and the second area h2 may be configured to be foldable or unfoldable about the third area h3 (e.g., the flexible portion 503 (h3) in FIG. 5A) (e.g., a folding area).

According to an embodiment, the POL 420, the display panel 430, the polymer member 440, and the flexible plate 500 may be attached to each other via adhesive members P1, P2, and P3, respectively. For example, the adhesive members P1, P2, and P3 may include at least one of an optical clear adhesive (OCA), a pressure-sensitive adhesive (PSA), a heat-responsive adhesive, a general adhesive, and a double-sided tape.

According to certain embodiments, the display 400 may include the flexible plate 500 having substantially the same size and shape as the display panel 430.

According to an embodiment, the display 400 may include another adhesive member P4 (e.g., a double-sided tape or a waterproof member) arranged along an edge on one surface of the flexible plate 500. According to an embodiment, the display 400 may be attached to a support member assembly (e.g., the support member assembly 160 in FIG. 3) of the electronic device (e.g., the electronic device 100 in FIG. 3) via another adhesive member P4.

According to an embodiment, the flexible plate 500 may include a first planar portion 501 facing the first area of the display 400 (e.g., the first area h1 in FIG. 4B), a second planar portion 502 facing the second area of the display 400 (e.g., the second area h2 in FIG. 4B), and a flexible portion 503 (e.g., a lattice area) facing the third area of the display 400 (e.g., the third area h3 in FIG. 4B). According to an embodiment, the flexible plate 500 may be provided in a state in which the first planar portion 501, the second planar portion 502, and the flexible portion 503 are continuously connected to each other. According to an embodiment, in the flexible plate 500, the first planar portion 501, the second planar portion 502, and the flexible portion 503 may be integrated with each other. According to an embodiment, the flexible plate 500 may be attached to the rear surface of a polymer (e.g., the polymer member 440 in FIG. 4B) via an adhesive member (e.g., the adhesive member P3 in FIG. 4B) such that the display panel 430 can be folded or unfolded via at least a portion of the flexible portion 503. In addition, the flexible plate 500 may be provided with airtightness to block foreign substances that may be introduced from the outside through a conductive elastic member 460 attached from a portion of the first planar portion 501 to a portion of the second planar portion 502 through the flexible portion 503. According to an embodiment, the flexible plate 500 may receive the flexibility of the flexible portion 503 at least partially via the conductive elastic member 460. According to an embodiment, the conductive elastic member 460 may be formed to have an elongation of about 1% or more.

According to certain embodiments, the polymer member 440 may help to show a dark color (e.g., black) by being applied to the polymer member 440 when the display is turned off. According to an embodiment, the polymer member 440 may act as a cushion for preventing damage to the display 400 by absorbing an impact from the outside of the electronic device (e.g., the electronic device 100 of FIGS. 1 and 2).

According to certain embodiments, the display 400 may include at least one functional member arranged between the polymer member 440 and the flexible plate 500. According to an embodiment, the functional member may include a graphite sheet for heat dissipation, an added display, a poster touch FPCB, a fingerprint sensor FPCB, an antenna radiator for communication, a heat dissipation sheet, a conductive/non-conductive tape, or an open cell sponge.

According to an embodiment, when the functional member is bendable, the functional member may be arranged from the first housing structure (e.g., the first housing structure 110 in FIG. 3) to the second housing structure (e.g., the second housing structure 120 in FIG. 3) via the hinge structure (e.g., the hinge structure 164 in FIG. 3). As another embodiment, the display 400 may further include a detecting member configured to detect an input by an electromagnetic induction type writing member. According to an embodiment, the detection member may include a digitizer.

Figure 5A:
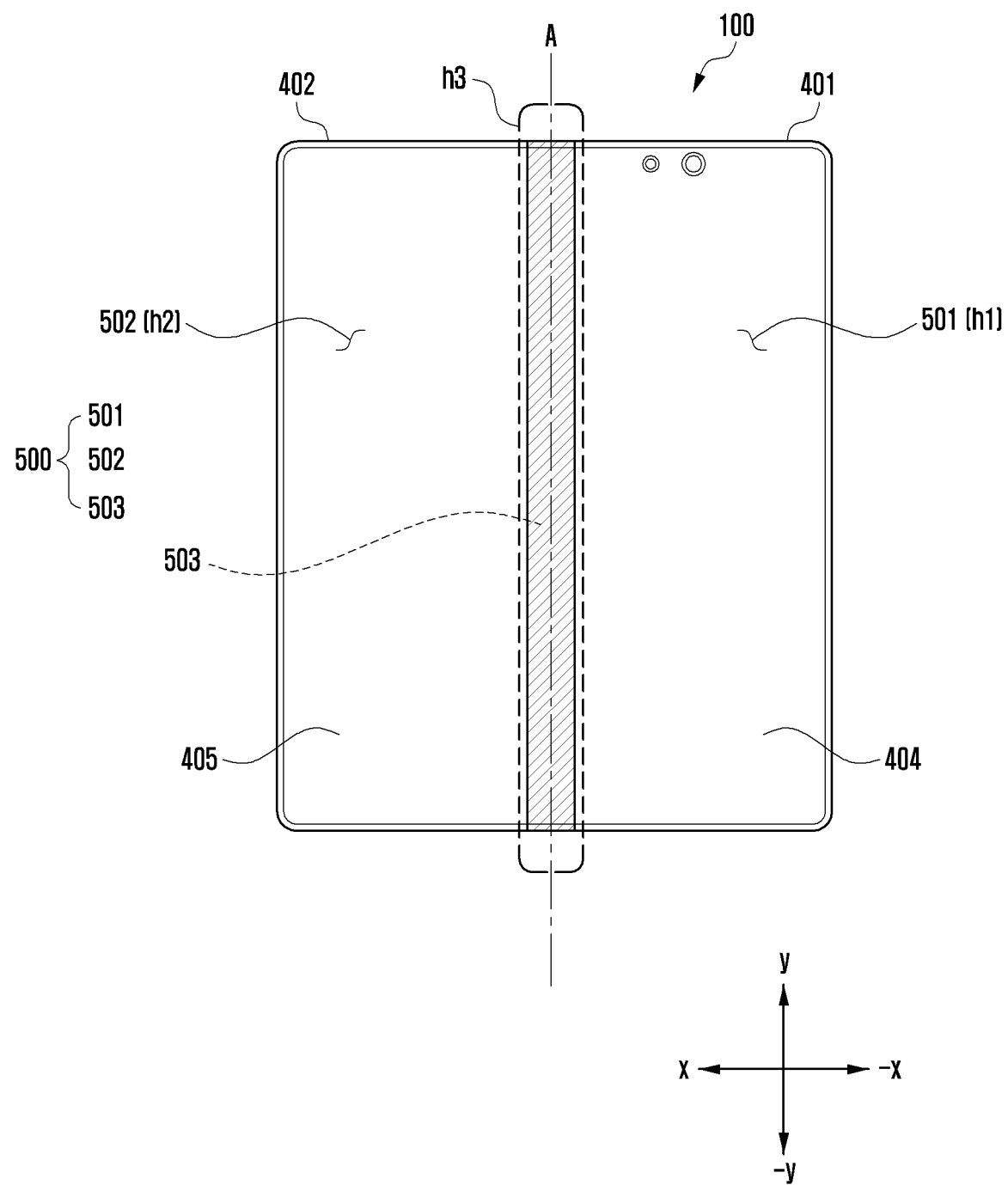
FIG. 5A is a view illustrating an electronic device according to certain embodiments of the disclosure.

FIG. 5A is a view illustrating an electronic device 100 according to certain embodiments of the disclosure. FIG. 5B is a view illustrating a flexible plate 500 according to certain embodiments of the disclosure.

Referring to FIGS. 5A and 5B, the electronic device 100 (e.g., the electronic device 100 in FIGS. 1 and 2 or the electronic device 100 in FIG. 3) may include a first housing structure 401 (e.g., the first housing structure 110 in FIGS. 1 and 2), a second housing structure 402 (e.g., the second housing structure 120 in FIGS. 1 and 2), a first rear cover 404 (e.g., the first rear cover 140 in FIGS. 1 and 2), a second rear cover 405 (e.g., the second rear cover 150 in FIGS. 1 and 2), and a flexible plate 500 (the flexible plate 500 in FIG. 4B).

According to an embodiment, the first housing structure 401 (e.g., the first housing 110 in FIGS. 1 and 2) and the second housing structure 402 (e.g., the second housing structure 120 in FIGS. 1 and 2) of the electronic device 100 (e.g., the electronic device 100 in FIGS. 1 and 2 or the electronic device 100 in FIG. 3) may be arranged on opposite sides of a folding axis (e.g., the axis A). With the help of the flexible plate 500, the first housing structure 401 and the second housing structure 402 may be folded or unfolded about a folding axis (e.g., the axis A).

According to an embodiment, the first rear cover 404 and the second rear cover 405 may be arranged so as to be substantially symmetrical to each other with respect to the folding axis (the axis A). The first housing structure 401, the second housing structure 402, the first rear cover 404, and the second rear cover 405 may have a structure coupled to each other.

According to an embodiment, the flexible plate 500 may be in the form of a conductive metal sheet, which may help to reinforce the rigidity of the electronic device, and may be used to block ambient noise and dissipate heat emitted from surrounding heat emission components.

According to an embodiment, the flexible plate 500 may include at least one of Cu, Al, SUS, or CLAD (e.g., a stacked member in which SUS and Al are alternately arranged). As another embodiment, the flexible plate 500 may include other alloy materials.

According to an embodiment, the flexible plate 500 may include a first planar portion 501 facing the first area (e.g., the first area h1 in FIG. 4B) of the display (e.g., the display 400 in FIG. 4B), a second planar portion 502 facing the second area (e.g., the second area h2 in FIG. 4B) of the display 400, and a flexible portion 503 facing the third area (e.g., the third area h3 in FIG. 4B) of the display 400. According to an embodiment, the flexible plate 500 may be foldable or unfoldable together with the display panel (e.g., the display panel 430 in FIG. 4B) about the folding axis (e.g., the axis A) via at least a portion of the flexible portion 503.

According to an embodiment, at least a portion of the flexible portion 2201 may be arranged to support the rear surface of the display panel (e.g., the display panel 430 in FIG. 4B) when the display is subjected to bending (e.g., the third area h3 of the display 400 in FIG. 4B). As another embodiment, the third area h3 may correspond to at least a portion of the flexible portion 503.

According to an embodiment, the flexible plate 500 may be arranged between the first area (e.g., the first area h1 in FIG. 4B) and the second area (e.g., the second area h2 in FIG. 4B) of the display (e.g., the display 400 in FIG. 4B).

According to an embodiment, the first planar portion 501 of the flexible plate 500 may include a first support portion 510 that supports the first area (e.g., the first area h1 in FIG. 4B) of the display (e.g., the display 400 in FIG. 4B).

According to an embodiment, the second planar portion 502 of the flexible plate 500 may include a second support portion 520 that supports the second area (e.g., the second area h2 in FIG. 4B) of the display (e.g., the display 400 in FIG. 4B).

The flexible portion 503 of the flexible plate 500 may include slits 530 provided at regular or irregular intervals, and a plurality of support pieces 540. The first planar portion 501 of the flexible plate 500 may include the first support 510 without the slits 530, and the second planar portion 502 may include the second support 520 without the slits 530. The plurality of support pieces 540 of the flexible portion 503 may be arranged so as to be connected to each other. In another example, the plurality of support pieces 540 of the flexible portion 503 may be disposed so as to be separate from each other. Since the slits 530 are formed in the flexible portion 503, the total weight of the flexible plate 500 is reduced, and flexibility can be provided at least in part by the formation of the slits 530, so that folding and unfolding operations can be facilitated via the third area h3 (e.g., the folding area).

According to an embodiment, a conductive elastic member (e.g., the conductive elastic member 460 in FIG. 4B) for connecting the plurality of support pieces 540 of the flexible portion 503 may be arranged under the flexible plate 500. As an example, the conductive elastic member (e.g., the conductive elastic member 460 of FIG. 4B) may be arranged on the surface of the flexible plate 500 facing away from the surface facing the display panel (e.g., the display panel 430 in FIG. 4B) of the flexible plate 500.

In a certain embodiment, the conductive elastic member (e.g., the conductive elastic member 460 in FIG. 4B) may be arranged to overlap at least a portion of the first planar portion 501, at least a portion of the second planar portion 502, and the entire flexible portion 503. The first planar portion 501, the second planar portion 502, and the flexible portion 503 may be connected to each other by the conductive elastic member (e.g., the conductive elastic member 460 in FIG. 4B). The plurality of support pieces 540 separated (or spaced apart) from each other by the plurality of slits 530 may remain connected to each other via the conductive elastic member 460. In addition, the flexibility of the flexible portion 503 may be provided via the plurality of support pieces 540 spaced apart from each other via the plurality of slits 530 and connected to each other via the conductive elastic member 460. In addition, since the plurality of slits 530 are closed via the conductive elastic member 460, it is possible to prevent external foreign substances from intruding into the device through the front surface of the flexible plate.

In a certain embodiment, the conductive elastic member 460 may include a conductive elastic tape member or a conductive elastic film member from a portion of the first planar portion 501 to at least a portion of the second planar portion 502 across the plurality of support pieces 540 on the rear surface of the flexible plate 500. In a certain embodiment, the conductive elastic tape member may be formed of at least one of conductive rubber, conductive silicone, or conductive urethane.

In a certain embodiment, the first planar portion 501 and the second planar portion 502 spaced apart from each other in the flexible plate 500 may be electrically connected to each other via the conductive elastic member 460. Through this, a ground area of a printed circuit board (e.g., the printed circuit board 170 in FIG. 3) inside the electronic device 100 (e.g., the electronic device 100 in FIG. 3) and the flexible plate 500 may be electrically connected to each other.

FIG. 6 is a view illustrating a flexible plate 600 according to certain embodiments of the disclosure.

Referring to FIGS. 5A and 6, the first housing structure 401 (e.g., the first housing structure 110 in FIGS. 1 and 2) and the second housing structure 402 (e.g., the second housing structure 120 in FIGS. 1 and 2) of the electronic device 100 (e.g., the electronic device 100 in FIGS. 1 and 2 or the electronic device 100 in FIG. 3) may be arranged on opposite sides of a folding axis (e.g., the axis A). According to an embodiment, with the help of the flexible plate 600 (e.g., the flexible plate 500 in FIG. 4B), the first housing structure 401 and the second housing structure 402 may be foldable or unfoldable about the folding axis (e.g., the axis A).

According to an embodiment, the flexible plate 600 may be implemented in the form of a conductive metal sheet, which may help to reinforce the rigidity of the electronic device, and may be used to block ambient electrical noise, and dissipate heat emitted from surrounding heat emission components.

According to an embodiment, the flexible plate 600 may include at least one of Cu, Al, SUS, or CLAD (e.g., a stacked member in which SUS and Al are alternately arranged). As another embodiment, the flexible plate 600 may include other alloys and/or materials.

According to an embodiment, the flexible plate 600 may include a first planar portion 601 facing the first area (e.g., the first area h1 in FIG. 4B) of the display (e.g., the display 400 in FIG. 4B), a second planar portion 602 facing the second area (e.g., the second area h2 in FIG. 4B) of the display 400, and a flexible portion 603 facing the third area (e.g., the third area h3 in FIG. 4B) of the display 400. According to an embodiment, the flexible plate 600 may be foldable or unfoldable together with the display panel (e.g., the display panel 430 in FIG. 4B) about the folding axis (e.g., the axis A) via at least a portion of the flexible portion 603.

According to an embodiment, at least a portion of the flexible portion 603 may be arranged to support the rear surface of the display panel (e.g., the display panel 430 in FIG. 4B) during bending of the flexible display (e.g., the third area h3 of the display 400 in FIG. 4B). As another embodiment, the third area h3 may correspond to at least a portion of the flexible portion 603.

According to an embodiment, the flexible plate 600 may be arranged between the first area (e.g., the first area h1 in FIG. 4B) and the second area (e.g., the second area h2 in FIG. 4B) of the display (e.g., the display 400 in FIG. 4B).

According to an embodiment, the first planar portion 601 of the flexible plate 600 may include a first support portion 601 that supports the first area (e.g., the first area h1 in FIG. 4B) of the display (e.g., the display 400 in FIG. 4B).

According to an embodiment, the second planar portion 602 of the flexible plate 600 may include a second support portion 620 that supports the second area (e.g., the second area h2 in FIG. 4B) of the display (e.g., the display 400 in FIG. 4B).

In a certain embodiment, the flexible portion 603 of the flexible plate 600 may include slits 630 provided at regular or irregular intervals, and a plurality of support pieces 640. As an example, the slits 630 may be configured in a bar shape. In a certain embodiment, in the flexible portion 603 of the flexible plate 600, a plurality of support pieces 640 having a predetermined width w are arranged so as to be spaced apart from each other, via the slits 630 which have a predetermined interval d. The first planar portion 601 of the flexible plate 600 may include the first support portion 610 without the slits 630, and the second planar portion 602 may include the second support portion 620 without the slits 630.

According to an embodiment, the plurality of support pieces 640 of the flexible portion 603 may be arranged so as to be connected to each other. In another example, the plurality of support pieces 640 of the flexible portion 603 may be arranged so as to be spaced apart from each other. Since the slits 630 are provided in the flexible portion 603, the total weight of the flexible plate 600 can be reduced, and flexibility can be provided by the slits 630 such that folding and unfolding operations can be facilitated in the third area h3 (e.g., the folding area).

According to an embodiment, a conductive elastic member (e.g., the conductive elastic member 460 in FIG. 4B) connecting the plurality of support pieces 640 of the flexible portion 603 may be disposed under the flexible plate 600. As an example, the conductive elastic member (e.g., the conductive elastic member 460 of FIG. 4B) may be arranged on the surface of the flexible plate 600 facing away from the surface that faces the display panel (e.g., the display panel 430 in FIG. 4B) of the flexible plate 600.

In a certain embodiment, the conductive elastic member (e.g., the conductive elastic member 460 in FIG. 4B) may be arranged to overlap at least a portion of the first planar portion 601, at least a portion of the second planar portion 602, and the entire flexible portion 603. The first planar portion 601, the second planar portion 602, and the flexible portion 603 may be connected to each other by the conductive elastic member (e.g., the conductive elastic member 460 in FIG. 4B). The plurality of support pieces 640 separated (or spaced apart) from each other by the plurality of slits 630 may remain connected to each other via the conductive elastic member 460. In addition, flexibility of the flexible portion 603 may be provided via the plurality of support pieces 640 spaced apart from each other via the plurality of slits 630, and connected to each other via the conductive elastic member 460. In addition, since the plurality of slits 630 are closed via the conductive elastic member 460, it is possible to prevent external foreign substances from entering into the device through the front surface of the flexible plate.

According to an embodiment, a flexibility of the flexible portion 603 of the flexible plate 600 may be adjusted by changing the shapes and/or arrangement densities of the plurality of support pieces 640 and slits 630. According to an embodiment, the flexibility of the flexible portion 603 may be adjusted by changing the width w of the plurality of support pieces 640. For example, the flexibility of the flexible portion 603 may be adjusted by adjusted by changing the width w of the plurality of support pieces 640 having the same interval d gradually increase or decrease leftward or rightward from the folding axis (e.g., the axis A). According to an embodiment, the flexibility of the flexible portion 603 may also be adjusted by making the interval d between the plurality of support pieces 640 having a same width w gradually decrease or increase in leftwards and/or rightwards directions with respect to the folding axis (e.g., the axis A). According to an embodiment, the flexibility of the flexible portion 603 may be adjusted by setting different widths and different intervals d of the plurality of support pieces 640.

In a certain embodiment, the first planar portion 601 and the second planar portion 602 may be spaced apart from each other in the flexible plate 600, and may be electrically connected to each other via the conductive elastic member 460. Through this, a ground area of a printed circuit board (e.g., the printed circuit board 170 in FIG. 3) within the electronic device 100 (e.g., the electronic device 100 in FIG. 3) and the flexible plate 600 may be electrically connected to each other.

FIG. 7 is a view illustrating a flexible plate 700 according to certain embodiments of the disclosure.

Referring to FIG. 7, the flexible plate 700 according to certain embodiments of the disclosure may include a first planar portion 701 supporting a first area (e.g., the first area h1 in FIG. 4B) of a display (e.g., the display 400 in FIG. 4B), a second planar portion 702 supporting a second area (e.g., the second area h2 in FIG. 4B) of the display (e.g., the display 400 in FIG. 4B), and a flexible portion 703 supporting a third area (e.g., the third area h3 in FIG. 4B) of the display (e.g., the display 400 in FIG. 4B).

In a certain embodiment, the flexible portion 703 of the flexible plate 700 may include slits 730 provided at regular or irregular intervals and a plurality of support pieces 740. As an example, the slits 730 may be configured in a bar shape.

In a certain embodiment, in the flexible portion 703 of the flexible plate 700, a plurality of support pieces 740 having a predetermined width may be arranged so as to be spaced apart from each other via the slits 730 having a predetermined interval. The first planar portion 701 of the flexible plate 700 may include the first support portion 710 without the slits 730, and the second planar portion 702 may include the second support portion 720 without the slits 730.

According to an embodiment, the slits 730 of the flexible portion 703 may be provided as openings formed at the upper side 704 (e.g., y-axis direction) and the lower side 705 (e.g., −y-axis direction) with respect to the folding axis (e.g., the axis A). The plurality of support pieces 740 may be separated from each other at a predetermined interval by the slits 730. The plurality of support pieces 740 separated by the plurality of slits 730 may remain connected to each other via a conductive elastic member (e.g., the conductive elastic member 460 in FIG. 4B). In addition, the flexibility of the flexible portion 703 may be provided via the plurality of support pieces 740 connected to each other via the conductive elastic member 460.

Figure 8:
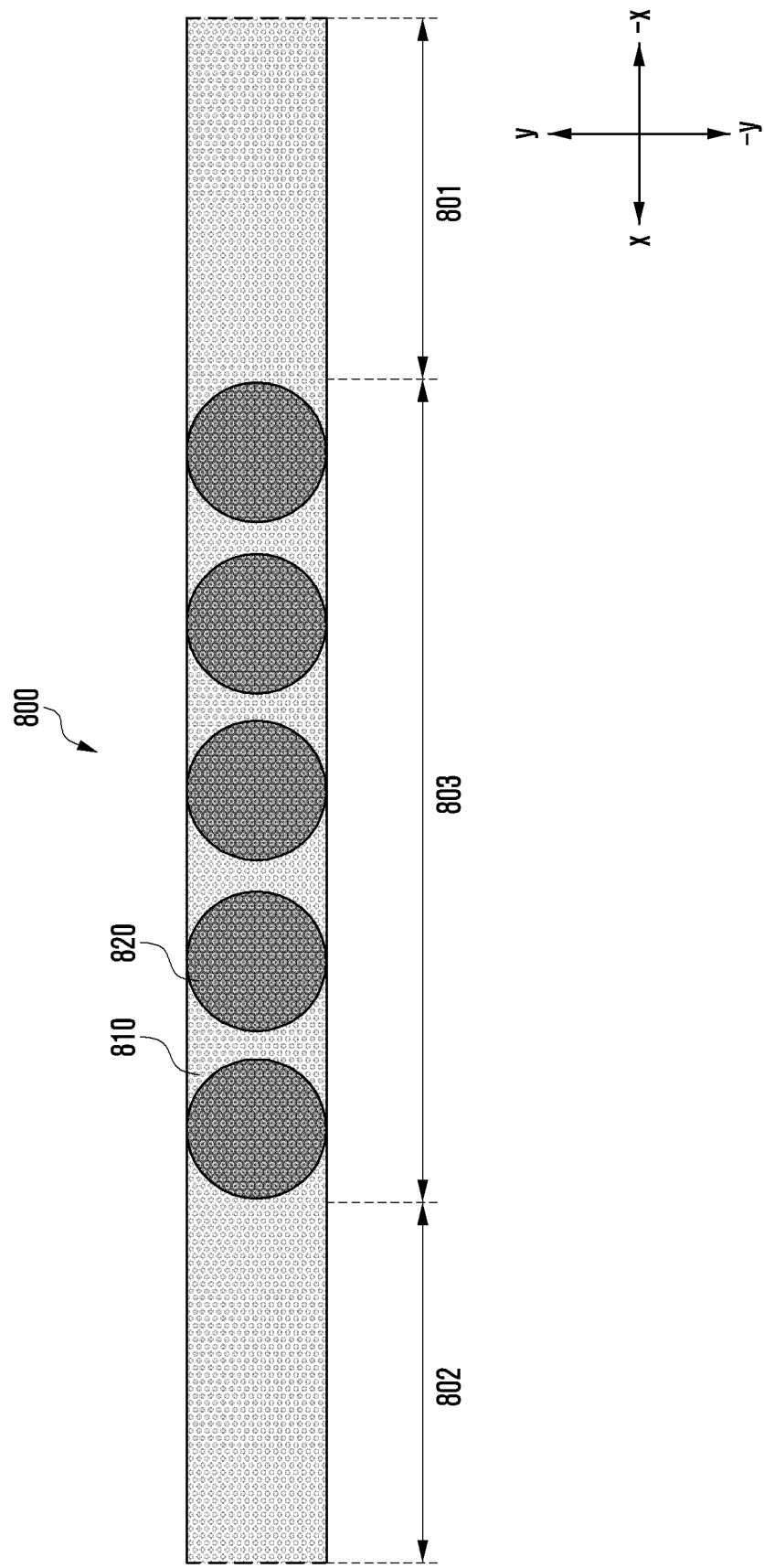
FIG. 8 is a view illustrating a material of a flexible plate according to certain embodiments of the disclosure.

FIG. 8 is a view illustrating a material of a flexible plate 800 according to certain embodiments of the disclosure.

Referring to FIG. 8, according to an embodiment, the first planar portion 801 (e.g., the first planar portion 701 in FIG. 7) and the second planar portion 802 (e.g., the second planar portion 702 in FIG. 7) of the flexible plate 800 may be formed using a single material. For example, the first planar portion 801 and the second planar portion 802 may be formed of a carbon fiber reinforced plastic (CFRP).

According to an embodiment, the flexible portion 803 (e.g., the flexible portion 703 in FIG. 7) of the flexible plate 800 may be formed of a plurality of materials. As an example, the flexible portion 803 may include a resin 810 and a carbon fiber reinforced plastic (CFRP) 820. In a certain embodiment, a plurality of support pieces (e.g., the plurality of support pieces 740 in FIG. 7) may be formed of the carbon fiber reinforced plastic 820. A resin 810 may be provided in spaces between at least some of the plurality of support pieces (e.g., the plurality of support pieces 740 in FIG. 7). For example, the resin 810 may be a conductive elastic resin, and may be provided by being filled the plurality of slits in a liquid form and then being cured.

Since the flexible portion 803 is formed of different materials, it is possible to enhance durability against impacts suffered by the front surface of the electronic device, and to increase shear strength. In addition, since the flexible portion 803 is formed of different materials, it is possible to maintain flexibility by increasing repulsion, so that folding and unfolding operations can be facilitated in the third area h3 (e.g., the folding area).

Figure 9:
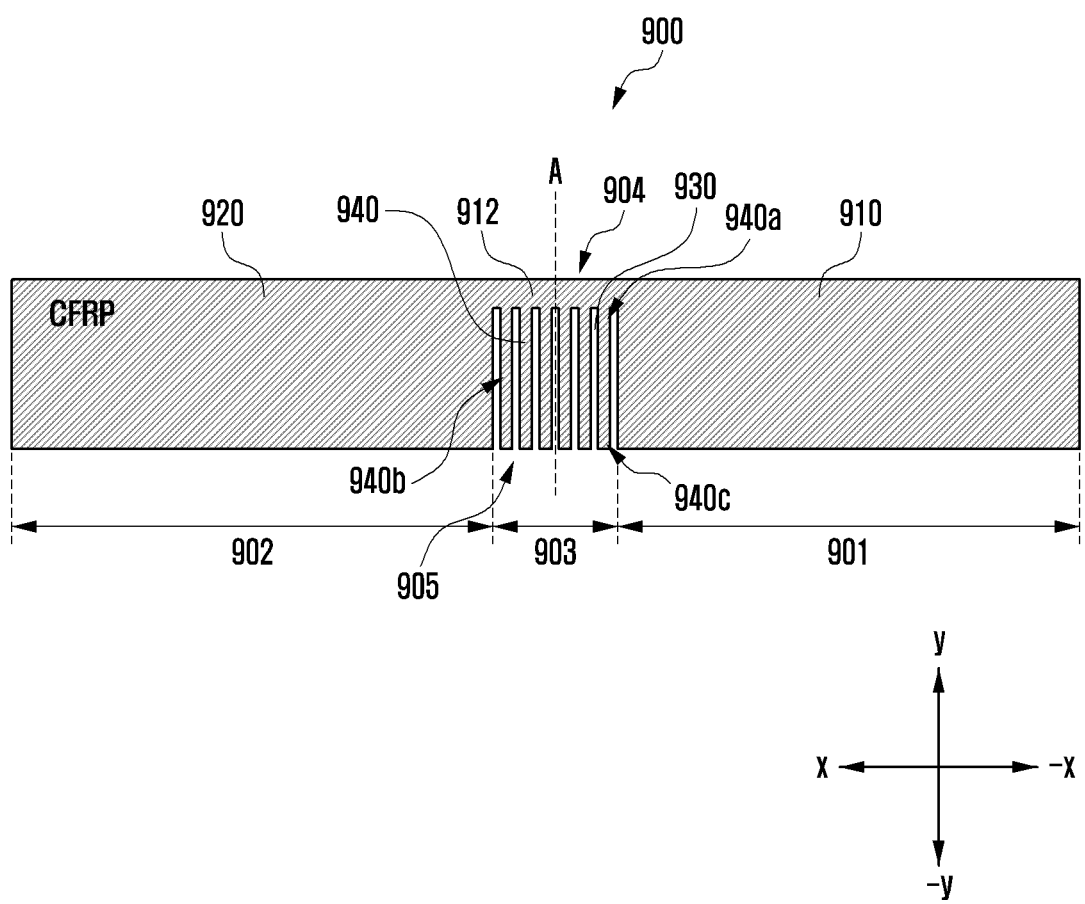
FIG. 9 is a view illustrating a flexible plate according to certain embodiments of the disclosure.

FIG. 9 is a view illustrating a flexible plate 900 according to certain embodiments of the disclosure.

Referring to FIG. 9, the flexible plate 900 according to certain embodiments of the disclosure may include a first planar portion 901 supporting a first area (e.g., the first area h1 in FIG. 4B) of a display (e.g., the display 400 in FIG. 4B), a second planar portion 902 supporting a second area (e.g., the second area h2 in FIG. 4B) of the display (e.g., the display 400 in FIG. 4B), and a flexible portion 903 supporting a third area (e.g., the third area h3 in FIG. 4B) of the display (e.g., the display 400 in FIG. 4B).

In a certain embodiment, the flexible portion 903 of the flexible plate 900 may include slits 930 provided at regular or irregular intervals and a plurality of support pieces 940. As an example, the slits 930 may be formed in a bar shape.

In a certain embodiment, in the flexible portion 903 of the flexible plate 900, a plurality of support pieces 940 having a predetermined width are arranged so as to be spaced apart from each other via the slits 930 having a predetermined interval. The first planar portion 901 of the flexible plate 900 may include the first support portion 910 without the slits 930, and the second planar portion 902 may include the second support portion 920 without the slits 930.

According to an embodiment, a bridge portion 912 may be provided at the upper side 904 (e.g., y-axis direction) with respect to the folding axis (e.g., the axis A), so that the slits 930 of the flexible portion 703 are closed near the upper side 904 (e.g., the y-axis direction). The first support portion 910 and the second support portion 920 may be connected to each other by the bridge portion 912. The slits 930 of the flexible portion 903 may be opened at the lower side 905 (e.g., -y-axis direction) with respect to the folding axis (e.g., the axis A).

In a certain embodiment, the upper portions 940a of the plurality of support pieces 940 may be connected by the bridge portion 912. The middle portion 940b and the lower portion 940c of the plurality of support pieces 940 may be spaced apart from each other at regular intervals by the slits 930. The plurality of support pieces 940 of the flexible portion 903 are connected to each other by the bridge portion 912. Accordingly, the upper side 904 of the flexible portion 903 can be formed to be flat, and thus the surface quality of the flexible portion 903 can be improved.

In a certain embodiment, the plurality of support pieces 940 may remain connected to each other via a conductive elastic member (e.g., the conductive elastic member 460 in FIG. 4B). In addition, the flexibility of flexible portion 703 may be provided via the plurality of support pieces 940 connected to each other via the conductive elastic member 460.

According to an embodiment, the first planar portion 901 (e.g., the first planar portion 701 in FIG. 7) and the second planar portion 902 (e.g., the second planar portion 702 in FIG. 7) of the flexible plate 900 may be formed of a single material. For example, the first planar portion 901 and the second planar portion 920 may include a carbon fiber reinforced plastic (CFRP).

According to an embodiment, the flexible portion 903 (e.g., the flexible portion 703 in FIG. 7) of the flexible plate 900 may be formed of a plurality of materials. For example, the flexible portion 903 may include a resin (e.g., the resin 810 in FIG. 8) and a carbon fiber reinforced plastic (e.g., the carbon fiber reinforced plastic 820 in FIG. 8). In a certain embodiment, a plurality of support pieces 940 (e.g., the plurality of support pieces 740 in FIG. 7) may be formed of a carbon fiber reinforced plastic (e.g., the carbon fiber reinforced plastic 820 in FIG. 8). A resin (e.g., the resin 810 in FIG. 8) may be provided in spaces between the plurality of support pieces 940 (e.g., the plurality of support pieces 740 in FIG. 7). Since the flexible portion 903 is formed of different materials, it is possible to enhance durability against an impact applied from the front surface of the electronic device and to increase shear strength. In addition, since the flexible portion 903 is formed of different materials, it is possible to secure flexibility by increasing repulsion, so that folding and unfolding operations can be facilitated in the third area h3 (e.g., the folding area).

Figure 10:
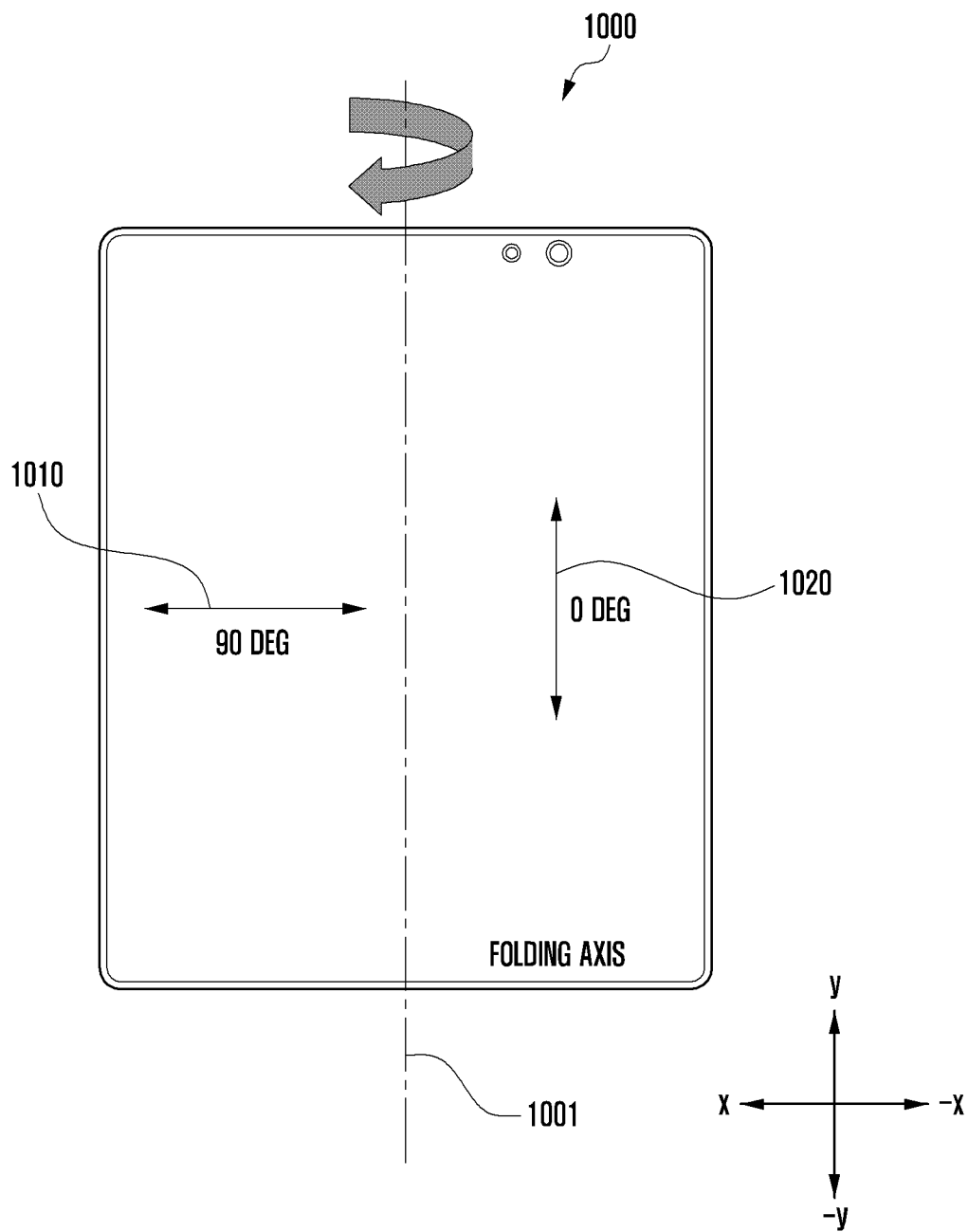
FIG. 10 is a view illustrating a folding axis according to certain embodiments of the disclosure.
Figure 11:
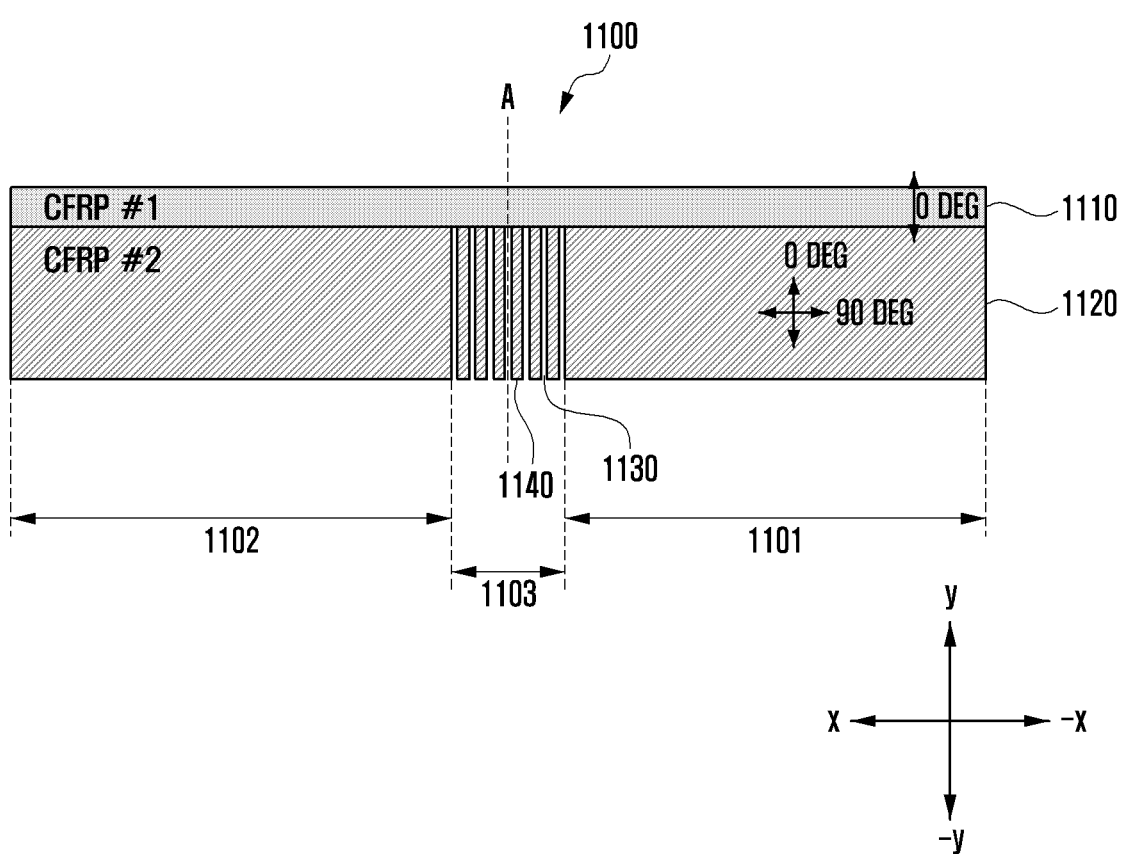
FIG. 11 is a view illustrating an orientation direction of a flexible plate along a folding axis according to certain embodiments of the disclosure.

FIG. 10 is a view illustrating a folding axis according to certain embodiments of the disclosure. FIG. 11 is a view illustrating an orientation direction of a flexible plate along a folding axis according to certain embodiments of the disclosure.

Referring to FIGS. 10 and 11, an electronic device 1000 (e.g., the electronic device 100 in FIG. 5A) may include a flexible plate 1100 (e.g., the flexible plate 500 in FIG. 5A). The flexible plate 1100 may include a plurality of layers 1110 and 1120. The plurality of layers 1110 and 1120 of the flexible plate 1100 may include a first support layer 1110 and a second support layer 1120. In a certain embodiment, the first support layer 1110 may be located at the uppermost stage, and the second support layer 1120 may be located under the first support layer 1110.

According to an embodiment, the first support layer 1110 of the flexible plate 1100 may be provided as a single flat layer supporting a display panel (e.g., the display panel 430 in FIG. 4B).

According to an embodiment, the second support layer 1120 of the flexible plate 1100 may include a first planar portion 1101 facing the first area (e.g., the first area h1 in FIG. 4B) of the display (e.g., the display 400 in FIG. 4B), a second planar portion 1102 facing the second area (e.g., the second area h2 in FIG. 4B) of the display 400, and a flexible portion 1103 facing the third area (e.g., the third area h3 in FIG. 4B) of the display 400. According to an embodiment, the flexible plate 1100 may be foldable or unfoldable together with folding of the display panel (e.g., the display panel 430 in FIG. 4B) about the folding axis (e.g., the axis A) via at least a portion of the flexible portion 1103.

According to an embodiment, at least a portion of the flexible portion 1103 may be arranged to support the rear surface of the display panel (e.g., the display panel 430 in FIG. 4B) when the display is subjected to bending is subjected to bending (e.g., the third area h3 of the display 400 in FIG. 4B).

According to an embodiment, the flexible portion 1103 of the flexible plate 1100 may include a plurality of slits 1130 and a plurality of support pieces 1140 provided at regular or irregular intervals. The first planar portion 1101 and the second planar portion 1102 of the flexible plate 1100 may be configured without the slits 1130. The plurality of support pieces 1140 of the flexible portion 1103 may be arranged so as to be connected to each other. In another example, the plurality of support pieces 1140 of the flexible portion 1103 may be separated from each other.

According to an embodiment, the first support layer 1110 may be arranged at the upper side (e.g., the y-axis direction) with respect to the folding axis (e.g., the axis A), and thus the plurality of slits 1130 in the flexible portion 1103 may be provided in the form of being closed at the upper side (e.g., the y-axis direction). The first support portion 1110 and the second support portion 1120 may be connected to each other by the first support layer 1110. The plurality of slits 1130 in the flexible portion 1103 may be opened at the lower side thereof (e.g., the −y-axis direction) with respect to the folding axis (e.g., the axis A).

According to an embodiment, the first support layer 1110 of the flexible plate 1100 may include a carbon fiber reinforced plastic (CFRP). According to an embodiment, the second support layer 1120 of the flexible plate 1100 may include a carbon fiber reinforced plastic (CFRP).

According to an embodiment, the orientation directions of the first support layer 1110 and the second support layer 1120 of the flexible plate 1100 may be different from each other with respect to the folding axis 1001 of the electronic device 1000. For example, a direction 1020 (e.g., the y-axis direction) that is the same as the folding axis 1001 of the electronic device 1000 may be defined as a 0-degree orientation. As an example, a direction 1010 (e.g., the x-axis direction) orthogonal to the folding axis 1001 may be defined as a 90-degree orientation.

According to an embodiment, the first support layer 1110 of the flexible plate 1100 may be oriented in a single direction. In a certain embodiment, the first support layer 1110 of the flexible plate 1100 may be oriented in a first direction (e.g., a direction 1020 that is the same as the folding axis 1001 (e.g., the axis A)) (e.g., the 0-degree orientation).

According to an embodiment, the second support layer 1120 of the flexible plate 1100 may be oriented in in multiple directions. In a certain embodiment, the second support layer 1120 of the flexible plate 1100 may be oriented in the first direction (e.g., the same direction 1020 as the folding axis 1001 (e.g., the axis A)) (e.g., the 0-degree orientation) and the second direction (e.g., a direction 1010 orthogonal to the folding axis 1001 (2.3, the axis A)).

In a certain embodiment, in the flexible plate 1100, the first support layer 1110 is arranged on the flexible portion 1103 of the second support layer 1120 so that the upper sides of the plurality of support pieces 1140 of the flexible portion 1103 may be connected to each other the first support layer 1110. The plurality of support pieces 1140 of the flexible portion 1103 may be connected by a first support layer 1110 to make the upper side of the flexible portion 1103 flat. Thus, it is possible to reduce the level difference on the upper surface of the flexible plate 1100 and to improve surface quality. In addition, in the flexible plate 1100, the first support layer 1110 may be oriented in the first direction, which is the same as the folding axis 1001 (e.g., the axis A), and the second support layer 1120 may be oriented in a second direction, which is orthogonal to the first direction and the folding axis 1001 (e.g., the axis A). Thus, it is possible to increase shear strength and to maintain a sufficient degree of flexibility.

FIG. 12 is a view illustrating an orientation direction of a flexible plate along a folding axis according to certain embodiments of the disclosure.

Referring to FIGS. 10 and 12, an electronic device 1000 (e.g., the electronic device 100 in FIG. 5A) may include a flexible plate 1200 (e.g., the flexible plate 500 in FIG. 5A). The flexible plate 1200 may include a plurality of layers 1210, 1220, 1230, and 1240.

According to an embodiment, the plurality of layers 1210, 1220, 1230, and 1240 of the flexible plate 1200 may include a first support layer 1210, a second support layer 1220, a third support layer 1230, and a flexible layer 1240.

In a certain embodiment, the first support layer 1210 may be located at the uppermost stage, and the second support layer 1220 may be located under the first support layer 1210. The third support layer 1230 may be located under the second support layer 1220. The flexible layer 1240 may be located under the first support layer 1210.

In a certain embodiment, the first support layer 1210 may be arranged to face all of the first planar portion 1201, the second planar portion 1202, and the flexible portion 1203. In a certain embodiment, the first support portion 1221 of the second support layer 1220 may be arranged at a position overlapping the first planar portion 1201. The second support portion 1222 of the second support layer 1220 may be arranged at a position overlapping the second planar portion 1202. The first support portion 1231 of the third support layer 1230 may be arranged at a position overlapping the first planar portion 1201. The second support portion 1232 of the third support layer 1230 may be arranged at a position overlapping the second planar portion 1202. In a certain embodiment, the second support layer 1220 and the third support layer 1230 are not provided at positions facing the flexible portion 1203. In a certain embodiment, the flexible layer 1240 may be arranged on the flexible portion 1203 located between the first planar portion 1201 and the second planar portion 1202.

According to an embodiment, the flexible plate 1200 may be foldable or unfoldable together with the display panel (e.g., the display panel 430 in FIG. 4B) about the folding axis (e.g., the axis A) via at least a portion of the flexible portion 1203 (e.g., the flexible layer 1240).

According to an embodiment, at least a portion of the flexible portion 1203 may be arranged to support the rear surface of the display panel (e.g., the display panel 430 in FIG. 4B) when the display is subjected to bending (e.g., the third area h3 of the display 400 in FIG. 4B).

According to an embodiment, the first support layer 1210 may be arranged at the upper side (e.g., the y-axis direction) with respect to the folding axis (e.g., the axis A), and thus the flexible portion 1203 may be provided in the form of being closed at the upper side (e.g., the y-axis direction) thereof. The first support portion 1221 and the second support portion 1222 of the second support layer 1220 may be connected to each other by the first support layer 1210.

According to an embodiment, the first support layer 1210 of the flexible plate 1200 may include a carbon fiber reinforced plastic (CFRP). According to an embodiment, the first support portion 1221 and the second support portion 1222 of the second support layer 1220 of the flexible plate 1200 may include a carbon fiber reinforced plastic (CFRP). According to an embodiment, the first support portion 1231 and the second support portion 1232 of the third support layer 1230 of the flexible plate 1200 may include a carbon fiber reinforced plastic (CFRP). According to an embodiment, the flexible layer 1240 may include a heat-conducting flexible composite resin (e.g., a graphite composite), a soft graphite resin, and/or a carbon fiber reinforced plastic (CFRP).

According to an embodiment, the orientation directions of the first support layer 1210, the second support layer 1220, and the third layer 1230 of the flexible plate 1200 may be different from each other with respect to the folding axis 1001 of the electronic device 1000. For example, a direction 1020 (e.g., the y-axis direction) that is the same as the folding axis 1001 of the electronic device 1000 may be defined as a 0-degree orientation. As an example, a direction 1010 (e.g., the x-axis direction) orthogonal to the folding axis 1001 may be defined as a 90-degree orientation.

According to an embodiment, the first support layer 1210 of the flexible plate 1200 may be oriented in a single direction. In a certain embodiment, the first support layer 1210 of the flexible plate 1200 may be oriented in a first direction (e.g., a direction 1020 that is the same as the folding axis 1001 (e.g., the axis A)) (e.g., the 0-degree orientation).

According to an embodiment, the second support layer 1220 of the flexible plate 1200 may be oriented in in multiple directions. In a certain embodiment, the second support layer 1220 of the flexible plate 1200 may be oriented in the first direction (e.g., the same direction 1020 as the folding axis 1001 (e.g., the axis A)) (e.g., the 0-degree orientation) and the second direction (e.g., a direction 1010 orthogonal to the folding axis 1001 (e.g., the axis A)) (e.g., the 90-degree orientation).

According to an embodiment, the third support layer 1230 of the flexible plate 1200 may be oriented in a single direction. In a certain embodiment, the third support layer 1230 of the flexible plate 1200 may be oriented in a first direction (e.g., a direction 1020 that is the same as the folding axis 1001 (e.g., the axis A)) (e.g., the 0-degree orientation). In another example, the third support layer 1230 of the flexible plate 1200 may be oriented in a single direction. In a certain embodiment, the third support layer 1230 of the flexible plate 1200 may be oriented in a second direction (e.g., a direction 1010 that is orthogonal to the folding axis 1001 (e.g., the axis A)) (e.g., the 90-degree orientation).

In a certain embodiment, in the flexible plate 1200, the first support layer 1210 may be arranged on the flexible layer 1240 to make the upper side of the flexible portion 1103 flat. Through this, it is possible to reduce the level difference on the top surface of the flexible plate 1200 and to improve the surface quality. In addition, in the flexible plate 1200, the first support layer 1210 may be oriented in the first direction that is the same as the folding axis 1001 (e.g., the axis A), the second support layer 1220 may be oriented in a second direction orthogonal to the first direction and the folding axis 1001 (e.g., the axis A), and the third support layer 1230 may be oriented in the first direction or the second direction. Thus, it is possible to increase shear strength and to secure flexibility.

Figure 13A:
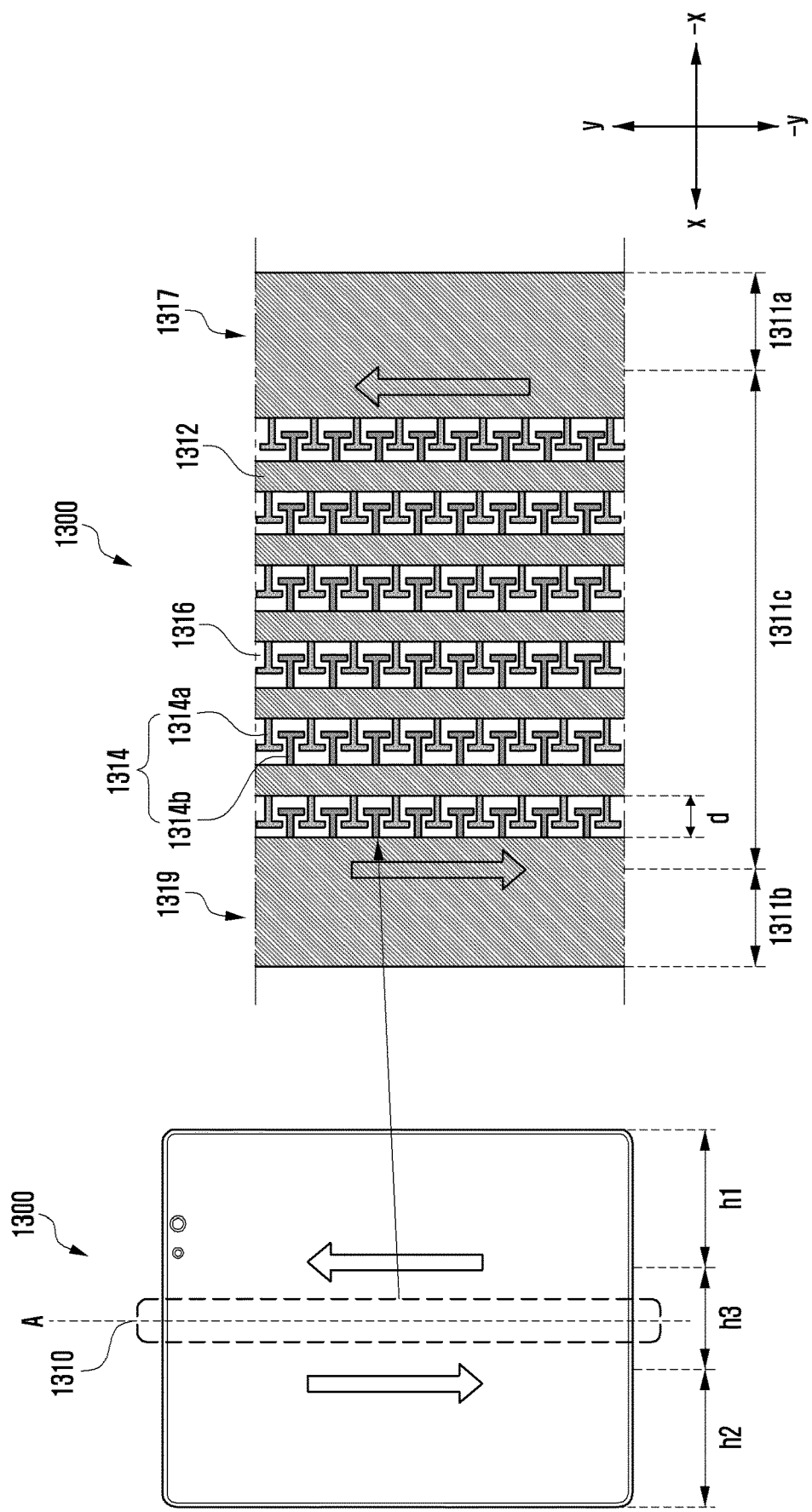
FIG. 13A is a view illustrating a flexible plate of an electronic device according to certain embodiments of the disclosure.
Figure 13B:
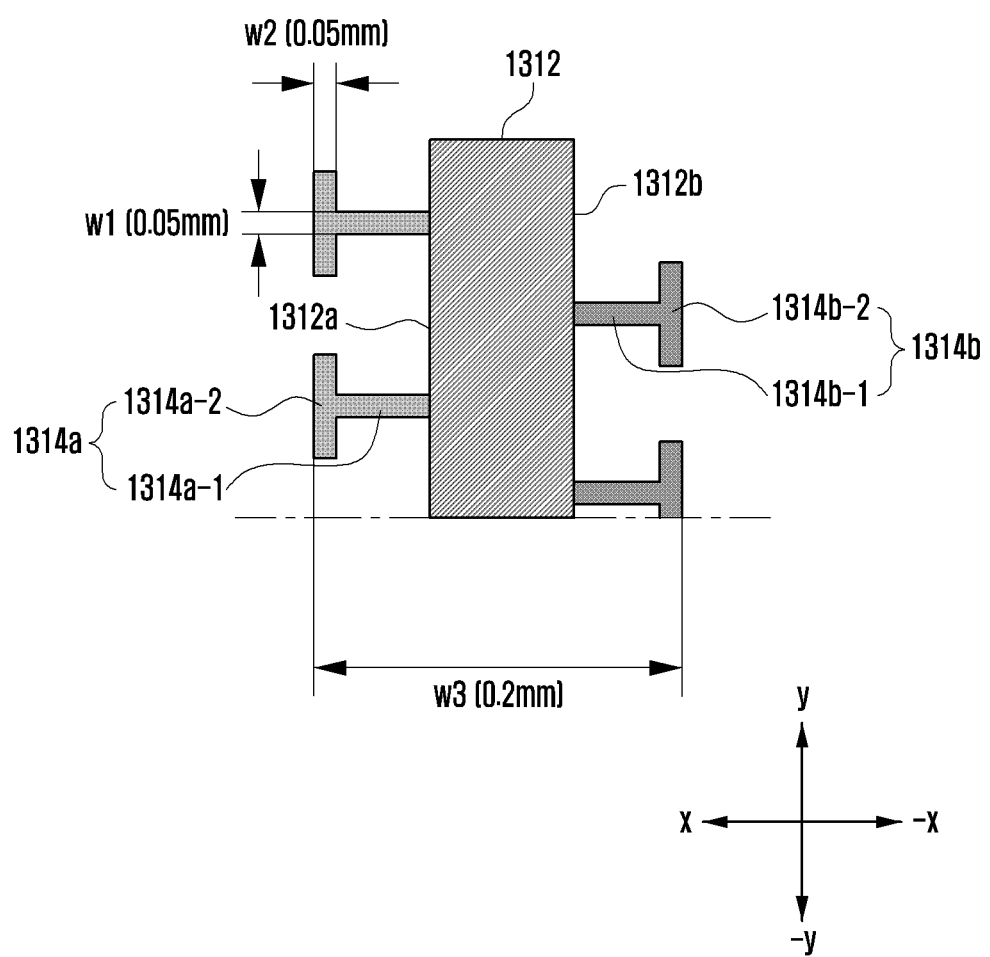
FIG. 13B is a view illustrating Velcro patterns of a flexible plate according to certain embodiments of the disclosure.

FIG. 13A is a view illustrating a flexible plate of an electronic device according to certain embodiments of the disclosure. FIG. 13B is a view illustrating Velcro patterns of a flexible plate according to certain embodiments of the disclosure.

Referring to FIGS. 13A and 13B, an electronic device 1300 (e.g., the electronic device 100 in FIG. 5A) may include a flexible plate 1310 (e.g., the flexible plate 500 in FIG. 5A). The flexible plate 1310 may be configured in a single layer or a plurality of layers (e.g., the plurality of layers 1110 and 1120 in FIG. 11 or the plurality of layers 1210, 1220, 1230, and 1240 in FIG. 12).

According to an embodiment, the flexible plate 1310 may include a first planar portion 1311a facing the first area (e.g., the first area h1 in FIG. 4B) of the display (e.g., the display 400 in FIG. 4B), a second planar portion 1311b facing the second area (e.g., the second area h2 in FIG. 4B) of the display 400, and a flexible portion 1311c facing the third area (e.g., the third area h3 in FIG. 4B) of the display 400. According to an embodiment, the flexible plate 1310 may be foldable or unfoldable together with the display panel (e.g., the display panel 430 in FIG. 4B) about the folding axis (e.g., the axis A) via at least a portion of the flexible portion 1311c.

According to an embodiment, at least a portion of the flexible portion 1311c may be arranged to support the rear surface of the display panel (e.g., the display panel 430 in FIG. 4B) when the display is subjected to bending (e.g., the third area h3 of the display 400 in FIG. 4B).

According to an embodiment, the flexible portion 1311c of the flexible plate 1310 may include a plurality of slits 1316 and support pieces 1312 provided at regular or irregular intervals, and a plurality of Velcro patterns 1314 extending from the plurality of support pieces 1312.

In a certain embodiment, the first planar portion 1311a and the second planar portion 1311b of the flexible plate 1310 may be configured without the plurality of slits 1316 and the plurality of Velcro patterns 1314. The plurality of support pieces 1312 of the flexible portion 1311c may be arranged so as to be spaced apart from each other via the plurality of slits 1316. The plurality of support pieces 1312 may be connected to each other via the plurality of Velcro patterns 1314.

In a certain embodiment, the plurality of Velcro patterns 1314 may include first Velcro patterns 1314a extending in length in a first direction (e.g., the x-axis direction) from the first side surfaces 1312a of the plurality of support pieces 1312 and a plurality of second Velcro patterns 1314b extending in length in a second direction (e.g., the −x-axis direction) from the second side surfaces 1312b of the support pieces 1312.

In a certain embodiment, the plurality of first Velcro patterns 1314a may include first portions 1314a-1, which extend in the first direction (e.g., the x-axis direction) from the first side surfaces 1312a of the plurality of support pieces 1312, respectively, and second portions 1314a-2, which extend in a third direction (e.g., the y-axis direction) and a fourth direction (e.g., the −y-axis direction) from the ends of the first portions 1314a-1, respectively. The first portions 1314*a*-1 may have a length extending in the first direction (e.g., the x-axis direction), and the second portions 1314*a*-2 may have a length extending in the third direction (e.g., the y-axis direction) and the fourth direction (e.g., the -y-axis direction).

In a certain embodiment, the plurality of second Velcro patterns 1314*b* may include third portions 1314*b*-1 having a length extending in the second direction (e.g., the -x-axis direction) from the second side surfaces 1312*b* of the plurality of support pieces 1312, and fourth portions 1314*b*-2 having a length extending in the third direction (e.g., the y-axis direction) and the fourth direction (e.g., the -y-axis direction) from the ends of the third portions 1314*b*-1, respectively. The third portions 1314*b*-1 may have a length extending in the second direction (e.g., the -x-axis direction), and the fourth portions 1314*a*-2 may have a length extending in the third direction (e.g., the y-axis direction) and the fourth direction (e.g., the -y-axis direction).

In a certain embodiment, a support piece 1312 may be located in the center, first Velcro patterns 1314*a* may be located in one side direction (e.g., the x-axis direction) of the support piece 1312, and second Velcro patterns 1314*b* may be located in the other side direction (e.g., the -x-axis direction) of the support piece 1312. As another embodiment, a support piece 1312 may be located in the center, second Velcro patterns 1314*b* may be located in one side direction (e.g., the x-axis direction) of the support piece 1312, and first Velcro patterns 1314*a* may be located in the other side direction (e.g., the -x-axis direction) of the support piece 1312.

In a certain embodiment, the first Velcro patterns 1314*a* and the second Velcro patterns 1314*b* extending in length from a plurality of adjacent support pieces 1312 may be arranged so as to be engaged with each other in a lattice form, and thus the plurality of support pieces 1312 may be connected to each other.

In a certain embodiment, first portions 1314*a*-1 of the first Velcro patterns 1314*a* and third portions 1314*b*-1 of the second Velcro patterns 1314*b* may have a first width w1 (e.g., about 0.05 mm). In a certain embodiment, second portions 1314*a*-2 of the first Velcro patterns 1314*a* and fourth portions 1314*b*-2 of the second Velcro patterns 1314*b* may have a second width w2 (e.g., about 0.05 mm). In a certain embodiment, the support piece 1312, the first Velcro patterns 1314*a*, and the second Velcro patterns 1314*b* may have may have a third width w3 (e.g., about 0.2 mm) in total.

In a certain embodiment, when the width of the support pieces 1312 is increased, it is possible to increase rigidity for supporting the display panel in the folding area. In a certain embodiment, when the widths of the first Velcro patterns 1314*a* and the second Velcro patterns 1314*b* are increased, it is possible to increase the elongation rate and the shear strength of the flexible portions 1311*c* and to secure flexibility. In a certain embodiment, when the densities of the support pieces 1312, the first Velcro patterns 1314*a*, and the second Velcro patterns 1314*b* are reduced, and the thicknesses of the first Velcro patterns 1314*a* and the second Velcro patterns 1314*b* are increased, it is possible to enhance tensile strength and shear strength.

Figure 14:
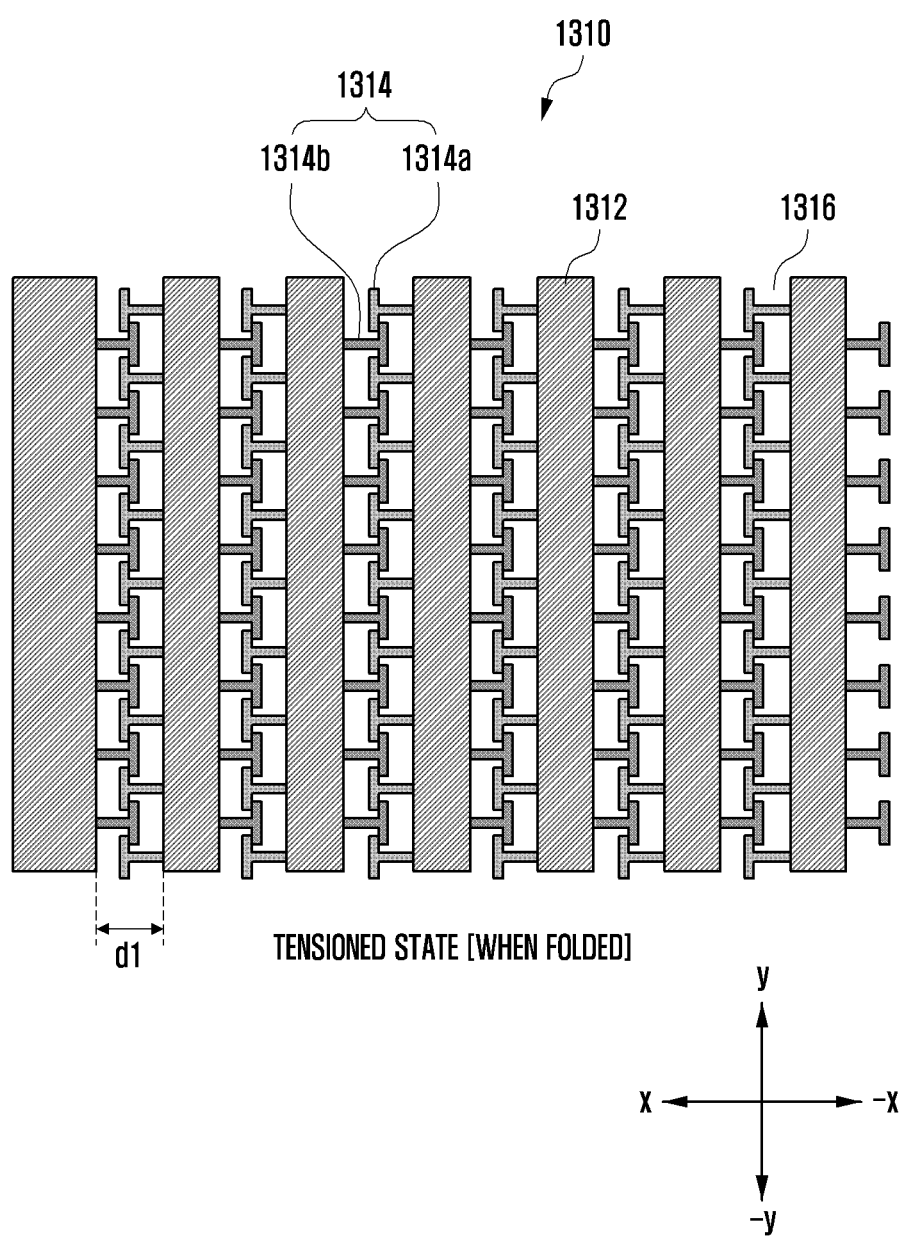
FIG. 14 is a view illustrating a flexible plate in a folded state (e.g., a closed state) of an electronic device according to certain embodiments of the disclosure.

FIG. 14 is a view illustrating a flexible plate in a folded state (e.g., a closed state) of an electronic device according to certain embodiments of the disclosure.

Referring to FIGS. 2 and 14, when the electronic device 100 is in the folded state (e.g., the closed state), the gaps between the plurality of slits 1316 provided in the flexible portion (e.g., the flexible portion 703 in FIG. 7, the flexible portion 903 in FIG. 9, the flexible portion 1103 in FIG. 11, or the flexible portion 1311*c* of FIG. 13A) of the flexible plate 1310 may be increased to a first interval d1. As an example, since the display 130 is folded when the electronic device 100 is in the folded state (e.g., the closed state), the interval between the plurality of slits 1316 in the flexible portion of the flexible plate 1310 in the folding area may be maximally increased (e.g., the first interval). Even when the gaps between the plurality of slits 1316 are increased to the first interval d1, the support pieces may be connected to each other without being separated from each other since the plurality of first Velcro patterns 1314*a* and the plurality of second Velcro patterns 1314*b* of the plurality of support pieces 1312 are arranged so as to be engaged with each other in the form of a lattice.

Figure 15:
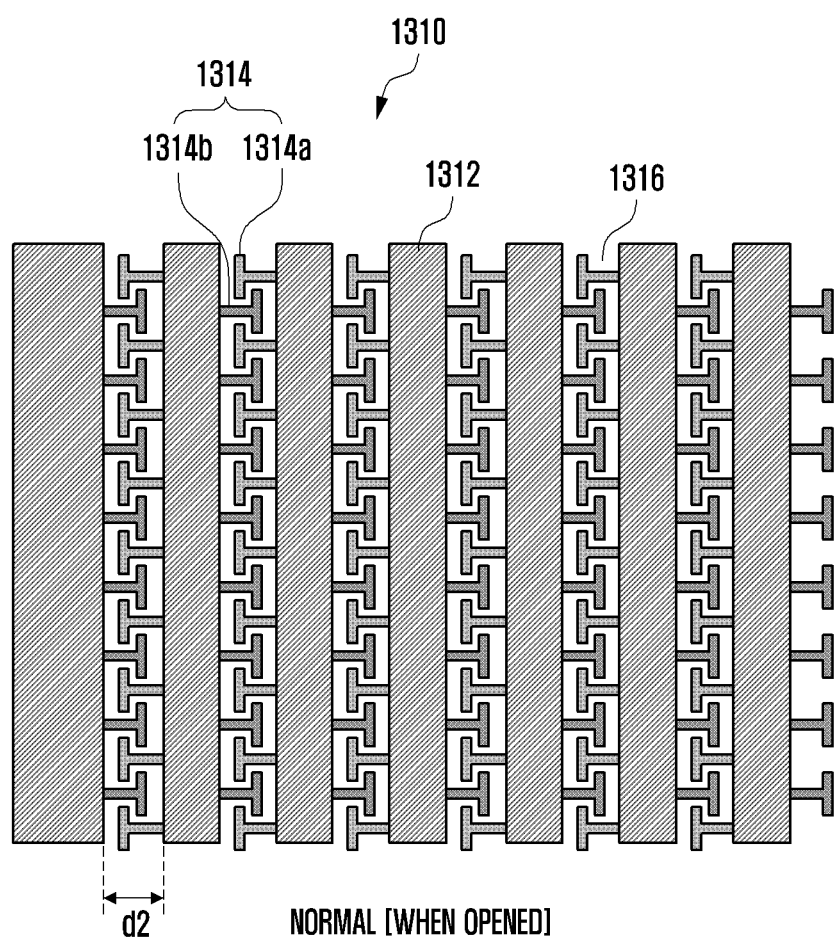
FIG. 15 is a view illustrating a flexible plate in an unfolded state (e.g., an open state) of an electronic device according to certain embodiments of the disclosure.

FIG. 15 is a view illustrating a flexible plate in an unfolded state (e.g., an open state) of an electronic device according to certain embodiments of the disclosure.

Referring to FIGS. 1 and 15, when the electronic device 100 is in the unfolded state (e.g., the opened state), the gaps between the plurality of slits 1316 provided in the flexible portion (e.g., the flexible portion 703 in FIG. 7, the flexible portion 903 in FIG. 9, the flexible portion 1103 in FIG. 11, or the flexible portion 1311*c* of FIG. 13A) of the flexible plate 1310 may be decreased to a second interval d2. As an example, since the display 130 is unfolded when the electronic device 100 is in the folded state (e.g., the closed state), the interval between the plurality of slits 1316 in the flexible portion of the flexible plate 1310 in the folding area may be decreased. Even when the gaps between the plurality of slits 1316 are decreased to the second interval d2, the polarity of support pieces 1312 may be connected to each other without being separated from each other since the plurality of support pieces 1312 of the plurality of Velcro patterns 1314 and the plurality of second Velcro patterns 1314*b* are arranged so as to be engaged with each other in the form of a lattice.

Figure 16:
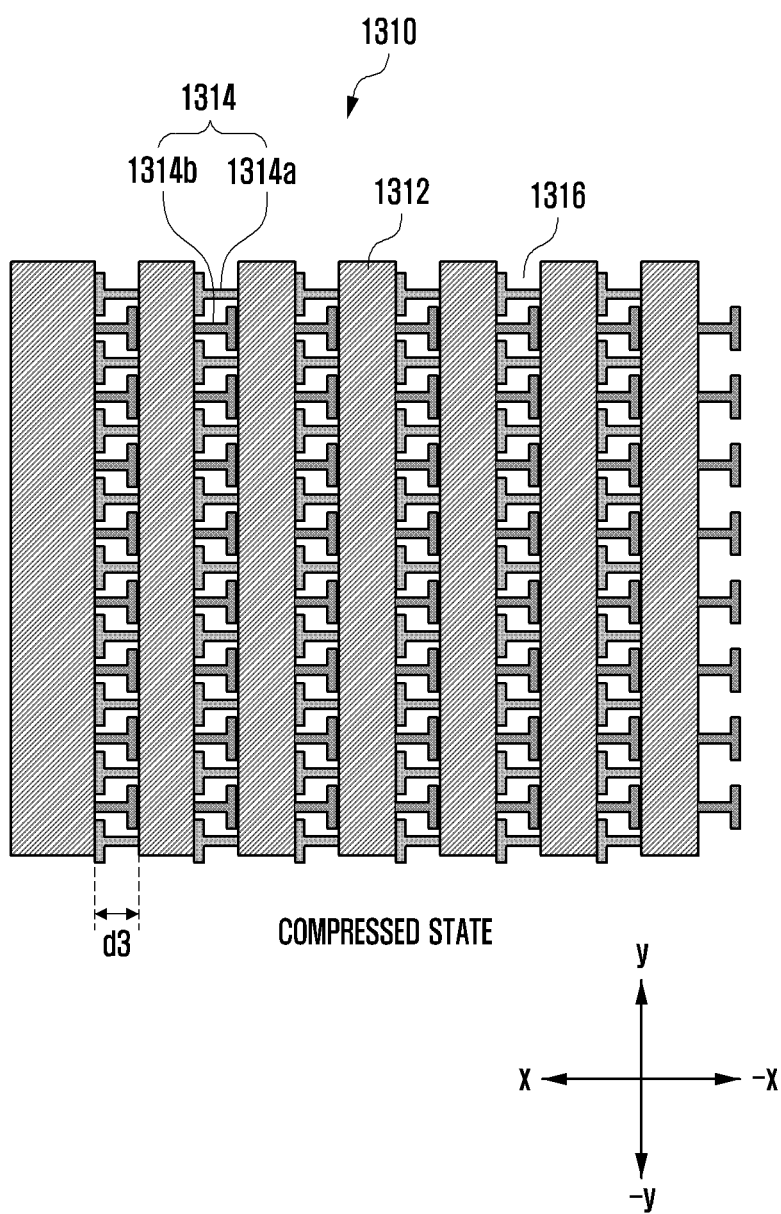
FIG. 16 is a view illustrating a flexible plate in a compressed state.

FIG. 16 is a view illustrating a flexible plate in a compressed state.

Figure 17:
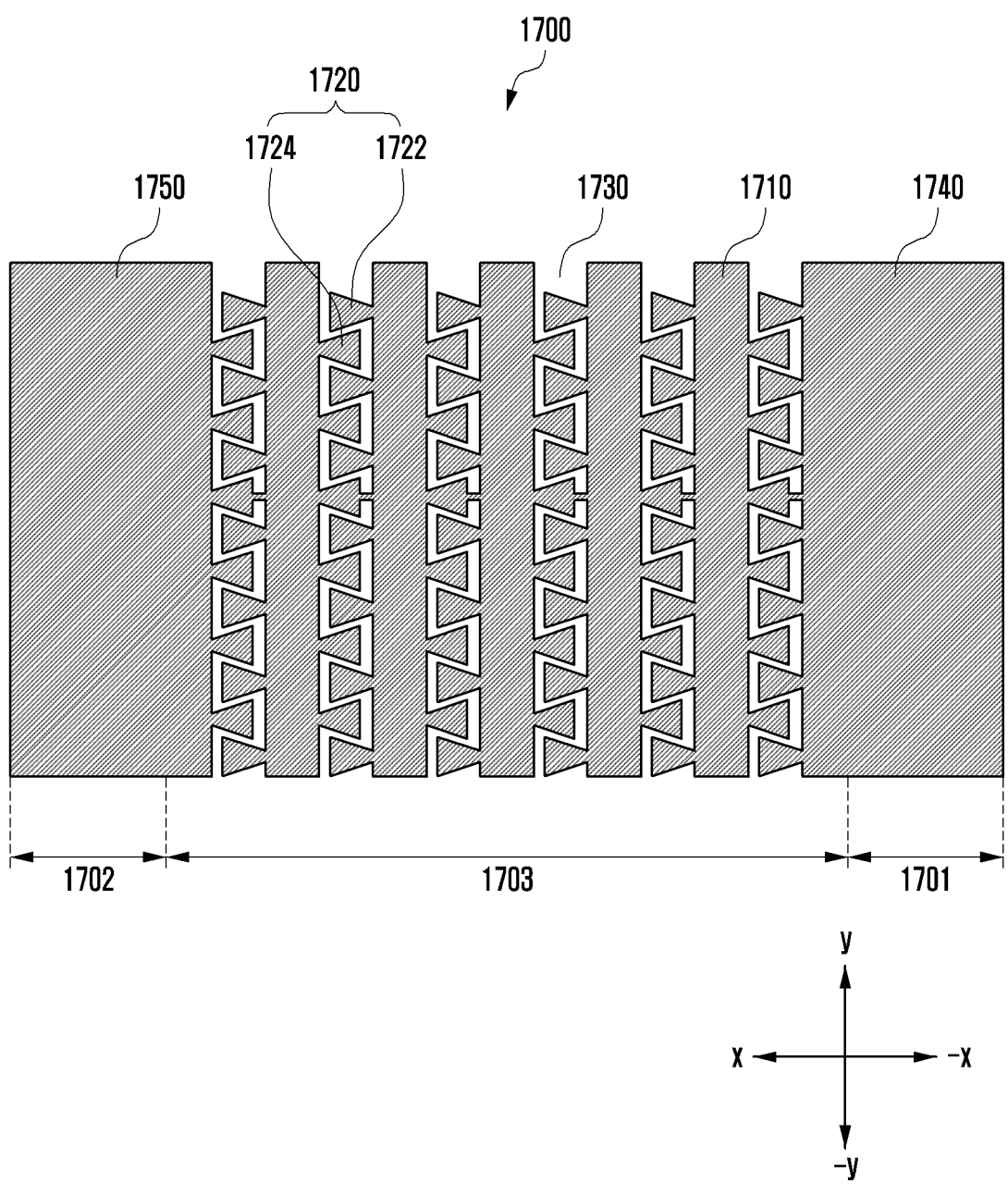
FIG. 17 is a view illustrating a flexible plate according to certain embodiments of the disclosure.

Referring to FIGS. 1, 2, and 16, when the electronic device 100 is dropped in the folded state (e.g., the closed state) or the unfolded state (e.g., the open state), a strong unfolding pressure may be applied to the electronic device 100 instantaneously, which may cause the gaps between the plurality of slits 1316 provided in the flexible portion (e.g., the flexible portion 703 in FIG. 7, the flexible portion 903 in FIG. 9, the flexible portion 1103 in FIG. 11, or the flexible portion 1311*c* of FIG. 13A) of the flexible plate 1310 to be decreased to a third interval d3. As an example, when a pressure is applied to the electronic device 100 in the unfolded state (e.g., the opened state) by the user's gripping of the electronic device, a strong unfolding pressure may be applied to the electronic device 100, which may cause the gaps between the plurality of slits 1316 provided in the flexible portion (e.g., the flexible portion 703 in FIG. 7, the flexible portion 903 in FIG. 9, the flexible portion 1103 in FIG. 11, or the flexible portion 1311*c* of FIG. 13A) of the flexible plate 1310 to be decreased to the minimum interval (e.g., the third interval d3). Even when the gaps between the plurality of slits 1316 are narrowed to the third interval d3, the plurality of support pieces 1312 may be connected to each other without being separated from each other since the plurality of first Velcro patterns 1314*a* and the plurality of second Velcro patterns 1314*b* of the plurality of support pieces 1312 are arranged so as to be engaged with each other in the form of a lattice. FIG. 17 is a view illustrating a flexible plate according to certain embodiments of the disclosure.

Referring to FIG. 17, the flexible plate 1700 according to certain embodiments of the disclosure may be configured in a single layer or a plurality of layers (e.g., the plurality of layers 1110 and 1120 in FIG. 11 or the plurality of layers 1210, 1220, 1230, and 1240 in FIG. 12).

According to an embodiment, the flexible plate 1700 may include a first planar portion 1701 facing the first area (e.g., the first area h1 in FIG. 4B) of the display (e.g., the display 400 in FIG. 4B), a second planar portion 1702 facing the second area (e.g., the second area h2 in FIG. 4B) of the display 400, and a flexible portion 1703 facing the third area (e.g., the third area h3 in FIG. 4B) of the display 400. According to an embodiment, the flexible plate 1700 may be foldable or unfoldable together with the display panel (e.g., the display panel 430 in FIG. 4B) about the folding axis (e.g., the axis A) via at least a portion of the flexible portion 1703.

According to an embodiment, at least a portion of the flexible portion 1703 may be arranged to support the rear surface of the display panel (e.g., the display panel 430 in FIG. 4B) when the display is subjected to bending (e.g., the third area h3 of the display 400 in FIG. 4B).

According to an embodiment, the flexible portion 1703 of the flexible plate 1700 may include a plurality of slits 1730 and support pieces 1710 provided at regular or irregular intervals, and a plurality of Velcro patterns 1720 extending from the plurality of support pieces 1710.

According to an embodiment, the first planar portion 1701 of the flexible plate 1700 may include a first support portion 1740. According to an embodiment, the first planar portion 1702 of the flexible plate 1700 may include a second support portion 1750. The first support portion 1740 and the second support portion 1750 may be configured without the plurality of slits 1730 and the plurality of support pieces 1710.

In a certain embodiment, the first planar portion 1701 and the second planar portion 1702 of the flexible plate 1700 may be configured without the plurality of slits 1730 and the plurality of Velcro patterns 1720. The plurality of support pieces 1710 of the flexible portion 1703 may be arranged so as to be spaced apart from each other via the plurality of slits 1730. The plurality of support pieces 1710 may be connected to each other via the plurality of Velcro patterns 1720.

In a certain embodiment, the plurality of Velcro patterns 1720 may include first Velcro patterns 1722 extending in length in a first direction (e.g., the x-axis direction) from the first side surfaces of the plurality of support pieces 1710 and a plurality of second Velcro patterns 1724 extending in length in a second direction (e.g., the -x-axis direction) from the second side surfaces of the support pieces 1710.

In a certain embodiment, the first Velcro patterns 1722 have a "▷" shape in which the width of the first Velcro patterns is increased from the first sides of the support pieces 1710 toward a first direction (e.g., the x-axis direction).

In a certain embodiment, the second Velcro patterns 1724 have a "◁" shape in which the width of the first Velcro patterns is increased from the second sides of the support pieces 1710 toward a second direction (e.g., the -x-axis direction).

In a certain embodiment, a support piece 1710 may be located in the center, first Velcro patterns 1722 may be located in one side direction (e.g., the x-axis direction) of the support piece 1710, and second Velcro patterns 1724 may be located in the other side direction (e.g., the -x-axis direction) of the support piece 1710. As another embodiment, a support piece 1710 may be located in the center, second Velcro patterns 1724 may be located in one side direction (e.g., the x-axis direction) of the support piece 1710, and first Velcro patterns 1724 may be located in the other side direction (e.g., the -x-axis direction) of the support piece 1710.

In a certain embodiment, the first Velcro patterns 1722 and the second Velcro patterns 1724 extending in length from a plurality of adjacent support pieces 1710 may be arranged so as to be engaged with each other in a lattice form, and thus the plurality of support pieces 1710 may be connected to each other.

Figure 18:
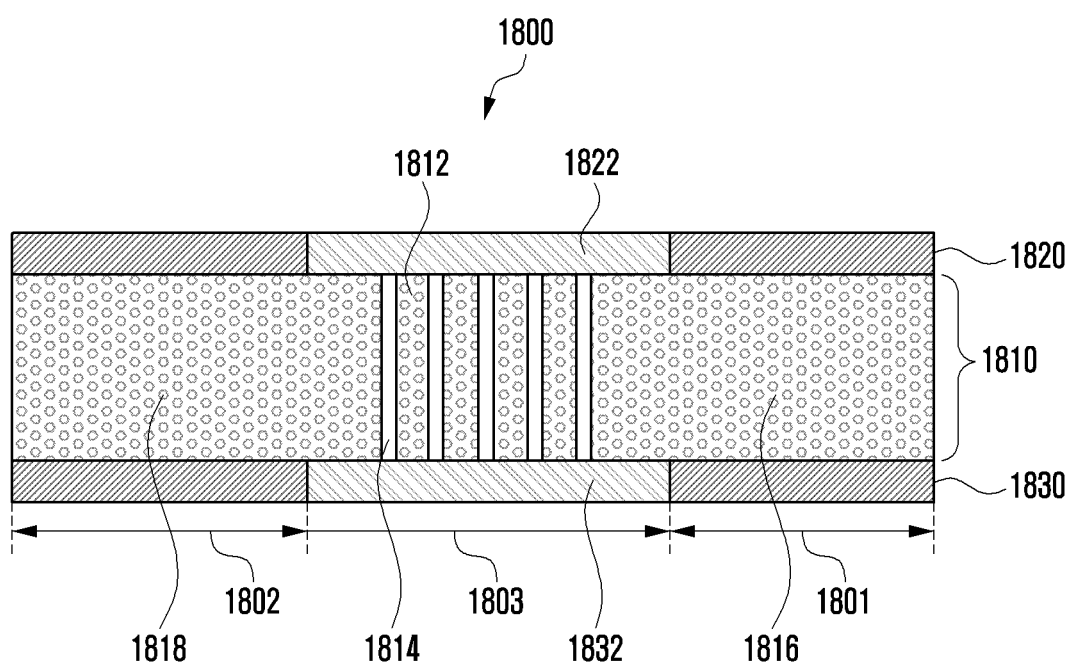
FIG. 18 is a view illustrating a flexible plate according to certain embodiments of the disclosure.

FIG. 18 is a view illustrating a flexible plate according to certain embodiments of the disclosure.

Referring to FIG. 18, an electronic device (e.g., the electronic device 100 in FIG. 5A) may include a flexible plate 1800 (e.g., the flexible plate 900 in FIG. 9, the flexible plate 1100 in FIG. 11, or the flexible plate 1200 in FIG. 12). The flexible plate 1800 may include a plurality of layers 1810, 1820, 1830, 1822, and 1832. The plurality of layers 1810, 1820, 1830, 1822, and 1832 of the flexible plate 1800 may include a first support layer 1810, a second support layer 1820, a third support layer 1830, a first skin layer 1822, and a second skin layer 1832. In a certain embodiment, the second support layer 1820 and the first skin layer 1822 may be located at the uppermost portions, and the first support layer 1810 may be located under the second support layer 1820. The third support layer 1830 and the second skin layer 1832 may be located under the first support layer 1810.

According to an embodiment, the flexible plate 1800 may include a first planar portion 1801 facing the first area (e.g., the first area h1 in FIG. 4B) of the display (e.g., the display 400 in FIG. 4B), a second planar portion 1802 facing the second area (e.g., the second area h2 in FIG. 4B) of the display 400, and a flexible portion 1803 facing the third area (e.g., the third area h3 in FIG. 4B) of the display 400. According to an embodiment, the flexible plate 1800 may be foldable or unfoldable together with the display panel (e.g., the display panel 430 in FIG. 4B) about the folding axis (e.g., the axis A) via at least a portion of the flexible portion 1803.

According to an embodiment, at least a portion of the flexible portion 1803 may be arranged to support the rear surface of the display panel (e.g., the display panel 430 in FIG. 4B) when the display is subjected to bending (e.g., the third area h3 of the display 400 in FIG. 4B).

In a certain embodiment, the second support layers 1820 are provided on the first planar portion 1801 and the second planar portion 1802, respectively, but are not provided on the flexible portion 1803. The first skin layer 1822 may be arranged on the flexible portion 1803 on the same plane as the second support layer 1820. The first skin layer 1822 may be arranged in a space between the second support layers 1820.

In a certain embodiment, the third support layers 1830 are provided on the first planar portion 1801 and the second planar portion 1802, respectively, but are not provided on the flexible portion 1803. The second skin layer 1832 may be arranged on the flexible portion 1803 on the same plane as the third support layer 1830. The second skin layer 1832 may be arranged in a space between the third support layers 1830.

According to an embodiment, the flexible portion 1803 of the flexible plate 1800 may include a plurality of slits 1814 and a plurality of support pieces 1812 provided at regular or irregular intervals. The plurality of slits 1814 and the plurality of support pieces 1812 may be formed in the first support layer 1810. The first planar portion 1816 and the second planar portion 1818 of the first support layer 1810 may be configured without the slits 1814. The plurality of support pieces 1812 of the flexible portion 1803 may be arranged so as to be connected to each other. In another example, the plurality of support pieces 1812 of the flexible portion 18033 may be separated from each other.

According to an embodiment, the first skin layer 1822 may be arranged at the upper side (e.g., the y-axis direction) of the first support layer 1810 with respect to the folding axis (e.g., the axis A), and thus the plurality of slits 1814 in the flexible portion 1803 may be provided in the form of being closed at the upper side (e.g., the y-axis direction). The plurality of support pieces 1812 may be connected to each other via the first skin layer 1822.

According to an embodiment, the second skin layer 1832 may be arranged at the lower side (e.g., the −y-axis direction) of the first support layer 1810 with respect to the folding axis (e.g., the axis A), and thus the plurality of slits 1814 in the flexible portion 1803 may be provided in the form of being closed at the lower side (e.g., the −y-axis direction). The plurality of support pieces 1812 may be connected to each other via the second skin layer 1832.

As another embodiment, the first skin layer 1822 and the second skin layer 1832 may include slits in a direction orthogonal to the plurality of slits 1814.

According to an embodiment, the first support layer 1810, the second support layer 1820, and the third support layer 1830 of the flexible plate 1800 may include a carbon fiber reinforced plastic (CFRP).

In a certain embodiment, the first layer 1810, the second layer 1820, and the third support layer 1830 of the flexible plate 1800 may be oriented in a first direction (e.g., a direction 1020 that is the same as the folding axis 1001 (e.g., the axis A)) (e.g., the 0-degree orientation).

In a certain embodiment, the first support layer 1810, the second support layer 1820, and the third support layer 1830 of the flexible plate 1800 may be oriented in the first direction (e.g., the same direction 1020 as the folding axis 1001 (e.g., the axis A)) (e.g., the 0-degree orientation) and may be oriented in the second direction (e.g., the direction 1010 orthogonal to the folding axis 1001 (e.g., the axis A)) (e.g., the 90-degree orientation).

In a certain embodiment, in the flexible plate 1800, since the first skin layer 1822 is arranged above the flexible portion 1803 and the second skin layer 1832 is arranged under the flexible portion 1803, it is flexible to make the upper and lower sides of the flexible portion 1803 flat. It is possible to reduce the level difference on the top and bottom surfaces of the flexible plate 1800 and to improve surface quality, to increase shear strength, and to secure flexibility.

Figure 19:
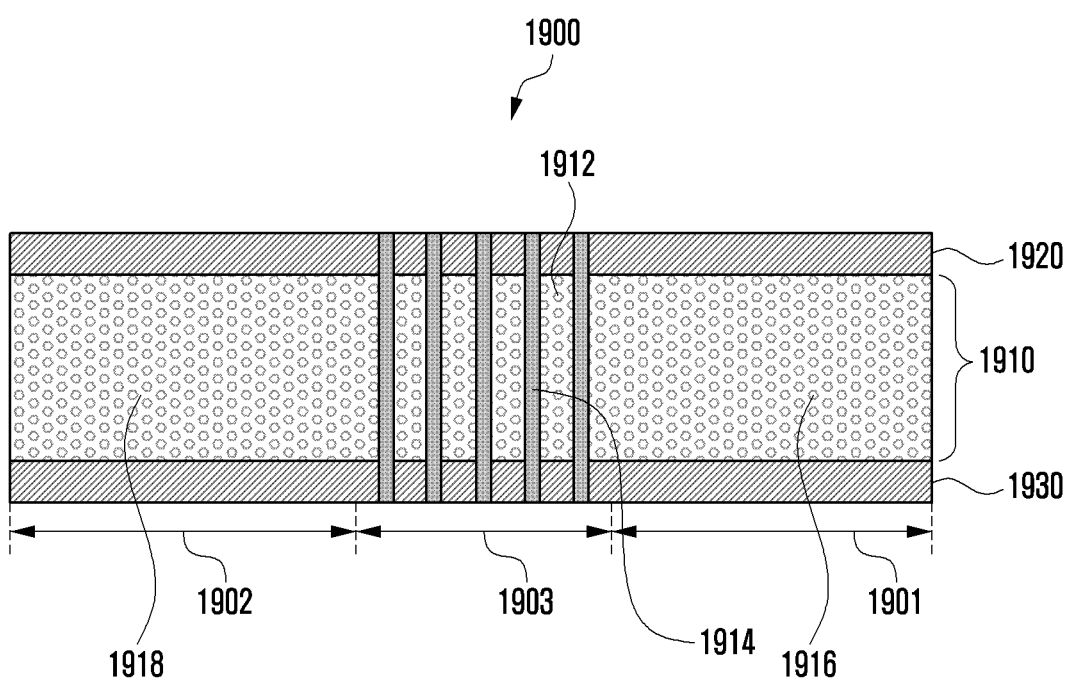
FIG. 19 is a view illustrating a flexible plate according to certain embodiments of the disclosure.

FIG. 19 is a view illustrating a flexible plate according to certain embodiments of the disclosure.

Referring to FIG. 19, an electronic device (e.g., the electronic device 100 in FIG. 5A) may include a flexible plate 1900 (e.g., the flexible plate 900 in FIG. 9, the flexible plate 1100 in FIG. 11, or the flexible plate 1200 in FIG. 12). The flexible plate 1900 may include a plurality of layers 1910, 1920, and 1930. The plurality of layers 1910, 1920, and 1930 of the flexible plate 1900 may include a first support layer 1910, a second support layer 1920, and a third support layer 1930. In a certain embodiment, the second support layer 1920 may be located at the uppermost stage, and the first support layer 1910 may be located under the second support layer 1920. The third support layer 1930 may be located under the first support layer 1910.

According to an embodiment, the flexible plate 1900 may include a first planar portion 1901 facing the first area (e.g., the first area h1 in FIG. 4B) of the display (e.g., the display 400 in FIG. 4B), a second planar portion 1902 facing the second area (e.g., the second area h2 in FIG. 4B) of the display 400, and a flexible portion 1903 facing the third area (e.g., the third area h3 in FIG. 4B) of the display 400. According to an embodiment, the flexible plate 1900 may be foldable or unfoldable together with the display panel (e.g., the display panel 430 in FIG. 4B) about the folding axis (e.g., the axis A) via at least a portion of the flexible portion 1903.

According to an embodiment, at least a portion of the flexible portion 1903 may be arranged to support the rear surface of the display panel (e.g., the display panel 430 in FIG. 4B) when the display is subjected to bending (e.g., the third area h3 of the display 400 in FIG. 4B).

According to an embodiment, the flexible portion 1903 of the flexible plate 1900 may include a plurality of slits 1914 and a plurality of support pieces 1912 provided at regular or irregular intervals. A first planar portion 1916 and a second planar portion 1918 of the first support layer 1910 may be configured without the slits 1914.

In a certain embodiment, the plurality of slits 1914 may be provided in the first support layer 1910, the second support layer 1920, and the third support layer 1930 of the flexible portion 1903, and the plurality of slits 1914 may be filled with a resin. The plurality of support pieces 1912 may be connected to each other by the resin filled in the plurality of slits 1914. In addition, the upper and lower sides of the flexible portion 1903 may be made flat by being sealed by the resin filled in the plurality of slits 1914. It is possible to reduce the level difference on the top and bottom surfaces of the flexible plate 1900 and to improve surface quality, to increase shear strength, and to secure flexibility.

Figure 20:
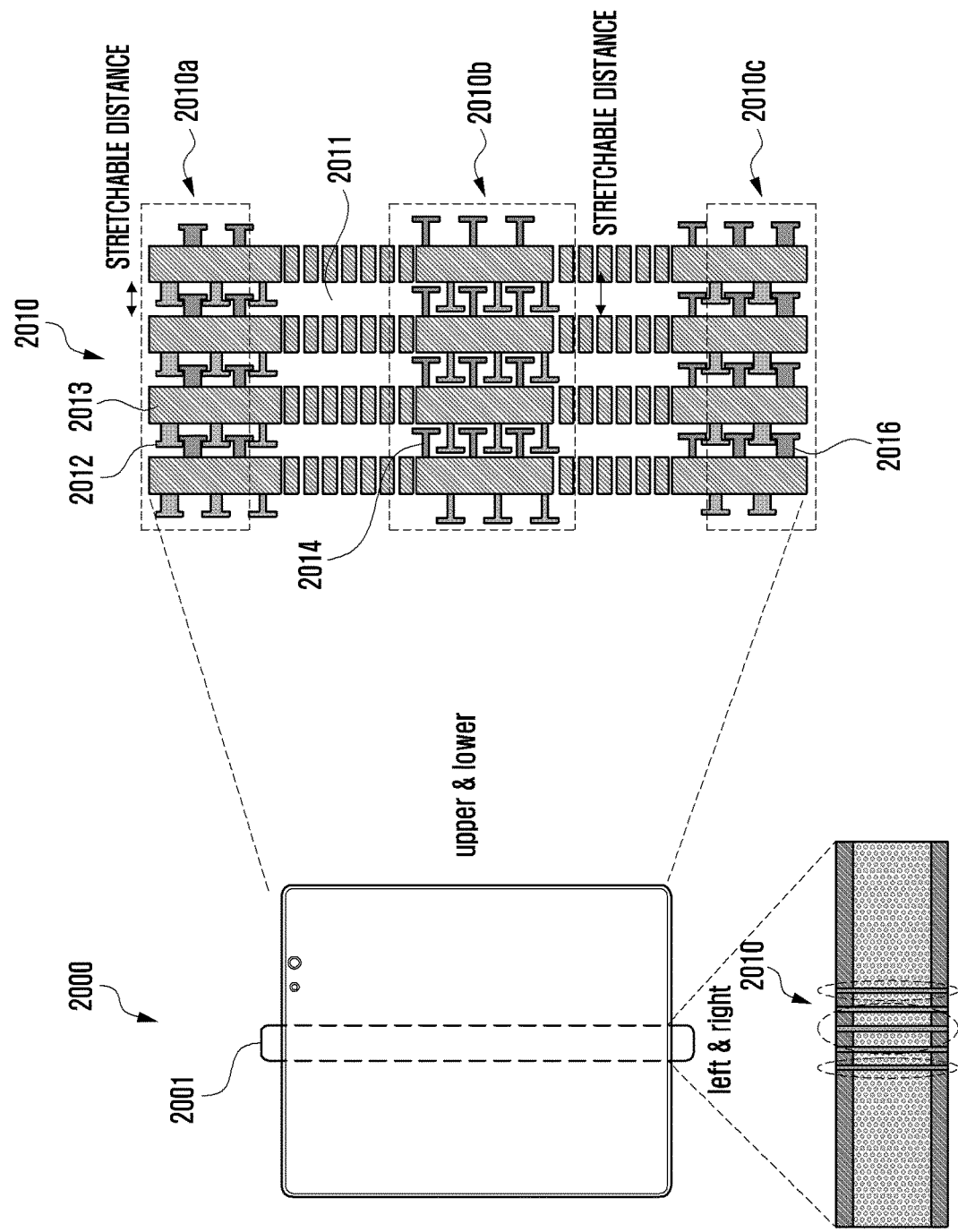
FIG. 20 is a view illustrating Velcro patterns according to positions of a flexible plate according to certain embodiments of the disclosure.
Figure 21:
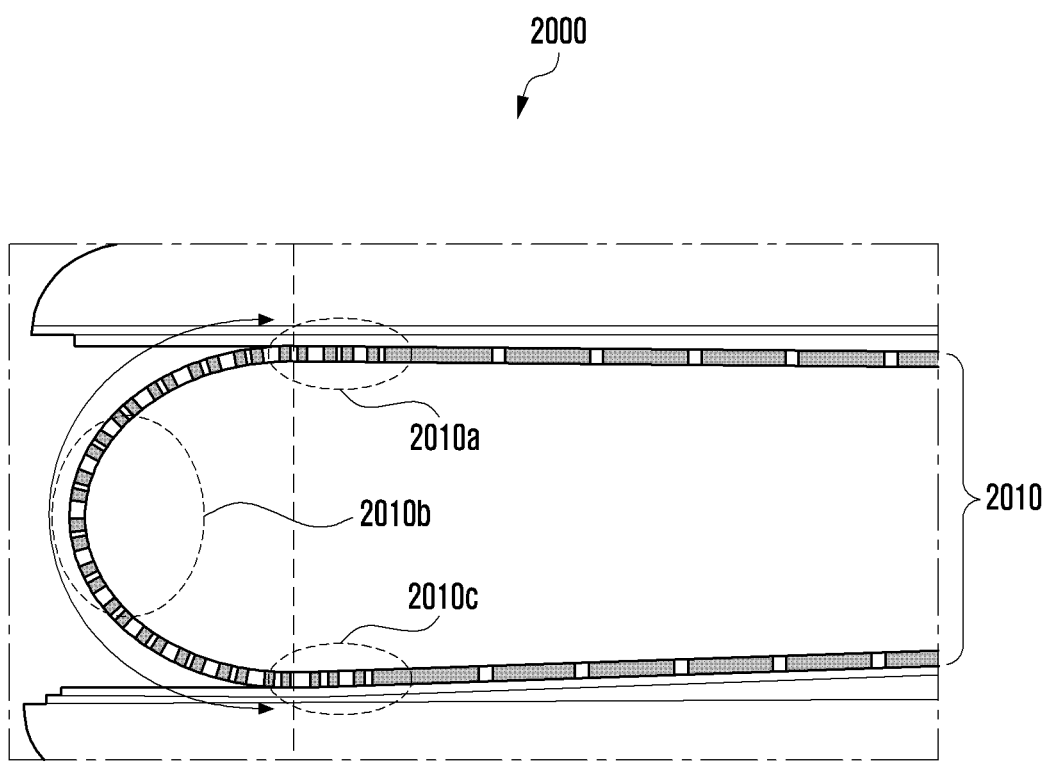
FIG. 21 is a view illustrating a folded state (e.g., a closed state) of an electronic device according to certain embodiments of the disclosure.

FIG. 20 is a view illustrating Velcro patterns according to positions of a flexible plate according to certain embodiments of the disclosure. FIG. 21 is a view illustrating a folded state (e.g., a closed state) of an electronic device according to certain embodiments of the disclosure.

Referring to FIGS. 20 and 21, an electronic device 2000 (e.g., the electronic device 100 in FIG. 5A) may include a flexible plate 2010 (e.g., the flexible plate 500 in FIG. 5A or a flexible plate 1310 in FIG. 13A). The flexible plate 2010 may be configured in a single layer or a plurality of layers (e.g., the plurality of layers 1110 and 1120 in FIG. 11 or the plurality of layers 1210, 1220, 1230, and 1240 in FIG. 12).

According to an embodiment, the flexible plate 2010 may include a first planar portion (e.g., the first planar portion 1311a in FIG. 13A) facing the first area (e.g., the first area h1 in FIG. 4B) of the display (e.g., the display 400 in FIG. 4B), a second planar portion (e.g., the second planar portion 1311b in FIG. 13A) facing the second area (e.g., the second area h2 in FIG. 4B) of the display 400, and a flexible portion 2001 (e.g., the flexible portion 1311c in FIG. 13A) facing the third area (e.g., the third area h3 in FIG. 4B) of the display 400. According to an embodiment, the flexible plate 2010 may be foldable or unfoldable together with the display panel (e.g., the display panel 430 in FIG. 4B) about the folding axis (e.g., the axis A in FIG. 13A) via at least a portion of the flexible portion 2001.

According to an embodiment, at least a portion of the flexible portion 2001 may be arranged to support the rear surface of the display panel (e.g., the display panel 430 in FIG. 4B) when the display is subjected to bending (e.g., the third area h3 of the display 400 in FIG. 4B).

According to an embodiment, the flexible portion 2001 of the flexible plate 2010 may include a plurality of slits 2011 and support pieces 2013 provided at regular or irregular intervals, and a plurality of Velcro patterns 2012, 2014, and 2016 extending from the plurality of support pieces 2013.

The plurality of support pieces 2013 of the flexible portion 2001 may be arranged so as to be spaced apart from each other via the plurality of slits 2011. The plurality of support pieces 2013 may be connected to each other via the plurality of Velcro patterns 2012, 2014, and 2016.

In a certain embodiment, the plurality of Velcro patterns 2012, 2014, and 2016 may include a plurality of first Velcro patterns 2012, a plurality of second Velcro patterns 2014, and a plurality of third Velcro patterns 2016.

In a certain embodiment, the plurality of first Velcro patterns 2012 may be arranged in the upper end 2010a of the flexible plate 2010. In a certain embodiment, the plurality of second Velcro patterns 2014 may be arranged in the central portion 2010b of the flexible plate 2010. In a certain embodiment, the plurality of third Velcro patterns 2016 may be arranged in the lower end 2010c of the flexible plate 2010.

According to an embodiment, when the electronic device 2000 is in the folded state (e.g., the closed state), a high tensile load may be applied to the plurality of first Velcro patterns 2012 arranged in the upper end 2010a and the plurality of third Velcro patterns 2016 arranged in the lower portion 2010c. In a certain embodiment, in order to withstand a high tensile load applied when the electronic device 2000 is in the folded state (e.g., the closed state), the plurality of first Velcro patterns 2012 arranged in the upper end 2010a and the plurality of third Velcro patterns 2016 arranged in the lower end 2010c may be made thicker than the plurality of second Velcro patterns 2014 arranged in the middle portion 2010b.

Figure 22:
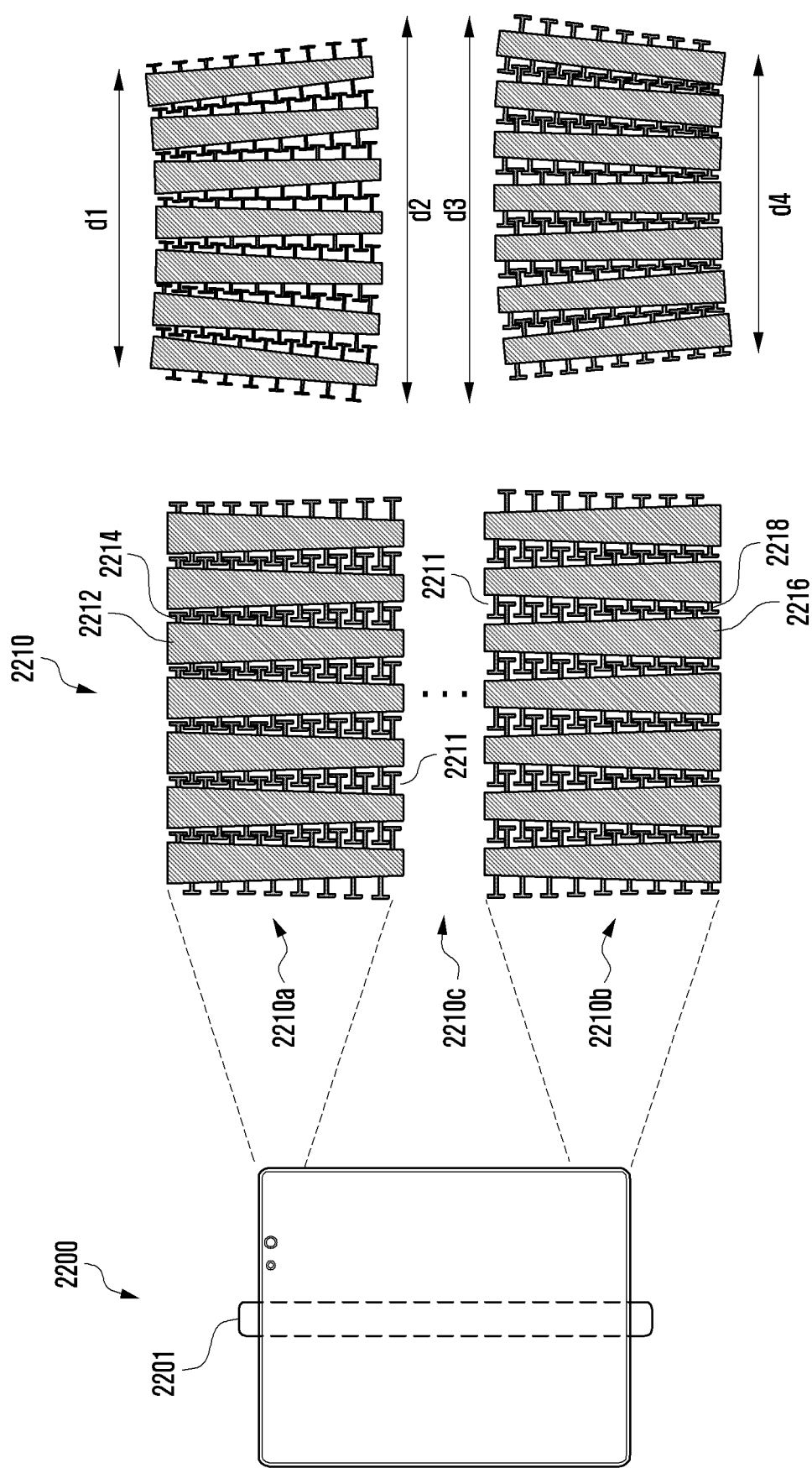
FIG. 22 is a view illustrating a flexible plate of an electronic device according to certain embodiments of the disclosure.

FIG. 22 is a view illustrating a flexible plate of an electronic device according to certain embodiments of the disclosure.

Referring to FIG. 22, an electronic device 2200 (e.g., the electronic device 100 in FIG. 5A) may include a flexible plate 2210 (e.g., the flexible plate 500 in FIG. 5A or a flexible plate 1310 in FIG. 13A). The flexible plate 2210 may be configured in a single layer or a plurality of layers (e.g., the plurality of layers 1110 and 1120 in FIG. 11 or the plurality of layers 1210, 1220, 1230, and 1240 in FIG. 12).

According to an embodiment, the flexible plate 2210 may include a first planar portion (e.g., the first planar portion 1311a in FIG. 13A) facing the first area (e.g., the first area h1 in FIG. 4B) of the display (e.g., the display 400 in FIG. 4B), a second planar portion (e.g., the second planar portion 1311b in FIG. 13A) facing the second area (e.g., the second area h2 in FIG. 4B) of the display 400, and a flexible portion 2201 (e.g., the flexible portion 1311c in FIG. 13A) facing the third area (e.g., the third area h3 in FIG. 4B) of the display 400. According to an embodiment, the flexible plate 2210 may be foldable or unfoldable together in tandem with the display panel (e.g., the display panel 430 in FIG. 4B) about the folding axis (e.g., the axis A in FIG. 13A) via at least a portion of the flexible portion 2201.

According to an embodiment, at least a portion of the flexible portion 2201 may be arranged to support the rear surface of the display panel (e.g., the display panel 430 in FIG. 4B) when the display is subjected to bending (e.g., the third area h3 of the display 400 in FIG. 4B).

According to an embodiment, the flexible portion 2201 of the flexible plate 2210 may include a plurality of slits 2211 and support pieces 2212 and 2216 provided at regular or irregular intervals, and a plurality of Velcro patterns 2214 and 2218 extending from the plurality of support pieces 2212 and 2216.

The plurality of support pieces 2212 and 2216 of the flexible portion 2201 may be arranged so as to be spaced apart from each other via the plurality of slits 2211. The plurality of support pieces 2212 and 2216 may be connected to each other via the plurality of Velcro patterns 2214 and 2218.

In a certain embodiment, the plurality of support pieces 2212 and 2216 may include a plurality of first support pieces 2212 and a plurality of second support pieces 2216. The plurality of first support pieces 2212 may decrease in width gradually from an upper end 2210a moving toward the central portion 2210b of the flexible plate 2210. The plurality of second support pieces 2216 may thus have a taper decreasing in width down towards the central portion 2210b of the flexible plate 2210.

As another embodiment, the plurality of first support pieces 2212 and the plurality of second support pieces 2216 may have a taper gradually increasing or decreasing in width in leftward and/or rightward directions, with respect to the folding axis.

In a certain embodiment, the plurality of Velcro patterns 2214 and 2218 may include a plurality of first Velcro patterns 2214 and a plurality of second Velcro patterns 2218.

In a certain embodiment, the plurality of first Velcro patterns 2214 may extend in length from the plurality of first support pieces 2212. The plurality of second Velcro patterns 2218 may extend in length from the plurality of second support pieces 2216.

In a certain embodiment, the plurality of first support pieces 2212 of the flexible plate 2210 may be provided so as to be wider at the upper end 2210a, and the plurality of second support pieces 2216 may be provided to be wider at the lower end near the central portion 2210c so that durability against an impact applied to the upper end and lower end of the electronic device 2200 can be enhanced and shear strength can be increased. In addition, flexibility can be secured to facilitate folding and unfolding operations in the folding area.

Figure 23:
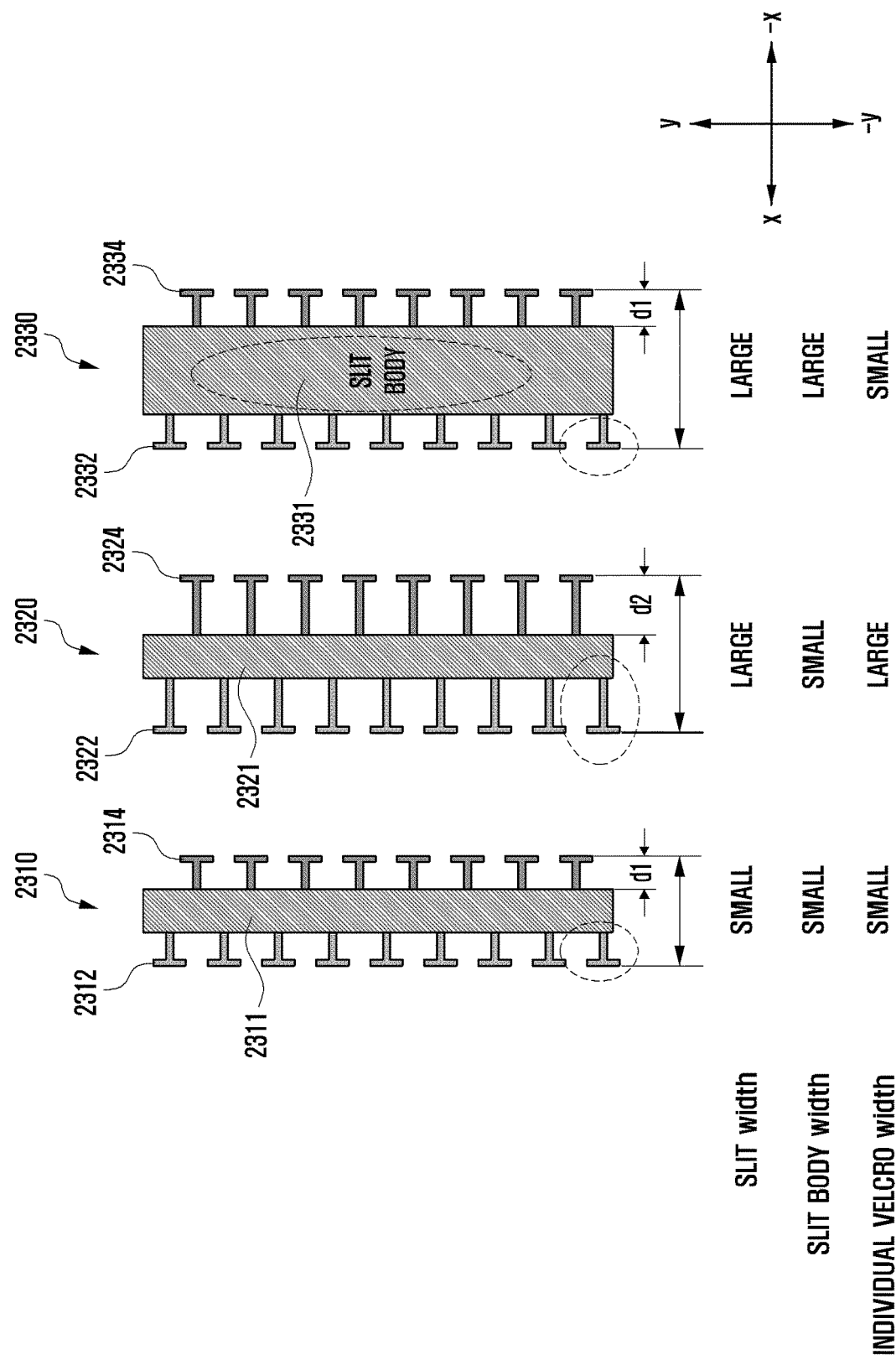
FIG. 23 is a view illustrating a flexible plate according to certain embodiments of the disclosure.

FIG. 23 is a view illustrating a flexible plate according to certain embodiments of the disclosure.

Referring to FIG. 23, it is possible to adjust the tensile elongation rate and compression rate depending on the widths w1 and w2 of the plurality of support pieces 2311, 2321, and 2331 of the flexible plates 2310, 2320, and 2330 and the lengths d1 and d2 of the plurality of Velcro patterns 2312, 2314, 2322, 2324, 2332, and 2334.

In a certain embodiment, the first support piece 2311 of the first flexible plate 2310 and the second support piece 2321 of the second flexible play 2320 may be made to have the same width d1. The first Velcro patterns 2312 and 2314 of the first flexible plate 2310 may have a first length d1, and the second Velcro patterns 2322 and 2324 of the second flexible plate 2320 may have a second length d2 larger than the first length d1. In this way, when the first support piece 2311 and the second support piece 2321 are made to have the same width w1, and the length d2 of the second Velcro patterns 2322 and 2324 is made to be larger than the length d1 of the first Velcro patterns 2312 and 2314, it is possible to increase the tensile elongation rate.

In a certain embodiment, the width w2 of the third support piece 2331 of the third flexible play 2330 may be made to be larger than the width w1 of the first support piece 2311 of the first flexible plate 2310. The first Velcro patterns 2312 and 2314 of the first flexible plate 2310 may have the first length w1, and the third Velcro patterns 2332 and 2334 of the third flexible plate 2320 may also have the first length d1 likewise. In this way, when the first Velcro patterns 2312 and 2314 and the third Velcro patterns 2332 and 2334 are made to the same length d1 and the width w2 of the third support piece is made to be larger than the width w1 of the first support piece 2311, it is possible to reduce the tensile elongation rate and to increase the shear strength.

Figure 24:
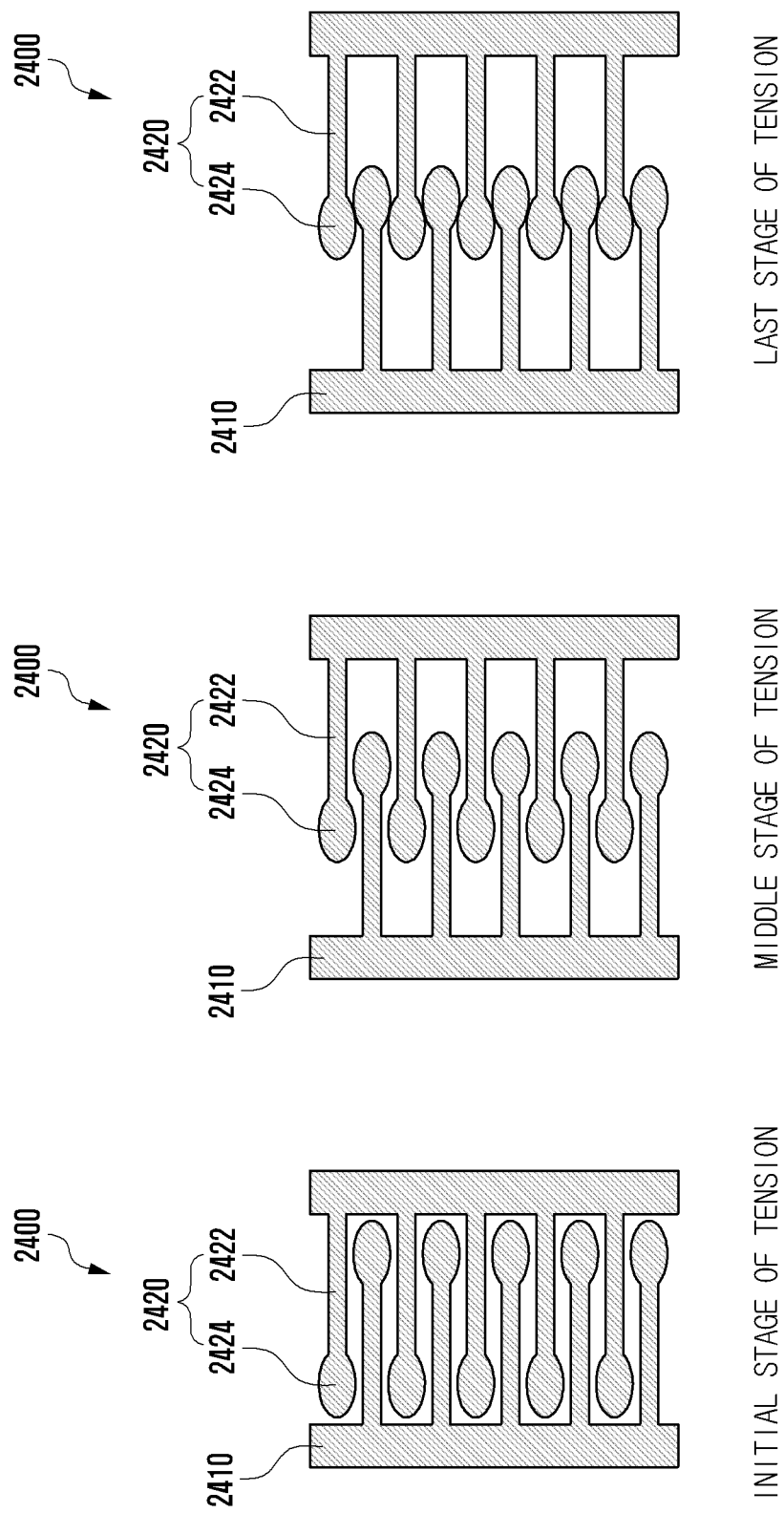
FIG. 24 is a view illustrating Velcro patterns of a flexible plate according to certain embodiments of the disclosure.

FIG. 24 is a view illustrating Velcro patterns 2420 of a flexible plate 2400 according to certain embodiments of the disclosure.

Referring to FIG. 24, a flexible portion (e.g., the flexible portion 1103 in FIG. 11, the flexible portion 1311c in FIG. 13A, or the flexible portion 1703 in FIG. 17) of a flexible plate 2400 according to certain embodiments of the disclosure may be arranged in the folding area of an electronic device (e.g., the electronic device 100 in FIG. 5A).

According to an embodiment, the flexible portion (e.g., the flexible portion 1103 in FIG. 11, the flexible portion 1311c in FIG. 13A, or the flexible portion 1703 in FIG. 17) of the flexible plate 2400 may include a plurality of support pieces 2410 and a plurality of Velcro patterns 2420.

In a certain embodiment, the plurality of Velcro patterns 2420 may include first portions 2422 extending in length from the side surfaces of the plurality of support pieces 2410 and second portions 2424 extending in length from ends of the first portions 2422. In the plurality of Velcro patterns 2420, the first portions 2422 may have a first width, and the second portions 2424 may have a second width greater than the first width. In the plurality of Velcro patterns 2420, the first portions 2422 may have a bar shape, and the second portions 2424 may have an elliptical shape having a predetermined curvature.

Figure 25:
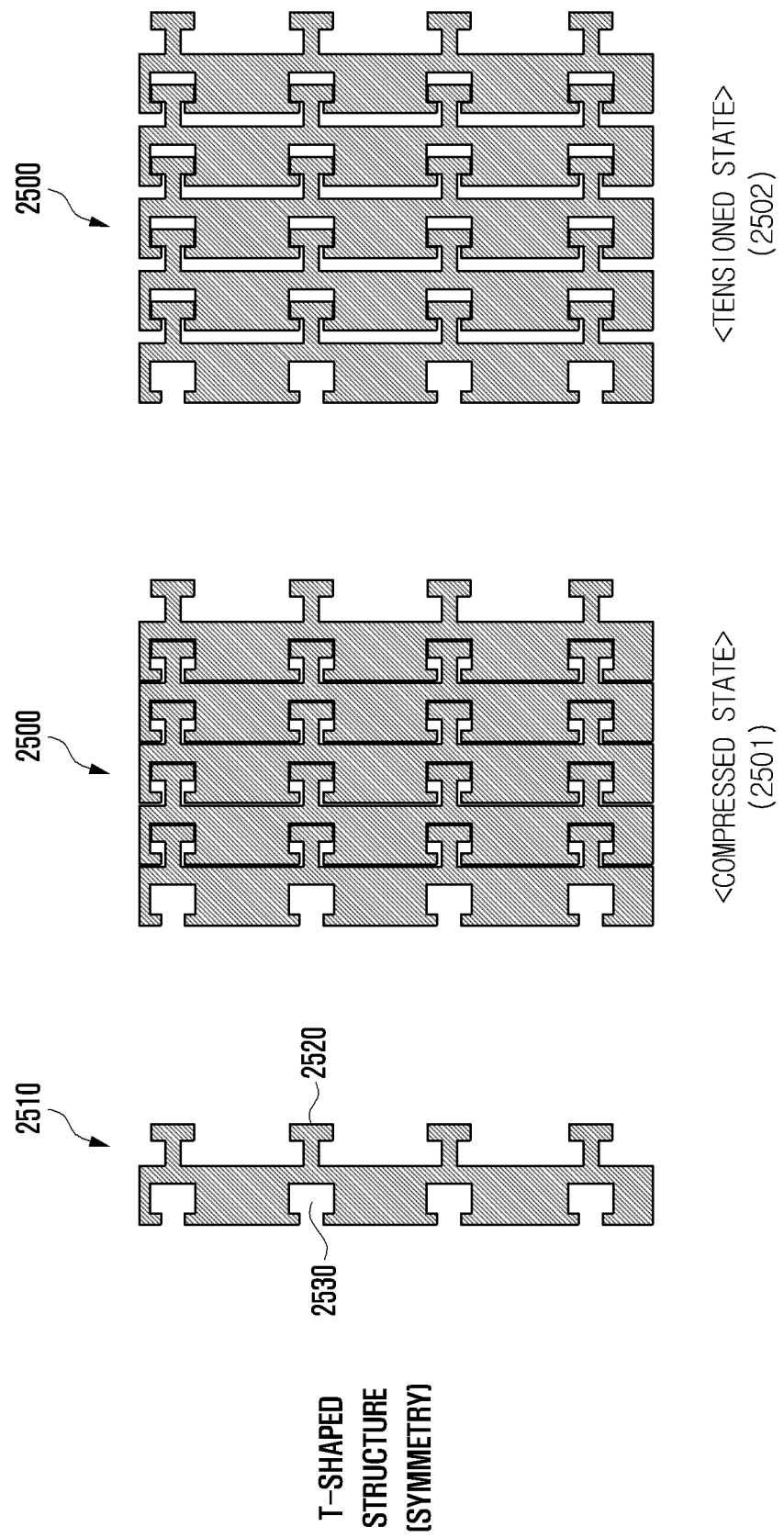
FIG. 25 is a view illustrating a flexible portion of a flexible plate according to certain embodiments of the disclosure.

FIG. 25 is a view illustrating a flexible portion of a flexible plate according to certain embodiments of the disclosure.

Referring to FIG. 25, in the folded state (e.g., the closed state) of an electronic device (e.g., the electronic device 100 in FIG. 2), the flexible portion 2500 (e.g., the flexible portion 703 in FIG. 7 or the flexible portion 903 in FIG. 9) may be in a compressed state 2501. In the unfolded state (e.g., the opened state) of the electronic device (e.g., the electronic device 100 in FIG. 2), the flexible portion 2500 (e.g., the flexible portion 703 in FIG. 7 or the flexible portion 903 in FIG. 9) may be in a tensioned state 2502.

In a certain embodiment, the flexible portion 2500 (e.g., the flexible portion 703 in FIG. 7 or the flexible portion 903 in FIG. 9) may include a plurality of Velcro patterns 2510. As an example, the plurality of Velcro patterns 2510 may include a plurality of support pieces 2520 and a plurality of slit patterns 2530 provided in the plurality of Velcro patterns 2510. As an example, a plurality of adjacent support pieces 2520 may be arranged on the same line in the x-axis direction (e.g., the horizontal direction). A plurality of adjacent support pieces 2520 are inserted into the slit patterns 2530 and arranged so as to be engaged with each other in the form of a lattice so that the plurality of Velcro patterns 2510 can be connected to each other without being separated.

For example, the gaps between the plurality of Velcro patterns 2510 of the flexible portion 2500 may be maximally increased or decreased depending on the compressed state 2501 or the tensioned state 2502. Even when the interval between the plurality of Velcro patterns 2510 of the flexible portion 2500 is maximally increased or decreased, the support pieces 2520 and the slit patterns 2530 may be arranged so as to be engaged with each other, and thus the plurality of Velcro patterns 2510 may be connected to each other without separation.

Figure 26:
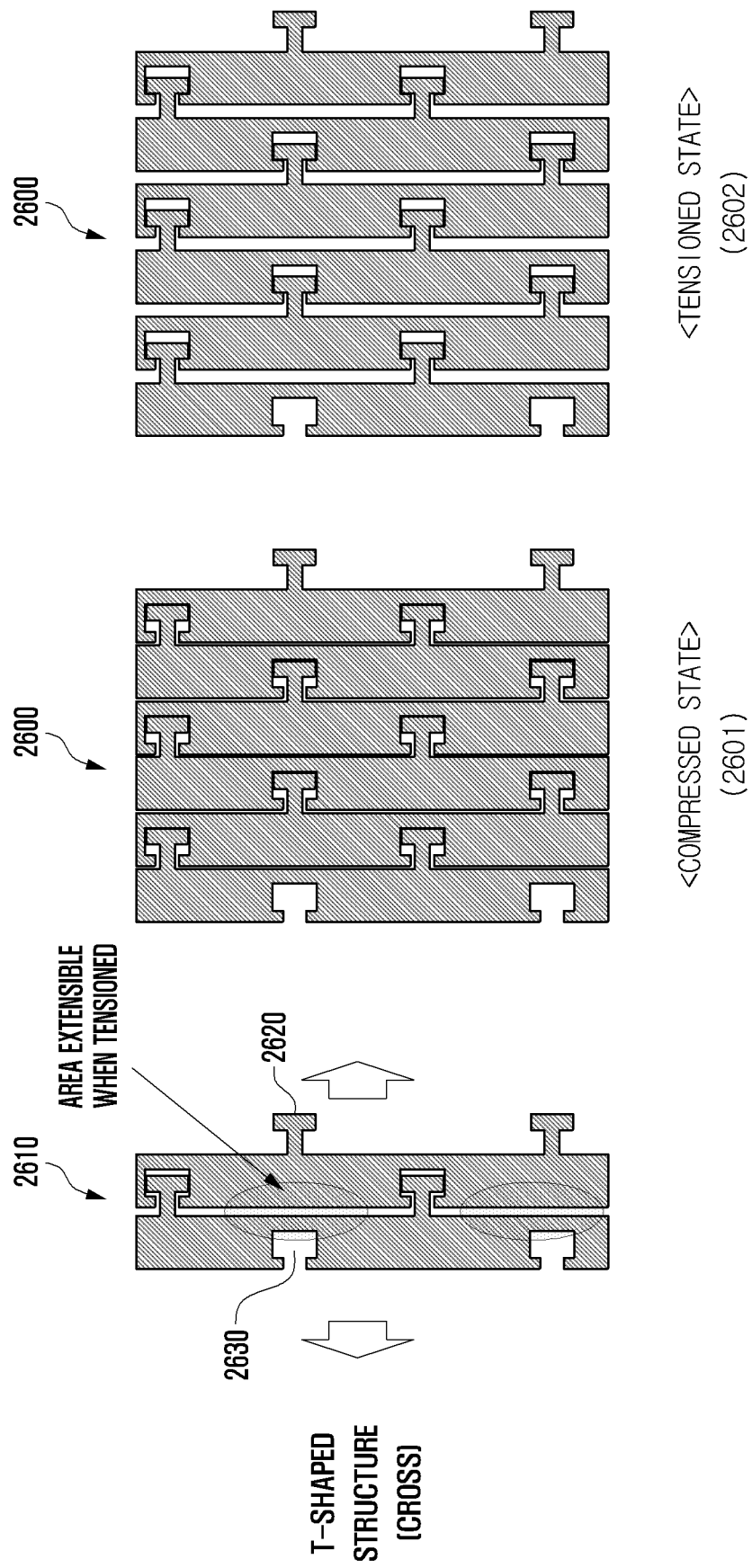
FIG. 26 is a view illustrating a flexible portion of a flexible plate according to certain embodiments of the disclosure.

FIG. 26 is a view illustrating a flexible portion of a flexible plate according to certain embodiments of the disclosure.

Referring to FIG. 26, in the folded state (e.g., the closed state) of an electronic device (e.g., the electronic device 100 in FIG. 2), the flexible portion 2600 (e.g., the flexible portion 703 in FIG. 7 or the flexible portion 903 in FIG. 9) may be in a compressed state 2601. In the unfolded state (e.g., the opened state) of the electronic device (e.g., the electronic device 100 in FIG. 2), the flexible portion 2600 (e.g., the flexible portion 703 in FIG. 7 or the flexible portion 903 in FIG. 9) may be in a tensioned state 2602.

In a certain embodiment, the flexible portion 2600 (e.g., the flexible portion 703 in FIG. 7 or the flexible portion 903 in FIG. 9) may include a plurality of Velcro patterns 2610. For example, the plurality of Velcro patterns 2610 may include a plurality of support pieces 2620 and a plurality of slit patterns 2630 provided in the plurality of Velcro patterns 2610. For example, a plurality of adjacent support pieces 2620 may be located on different lines in the x-axis direction (e.g., the horizontal direction) and may be arranged in a zigzag form. The adjacent support pieces 2620 are inserted into the slit patterns 2630 and arranged so as to be engaged with each other in the form of a lattice so that the plurality of Velcro patterns 2610 can be connected to each other without being separated.

For example, the gaps between the plurality of Velcro patterns 2610 of the flexible portion 2600 may be maximally increased or decreased depending on the compressed state 2601 or the tensioned state 2602. Even when the interval between the plurality of Velcro patterns 2610 of the flexible portion is maximally increased or decreased, the plurality of support pieces 2620 and slit patterns 2630 may be arranged so as to be engaged with each other, and thus the plurality of Velcro patterns 2610 may be connected to each other without being separated.

Figure 27:
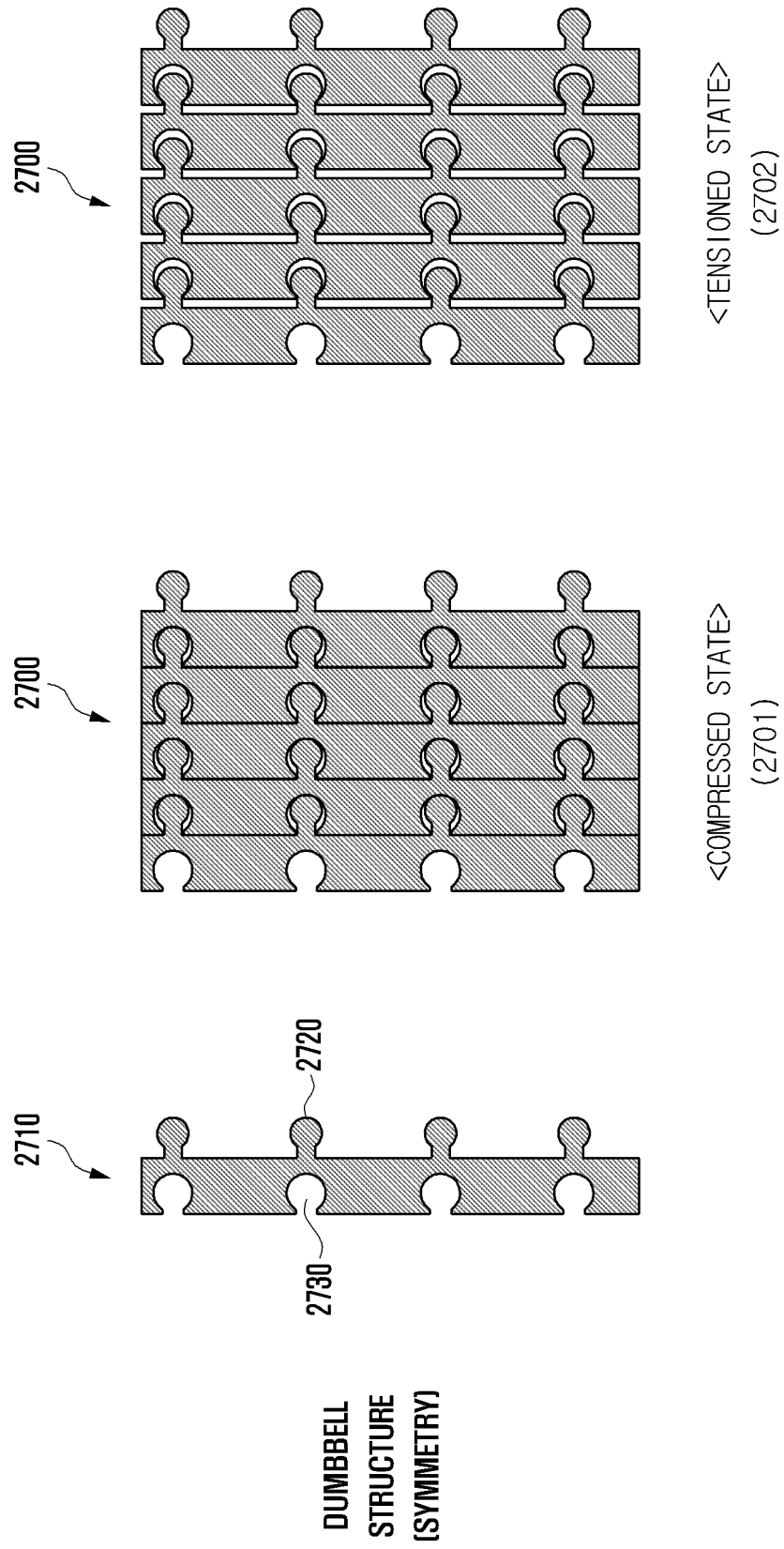
FIG. 27 is a view illustrating a flexible portion of a flexible plate according to certain embodiments of the disclosure.

FIG. 27 is a view illustrating a flexible portion of a flexible plate according to certain embodiments of the disclosure.

Referring to FIG. 27, in the folded state (e.g., the closed state) of an electronic device (e.g., the electronic device 100 in FIG. 2), the flexible portion 2700 (e.g., the flexible portion 703 in FIG. 7 or the flexible portion 903 in FIG. 9) may be in a compressed state 2701. In the unfolded state (e.g., the opened state) of the electronic device (e.g., the electronic device 100 in FIG. 2), the flexible portion 2700 (e.g., the flexible portion 703 in FIG. 7 or the flexible portion 903 in FIG. 9) may be in a tensioned state 2702.

In a certain embodiment, the flexible portion 2700 (e.g., the flexible portion 703 in FIG. 7 or the flexible portion 903 in FIG. 9) may include a plurality of Velcro patterns 2710. For example, the plurality of Velcro patterns 2710 may include a plurality of support pieces 2720 and a plurality of slit patterns 2730 provided in the plurality of Velcro patterns 2710. As an example, the plurality of support pieces 2720 may be provided in the form of embossed dumbbells, and the plurality of slit patterns 2730 may be provided in the form of engraved dumbbells. As an example, a plurality of adjacent support pieces 2720 may be arranged on the same line in the x-axis direction (e.g., the horizontal direction). The adjacent support pieces 2720 are inserted into the slit patterns 2730 and arranged so as to be engaged with each other in the form of a lattice so that the plurality of Velcro patterns 2710 can be connected to each other without being separated.

As an example, the gaps between the plurality of Velcro patterns 2710 of the flexible portion 2700 may be maximally increased or decreased depending on the compressed state 2701 or the tensioned state 2702. Even when the interval between the plurality of Velcro patterns 2710 of the flexible portion is maximally increased or decreased, the plurality of support pieces 2720 and slit patterns 2730 may be arranged so as to be engaged with each other, and thus the plurality of Velcro patterns 2710 may be connected to each other without being separated.

Figure 28:
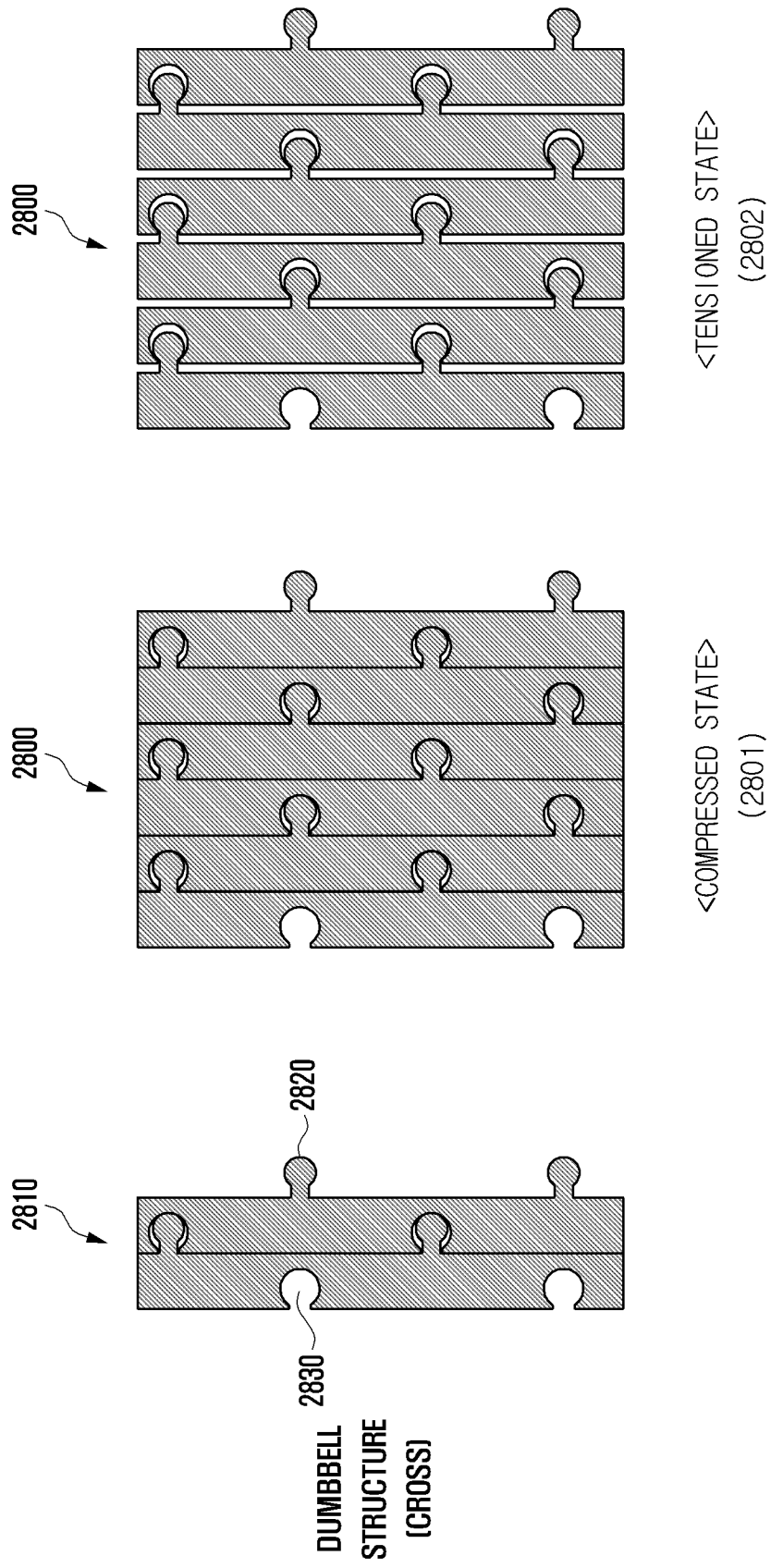
FIG. 28 is a view illustrating a flexible portion of a flexible plate according to certain embodiments of the disclosure.

FIG. 28 is a view illustrating a flexible portion of a flexible plate according to certain embodiments of the disclosure.

Referring to FIG. 28, in the folded state (e.g., the closed state) of an electronic device (e.g., the electronic device 100 in FIG. 2), the flexible portion 2800 (e.g., the flexible portion 703 in FIG. 7 or the flexible portion 903 in FIG. 9) may be in a compressed state 2801. In the unfolded state (e.g., the opened state) of the electronic device (e.g., the electronic device 100 in FIG. 2), the flexible portion 2800 (e.g., the flexible portion 703 in FIG. 7 or the flexible portion 903 in FIG. 9) may be in a tensioned state 2802.

In a certain embodiment, the flexible portion 2800 (e.g., the flexible portion 703 in FIG. 7 or the flexible portion 903 in FIG. 9) may include a plurality of Velcro patterns 2810. As an example, the plurality of Velcro patterns 2810 may include a plurality of support pieces 2820 and a plurality of slit patterns 2830 provided in the plurality of Velcro patterns 2810. As an example, the plurality of support pieces 2820 may be provided in the form of embossed dumbbells, and the plurality of slit patterns 2830 may be provided in the form of engraved dumbbells. As example, a plurality of adjacent support pieces 2820 may be located on different lines in the x-axis direction (e.g., the horizontal direction) and may be arranged in a zigzag form. The adjacent support pieces 2820 are inserted into the slit patterns 2830 and arranged so as to be engaged with each other in the form of a lattice so that the plurality of Velcro patterns 2810 can be connected to each other without being separated.

As an example, the gaps between the plurality of Velcro patterns 2810 of the flexible portion 2800 may be maximally increased or decreased depending on the compressed state 2801 or the tensioned state 2802. Even when the interval between the plurality of Velcro patterns 2810 of the flexible portion is maximally increased or decreased, the plurality of support pieces 2820 and slit patterns 2830 may be arranged so as to be engaged with each other, and thus the plurality of Velcro patterns 2810 may be connected to each other without being separated.

Figure 29:
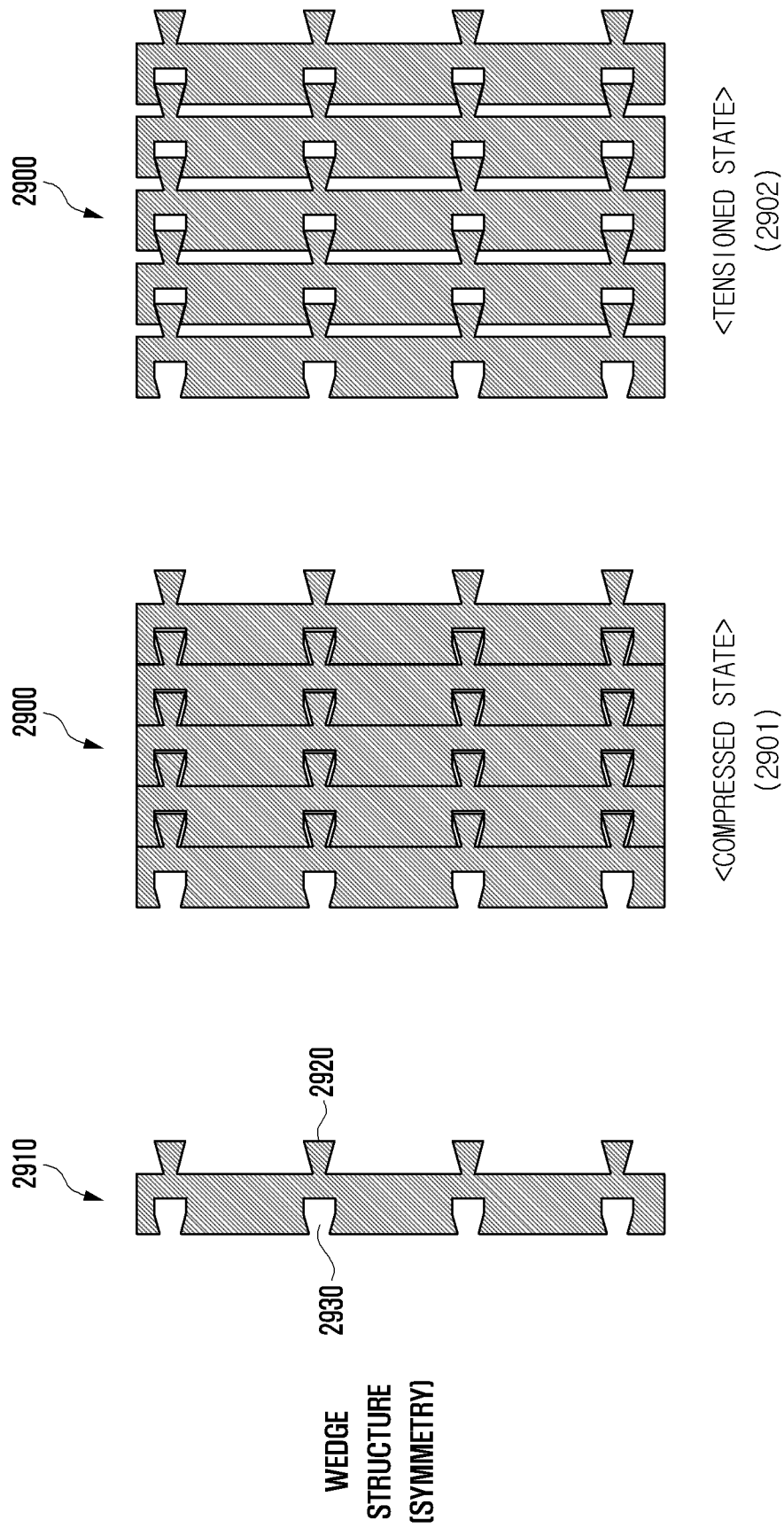
FIG. 29 is a view illustrating a flexible portion of a flexible plate according to certain embodiments of the disclosure.

FIG. 29 is a view illustrating a flexible portion of a flexible plate according to certain embodiments of the disclosure.

Referring to FIG. 29, in the folded state (e.g., the closed state) of an electronic device (e.g., the electronic device 100 in FIG. 2), the flexible portion 2900 (e.g., the flexible portion 703 in FIG. 7 or the flexible portion 903 in FIG. 9) may be in a compressed state 2901. In the unfolded state (e.g., the opened state) of the electronic device (e.g., the electronic device 100 in FIG. 2), the flexible portion 2900 (e.g., the flexible portion 703 in FIG. 7 or the flexible portion 903 in FIG. 9) may be in a tensioned state 2902.

In a certain embodiment, the flexible portion 2900 (e.g., the flexible portion 703 in FIG. 7 or the flexible portion 903 in FIG. 9) may include a plurality of Velcro patterns 2910. As an example, the plurality of Velcro patterns 2910 may include a plurality of support pieces 2920 and a plurality of slit patterns 2930 provided in the plurality of Velcro patterns 2910. As an example, the plurality of support pieces 2920 may be provided in the form of embossed wedges, and the plurality of slit patterns 2930 may be provided in the form of engraved wedges. As an example, a plurality of adjacent support pieces 2920 may be arranged on the same line in the x-axis direction (e.g., the horizontal direction). The adjacent support pieces 2920 are inserted into the slit patterns 2930 and arranged so as to be engaged with each other in the form of a lattice so that the plurality of Velcro patterns 2910 can be connected to each other without being separated.

As an example, the gaps between the plurality of Velcro patterns 2910 of the flexible portion 2900 may be maximally increased or decreased depending on the compressed state 2901 or the tensioned state 2902. Even when the interval between the plurality of Velcro patterns 2910 of the flexible portion is maximally increased or decreased, the plurality of support pieces 2920 and slit patterns 2930 may be arranged so as to be engaged with each other, and thus the plurality of Velcro patterns 2910 may be connected to each other without being separated.

Figure 30:
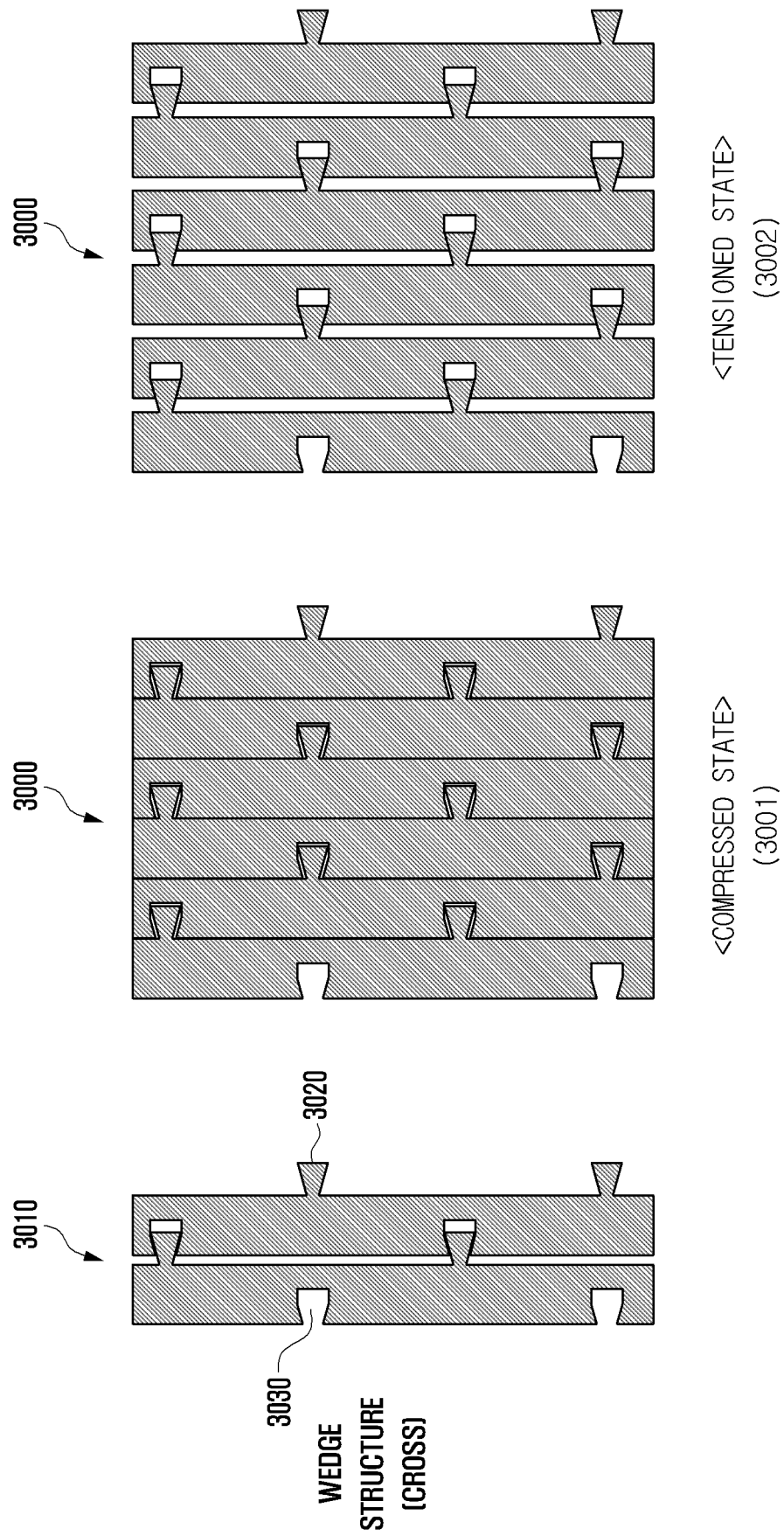
FIG. 30 is a view illustrating a flexible portion of a flexible plate according to certain embodiments of the disclosure.

FIG. 30 is a view illustrating a flexible portion of a flexible plate according to certain embodiments of the disclosure.

Referring to FIG. 30, in the folded state (e.g., the closed state) of an electronic device (e.g., the electronic device 100 in FIG. 2), the flexible portion 3000 (e.g., the flexible portion 703 in FIG. 7 or the flexible portion 903 in FIG. 9) may be in a compressed state 3001. In the unfolded state (e.g., the opened state) of the electronic device (e.g., the electronic device 100 in FIG. 2), the flexible portion 3000 (e.g., the flexible portion 703 in FIG. 7 or the flexible portion 903 in FIG. 9) may be in a tensioned state 3002.

In a certain embodiment, the flexible portion 3000 (e.g., the flexible portion 703 in FIG. 7 or the flexible portion 903 in FIG. 9) may include a plurality of Velcro patterns 3010. As an example, the plurality of Velcro patterns 3010 may include a plurality of support pieces 3020 and a plurality of slit patterns 3030 provided in the plurality of Velcro patterns 3010. As an example, the plurality of support pieces 3020 may be provided in the form of embossed wedges, and the plurality of slit patterns 3030 may be provided in the form of engraved wedges. As example, a plurality of adjacent support pieces 3020 may be located on different lines in the x-axis direction (e.g., the horizontal direction) and may be arranged in a zigzag form. The adjacent support pieces 3020 are inserted into the slit patterns 3030 and arranged so as to be engaged with each other in the form of a lattice so that the plurality of Velcro patterns 3010 can be connected to each other without being separated.

As an example, the gaps between the plurality of Velcro patterns 3010 of the flexible portion 3000 may be maximally increased or decreased depending on the compressed state 3001 or the tensioned state 3002. Even when the interval between the plurality of Velcro patterns 3010 of the flexible portion is maximally increased or decreased, the plurality of support pieces 3020 and slit patterns 3030 may be arranged so as to be engaged with each other, and thus the plurality of Velcro patterns 3010 may be connected to each other without being separated.

Figure 31:
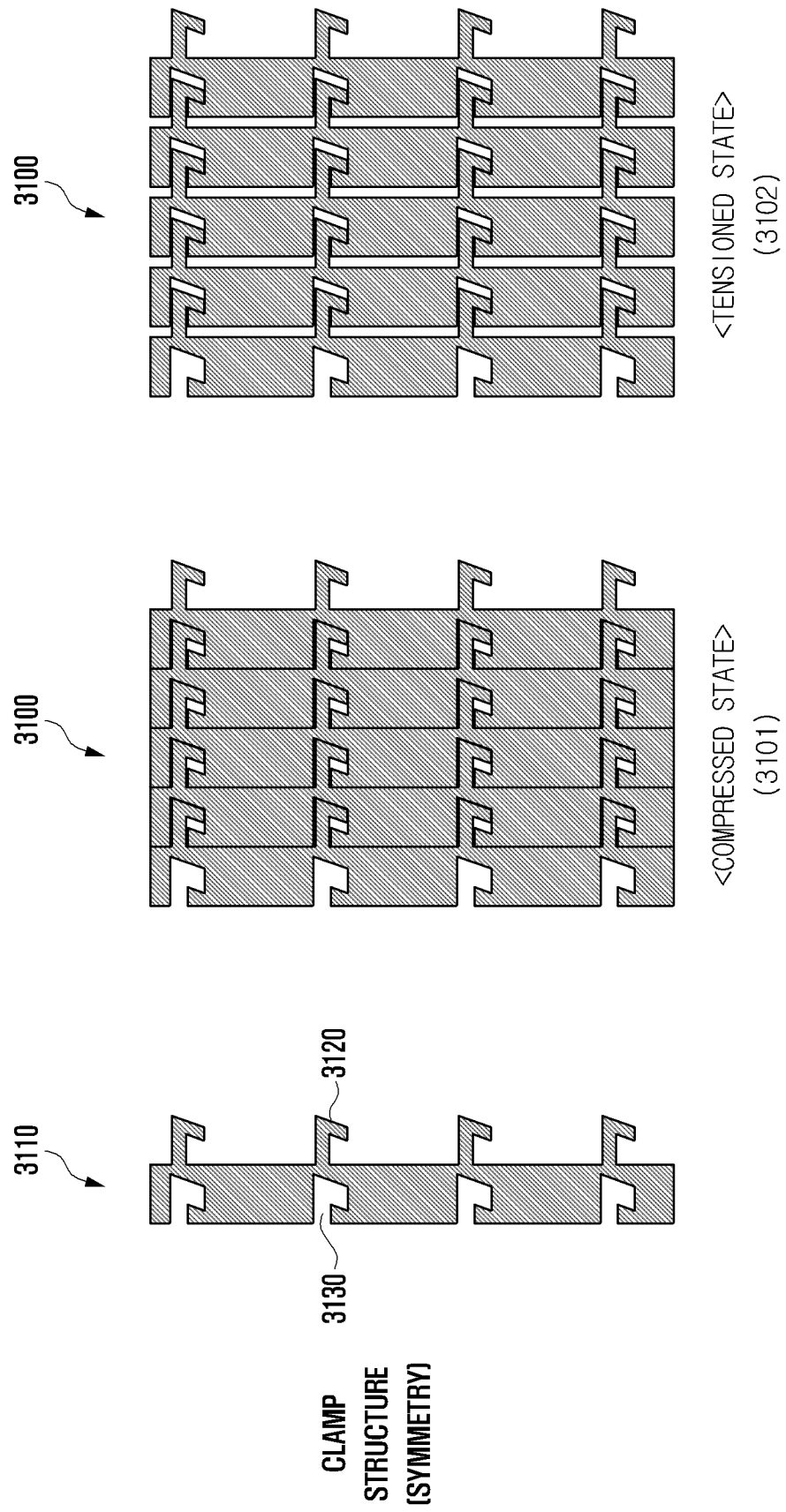
FIG. 31 is a view illustrating a flexible portion of a flexible plate according to certain embodiments of the disclosure.

FIG. 31 is a view illustrating a flexible portion of a flexible plate according to certain embodiments of the disclosure.

Referring to FIG. 31, in the folded state (e.g., the closed state) of an electronic device (e.g., the electronic device 100 in FIG. 2), the flexible portion 3100 (e.g., the flexible portion 703 in FIG. 7 or the flexible portion 903 in FIG. 9) may be in a compressed state 3101. In the unfolded state (e.g., the opened state) of the electronic device (e.g., the electronic device 100 in FIG. 2), the flexible portion 3100 (e.g., the flexible portion 703 in FIG. 7 or the flexible portion 903 in FIG. 9) may be in a tensioned state 3102.

In a certain embodiment, the flexible portion 3100 (e.g., the flexible portion 703 in FIG. 7 or the flexible portion 903 in FIG. 9) may include a plurality of Velcro patterns 3110. As an example, the plurality of Velcro patterns 3110 may include a plurality of support pieces 3120 and a plurality of slit patterns 3130 provided in the plurality of Velcro patterns 3110. As an example, the plurality of support pieces 3120 may be provided in the form of embossed clamps, and the plurality of slit patterns 3130 may be provided in the form of engraved clamps. As an example, a plurality of adjacent support pieces 3120 may be arranged on the same line in the x-axis direction (e.g., the horizontal direction). The adjacent support pieces 3120 are inserted into the slit patterns 3130 and arranged so as to be engaged with each other in the form of a lattice so that the plurality of Velcro patterns 3110 can be connected to each other without being separated.

As an example, the gaps between the plurality of Velcro patterns 3110 of the flexible portion 3100 may be maximally increased or decreased depending on the compressed state 3101 or the tensioned state 3102. Even when the interval between the plurality of Velcro patterns 3110 of the flexible portion is maximally increased or decreased, the plurality of support pieces 3120 and slit patterns 3130 may be arranged so as to be engaged with each other, and thus the plurality of Velcro patterns 3110 may be connected to each other without being separated.

Figure 32:
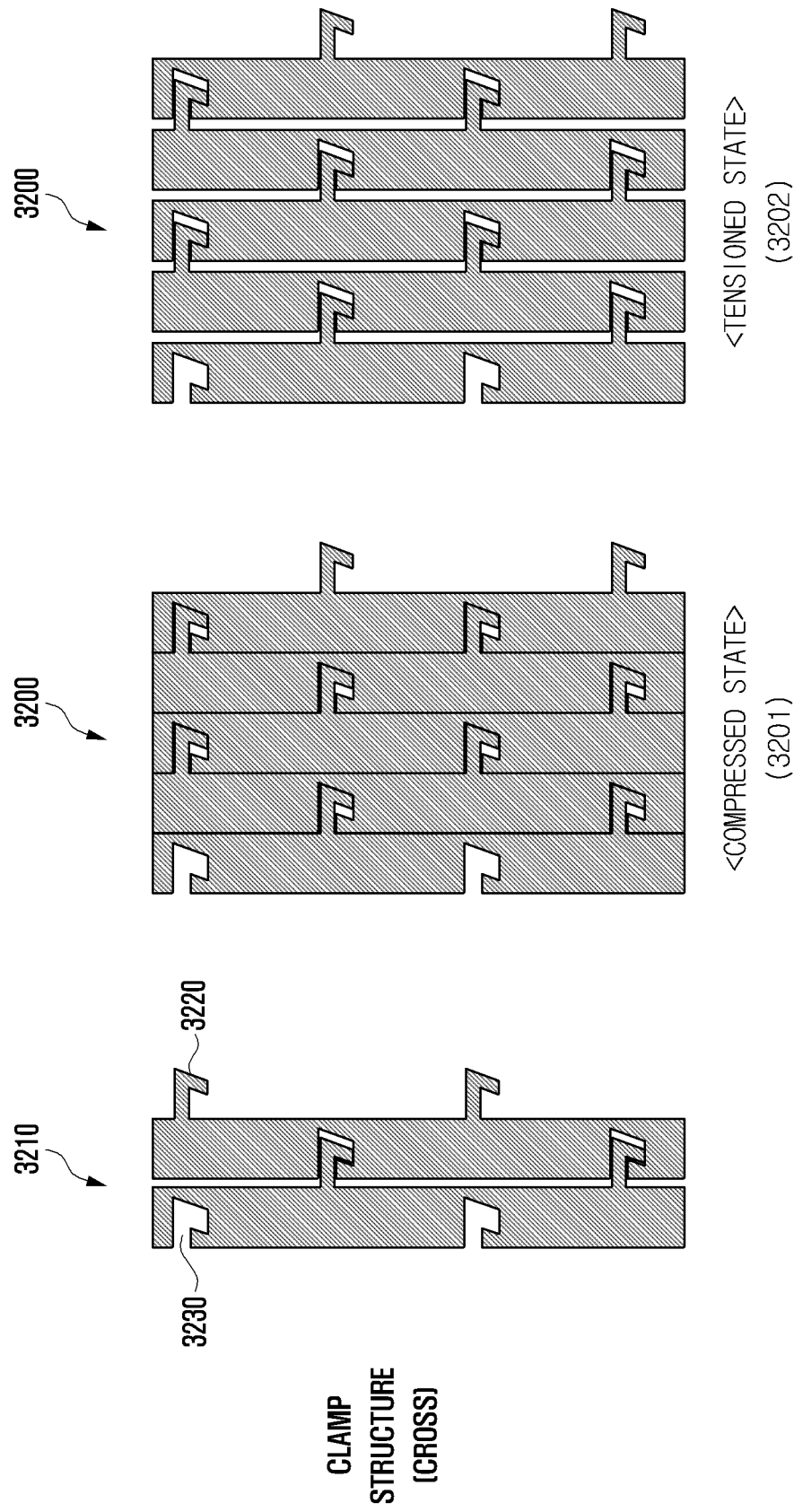
FIG. 32 is a view illustrating a flexible portion of a flexible plate according to certain embodiments of the disclosure.

FIG. 32 is a view illustrating a flexible portion of a flexible plate according to certain embodiments of the disclosure.

Referring to FIG. 32, in the folded state (e.g., the closed state) of an electronic device (e.g., the electronic device 100 in FIG. 2), the flexible portion 3200 (e.g., the flexible portion 703 in FIG. 7 or the flexible portion 903 in FIG. 9) may be in a compressed state 3201. In the unfolded state (e.g., the opened state) of the electronic device (e.g., the electronic device 100 in FIG. 2), the flexible portion 3200 (e.g., the flexible portion 703 in FIG. 7 or the flexible portion 903 in FIG. 9) may be in a tensioned state 3202.

In a certain embodiment, the flexible portion 3200 (e.g., the flexible portion 703 in FIG. 7 or the flexible portion 903 in FIG. 9) may include a plurality of Velcro patterns 3210. As an example, the plurality of Velcro patterns 3210 may include a plurality of support pieces 3220 and a plurality of slit patterns 3230 provided in the plurality of Velcro patterns 3210. As an example, the plurality of support pieces 3220 may be provided in the form of embossed wedges, and the plurality of slit patterns 3230 may be provided in the form of engraved wedges. As example, a plurality of adjacent support pieces 3220 may be located on different lines in the x-axis direction (e.g., the horizontal direction) and may be arranged in a zigzag form. The adjacent support pieces 3220 are inserted into the slit patterns 3230 and arranged so as to be engaged with each other in the form of a lattice so that the plurality of Velcro patterns 3210 can be connected to each other without being separated.

As an example, the gaps between the plurality of Velcro patterns 3210 of the flexible portion 3200 may be maximally increased or decreased depending on the compressed state 3201 or the tensioned state 3202. Even when the interval between the plurality of Velcro patterns 3210 of the flexible portion 3200 is maximally increased or decreased, the plurality of support pieces 3220 and the slit patterns 3230 may be arranged so as to be engaged with each other, and thus the plurality of Velcro patterns 3210 may be connected to each other without being separated.

Figure 33:
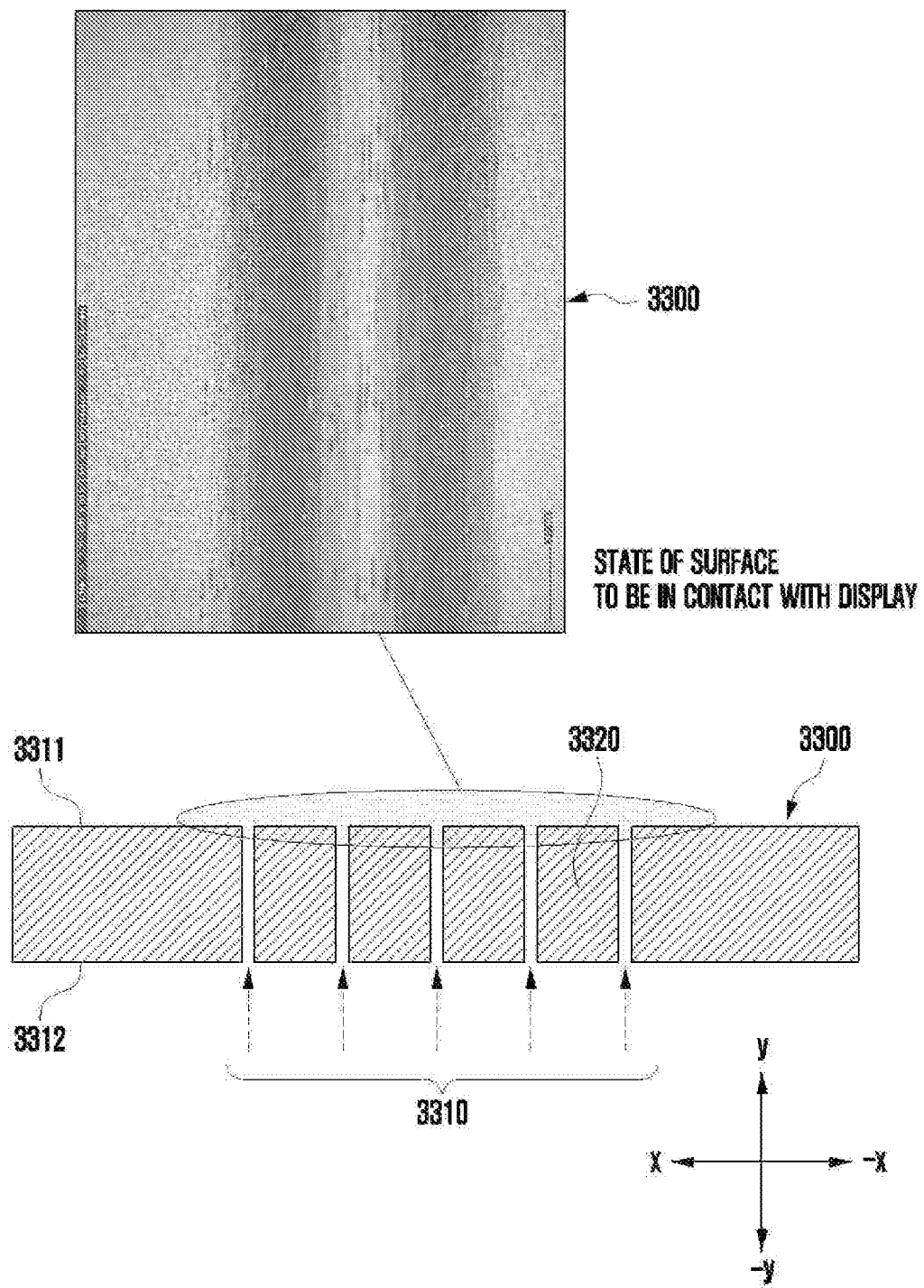
FIG. 33 is a view illustrating a flexible portion of a flexible plate according to certain embodiments of the disclosure.

FIG. 33 is a view illustrating a flexible portion of a flexible plate according to certain embodiments of the disclosure.

Referring to FIG. 33, the flexible plate (e.g., the conductive plate 700 in FIG. 7) according to certain embodiments of the disclosure may include a first planar portion (e.g., the first planar portion 701 in FIG. 7) supporting a first area (e.g., the first area h1 in FIG. 4B) of a display (e.g., the display 400 in FIG. 4B), a second planar portion (e.g., the second planar portion 702 in FIG. 7) supporting a second area (e.g., the second area h2 in FIG. 4B) of the display (e.g., the display 400 in FIG. 4B), and a flexible portion 3300 (e.g., the flexible portion 703 in FIG. 7) supporting a third area (e.g., the third area h3 in FIG. 4B) of the display (e.g., the display 400 in FIG. 4B).

In a certain embodiment, the flexible portion 3300 of the flexible plate (e.g., the conductive plate 700 in FIG. 7) may include a plurality of slits 3310 (e.g., the slits 730 in FIG. 7) and a plurality of support pieces 3320 (e.g., a plurality of support pieces 740 in FIG. 7) provided at regular or irregular intervals. As an example, the slits 3310 may be configured in a bar shape.

In a certain embodiment, in the flexible portion 3300 of the flexible plate (e.g., the conductive plate 700), a plurality of support pieces 3320 having a predetermined width may be arranged so as to be spaced apart from each other via the slits 3310 having a predetermined interval. The first planar portion (e.g., the first planar portion 701 in FIG. 7) of the flexible plate (e.g., the conductive plate 700 in FIG. 7) may include a first support portion (e.g., the first support portion 701 in FIG. 7) without the slits 3310, and the second planar portion (e.g., the second planar portion 702 in FIG. 7) may include the second support portion (e.g., the second support portion 720 in FIG. 7) without the slits 3310.

According to an embodiment, the plurality of slits 3310 in the flexible portion 3300 may be provided in the form of being opened at the upper side (e.g., y-axis direction) and the lower side (e.g., −y-axis direction) with respect to the folding axis (e.g., the axis A).

According to an embodiment, the plurality of slits 3310 of the flexible portion 3300 may be provided to penetrate the flexible portion 3300 from the top surface 3311 to the bottom surface 3312. The plurality of slits 3310 of the flexible portion 3300 may have a constant width from the top surface 3311 to the bottom surface 3312.

According to an embodiment, the plurality of support pieces 3320 may be separated from each other at a predetermined interval by the plurality of slits 3310. The plurality of support pieces 3320 separated by the plurality of slits 3310 may remain connected to each other via a conductive elastic member (e.g., the conductive elastic member 460 in FIG. 4B). In addition, the flexibility of the flexible portion 3300 may be provided via the plurality of support pieces 3320 connected to each other via a conductive elastic member (e.g., the conductive elastic member 460 in FIG. 4B).

In a certain embodiment, since it is possible to reduce the number of the plurality of slits 3310 in the flexible portion 3300 from n to ½n and to reduce the width of the plurality of slits 3310, it is possible to improve the surface quality in the portion in which the flexible portion 3300 and a display (e.g., the display 400 in FIG. 4B) are in contact with each other.

Figure 34:
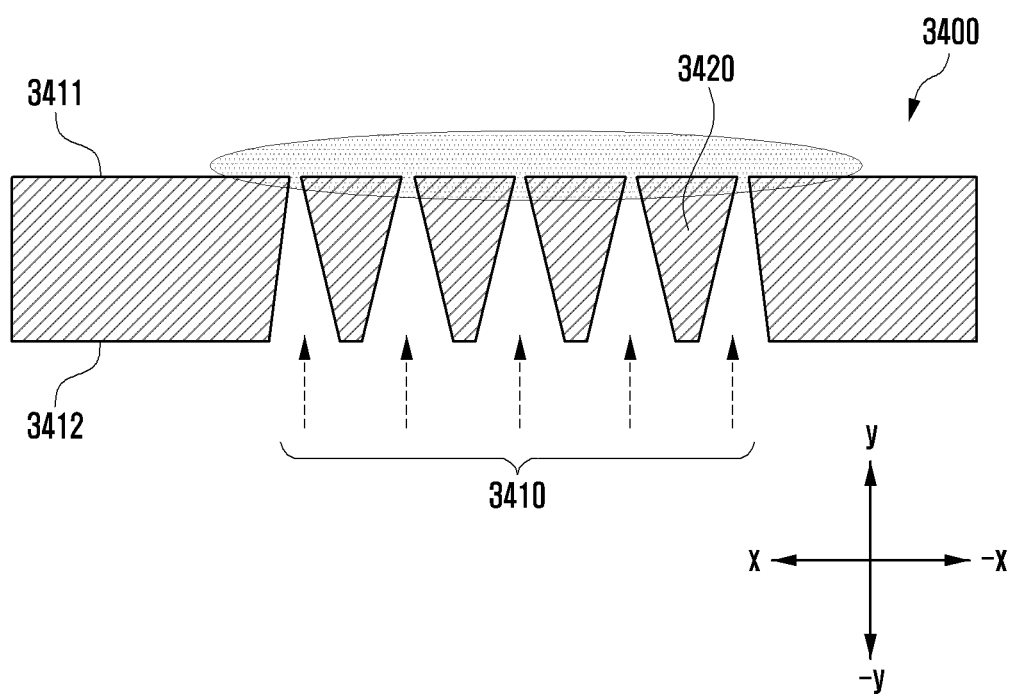
FIG. 34 is a view illustrating a flexible portion of a flexible plate according to certain embodiments of the disclosure.

FIG. 34 is a view illustrating a flexible portion of a flexible plate according to certain embodiments of the disclosure.

Referring to FIG. 34, the flexible plate (e.g., the conductive plate 700 in FIG. 7) according to certain embodiments of the disclosure may include a first planar portion (e.g., the first planar portion 701 in FIG. 7) supporting a first area (e.g., the first area h1 in FIG. 4B) of a display (e.g., the display 400 in FIG. 4B), a second planar portion (e.g., the second planar portion 702 in FIG. 7) supporting a second area (e.g., the second area h2 in FIG. 4B) of the display (e.g., the display 400 in FIG. 4B), and a flexible portion 3400 (e.g., the flexible portion 703 in FIG. 7) supporting a third area (e.g., the third area h3 in FIG. 4B) of the display (e.g., the display 400 in FIG. 4B).

In a certain embodiment, the flexible portion 3400 of the flexible plate (e.g., the conductive plate 700 in FIG. 7) may include a plurality of slits 3410 (e.g., the slits 730 in FIG. 7) and a plurality of support pieces 3420 (e.g., a plurality of support pieces 740 in FIG. 7) provided at regular or irregular intervals. As an example, the slits 3410 may be configured in a bar shape.

In a certain embodiment, in the flexible portion 3400 of the flexible plate (e.g., the conductive plate 700 in FIG. 7), a plurality of support pieces 3420 having a predetermined width may be arranged so as to be spaced apart from each other via the slits 3410 having a predetermined interval. The first planar portion (e.g., the first planar portion 701 in FIG. 7) of the flexible plate (e.g., the conductive plate 700 in FIG. 7) may include a first support portion (e.g., the first support portion 710 in FIG. 7) without the slits 3410, and the second planar portion (e.g., the second planar portion 702 in FIG. 7) may include the second portion (e.g., the second support portion 720 in FIG. 7) without the slits 3410.

According to an embodiment, the plurality of slits 3410 in the flexible portion 3400 may be provided in the form of being opened at the upper side (e.g., y-axis direction) and the lower side (e.g., -y-axis direction) with respect to the folding axis (e.g., the axis A in FIG. 7).

According to an embodiment, the plurality of slits 3410 of the flexible portion 3400 may be provided to penetrate the flexible portion 3300 from the top surface 3411 to the bottom surface 3412. The plurality of slits 3410 in the flexible portion 3400 may be increased in width from the top surface 3411 toward the bottom surface 3412 of the flexible portion.

According to an embodiment, the plurality of support pieces 3420 may be separated from each other at a predetermined interval by the plurality of slits 3410. The plurality of support pieces 3420 separated by the plurality of slits 3410 may remain connected to each other via a conductive elastic member (e.g., the conductive elastic member 460 in FIG. 4B). In addition, the flexibility of the flexible portion 3400 may be provided via the plurality of support pieces 3420 connected to each other via a conductive elastic member (e.g., the conductive elastic member 460 in FIG. 4B). Since the plurality of slits 3410 in the flexible portion 3400 may be increased in width from the top surface 3411 to the bottom surface 3412, the flexibility of the flexible portion 3400 can be further improved.

In a certain embodiment, since the number of the plurality of slits 3310 in the flexible portion 3400 is decreased from n to ½n and the plurality of slits 3410 of the flexible portion 3400 are decreased in width from the bottom surface 3412 toward the top surface 3411, it is possible to improve the surface quality in the portion in which the flexible portion 3400 and a display (e.g., the display 400 in FIG. 4B) are in contact with each other.

Figure 35:
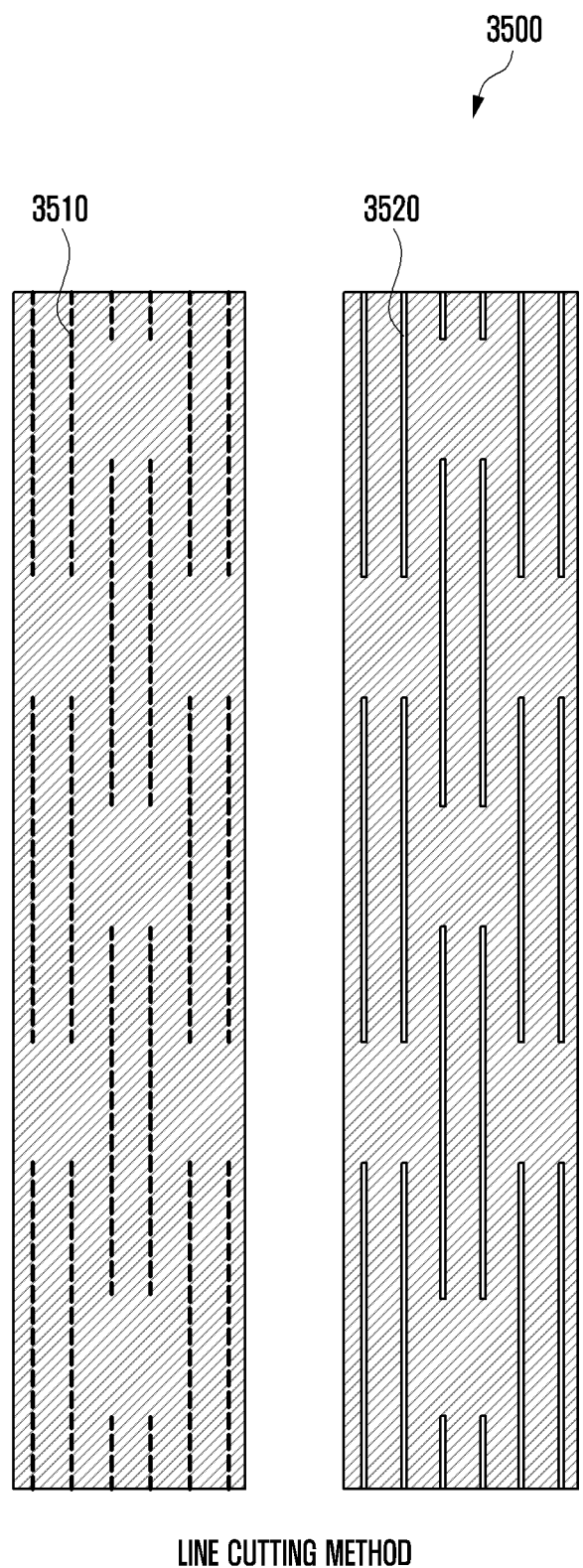
FIG. 35 is a view illustrating a plurality of slits formed by a line cutting method.

FIG. 35 is a view illustrating a plurality of slits formed by a line cutting method.

Referring to FIG. 35, the flexible portion 3500 of the flexible plate (e.g., the conductive plate 700 in FIG. 7) may include a plurality of slits 3520.

In a certain embodiment, a plurality of slits 3520 may be provided by marking portions 3510 to be cut in broken line shapes using a laser and removing the portions 3510 to be cut by a line cutting method. As an example, the slits 3520 may be provided to be arranged in units of two slits.

Figure 36:
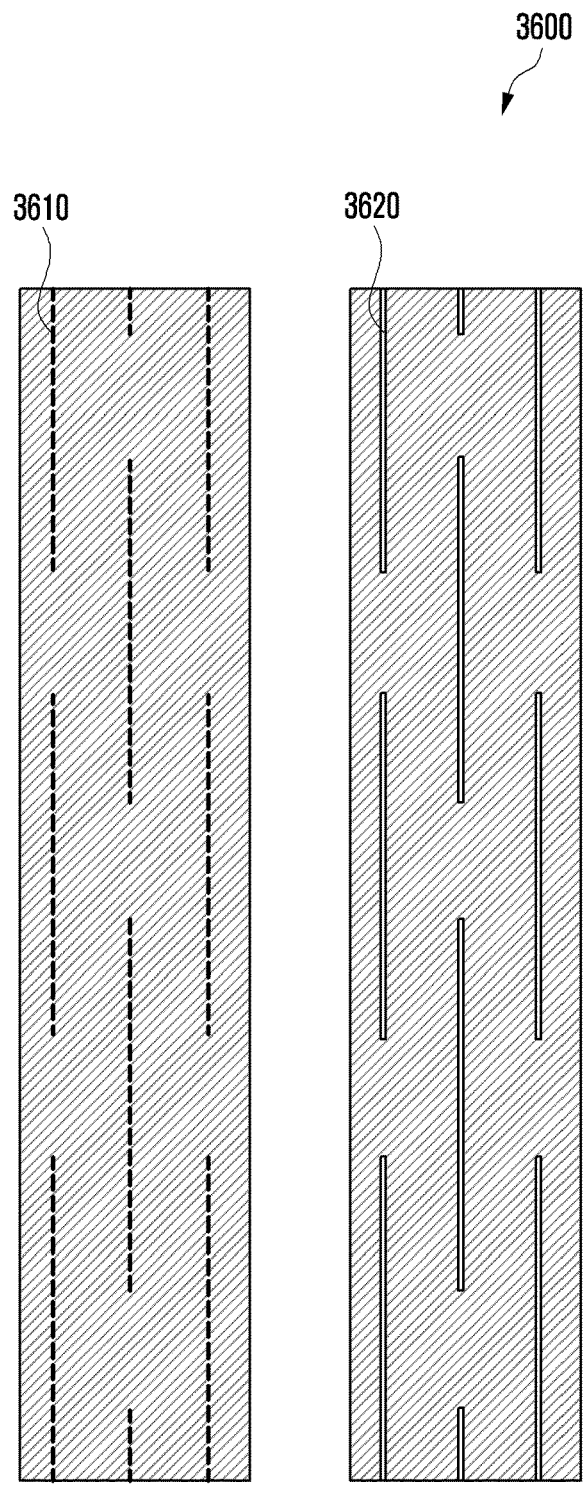
FIG. 36 is a view illustrating a plurality of slits formed by a line cutting method.

FIG. 36 is a view illustrating a plurality of slits formed by a line cutting method.

Referring to FIG. 36, the flexible portion 3600 of the flexible plate (e.g., the conductive plate 700 in FIG. 7) may include a plurality of slits 3620.

In a certain embodiment, a plurality of slits 3620 may be provided by marking portions 3610 to be cut in broken line shapes using a laser and removing the portions 3610 to be cut by a line cutting method. As an example, the slits 3520 may be provided to be arranged in units of one slit.

Figure 37:
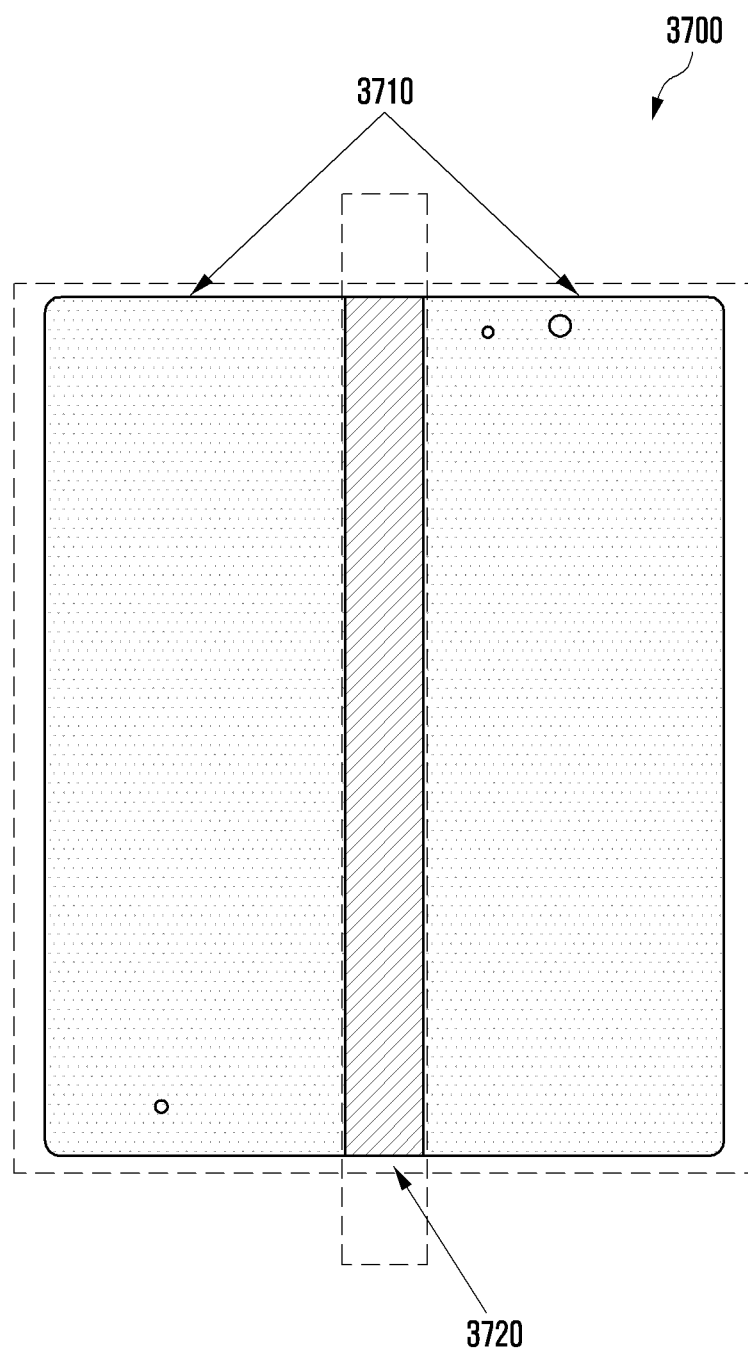
FIG. 37 is a view illustrating a flexible plate according to certain embodiments of the disclosure.

FIG. 37 is a view illustrating a flexible plate according to certain embodiments of the disclosure.

Referring to FIG. 37, a flexible plate 3700 (e.g., the conductive plate 700 in FIG. 7 or the flexible display 3800 in FIG. 38) according to certain embodiments of the disclosure may include planar portions 3710 (e.g., the first planar portion 701 and the second planar portion 702 in FIG. 7) supporting a first area (e.g., the first area h1 and the second area h2 in FIG. 4B) of a display (e.g., the display 400 in FIG. 4B), and a flexible portion 3720 (e.g., the flexible portion 703 in FIG. 7) supporting a third area (e.g., the third area h3 in FIG. 4B) of the display (e.g., the display 400 in FIG. 4B).

Figure 38:
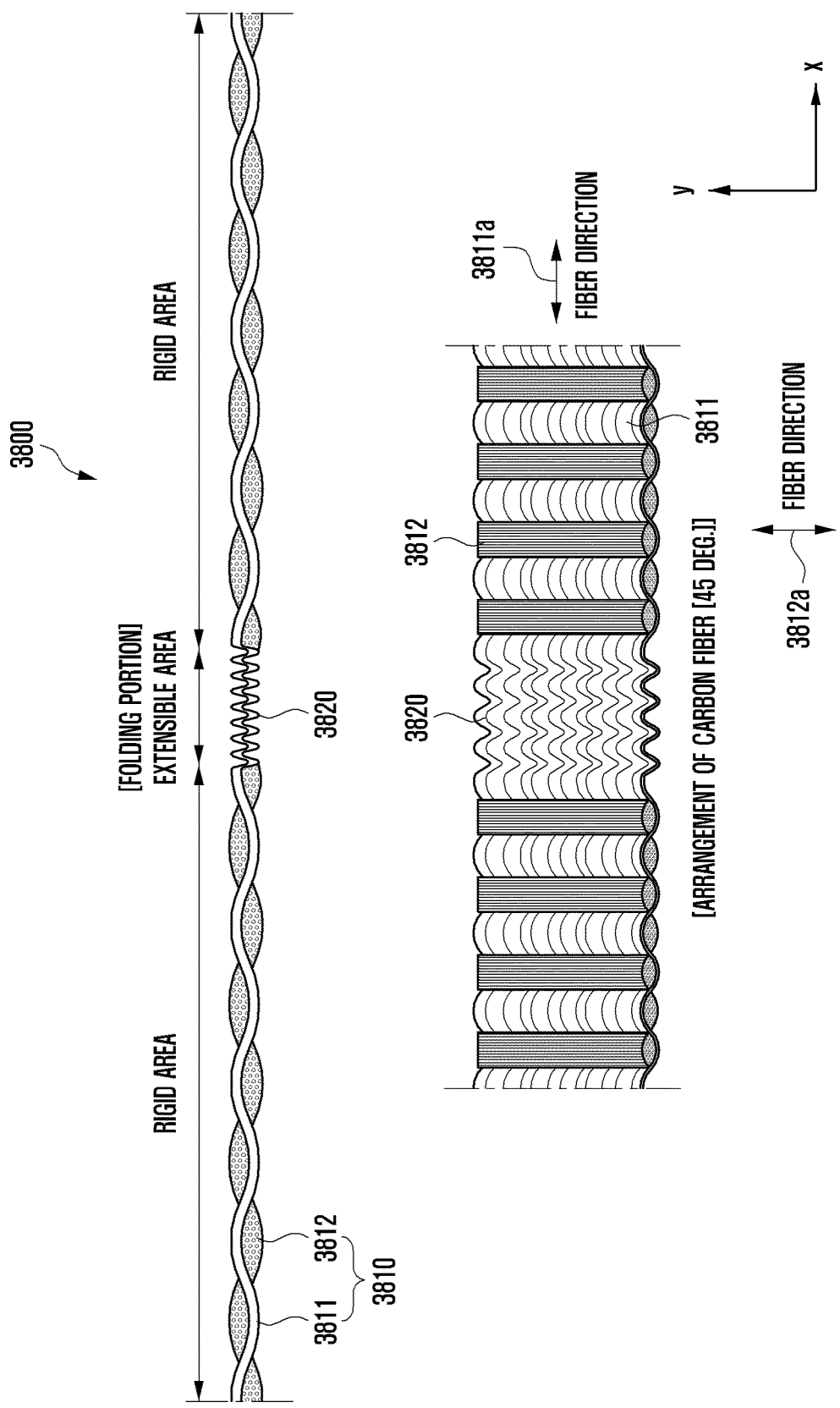
FIG. 38 is a view illustrating a flexible portion of the flexible plate illustrated in FIG. 37.

FIG. 38 is a view illustrating a flexible portion of the flexible plate illustrated in FIG. 37.

Referring to FIG. 38, In a certain embodiment, a flexible portion 3800 of a flexible plate (e.g., the conductive plate 700 in FIG. 7) may include planar portions 3810 (e.g., the first planar portion 701 and the second planar portion 702 in FIG. 7 or the planar portions 3710 in FIG. 37) supporting a first area (e.g., the first area h1 and the second area h2 in FIG. 4B) of a display (e.g., the display 400 in FIG. 4B), and a flexible portion 3820 (e.g., the flexible portion 703 in FIG. 7 or the flexible portion 3720 in FIG. 37) supporting a third area (e.g., the third area h3 in FIG. 4B) of the display (e.g., the display 400 in FIG. 4B).

In a certain embodiment, the planar portions 3810 are hard areas and may include a first member 3811 (e.g., first carbon fiber) and a second member 3812 (second carbon fiber). As an example, the first member 3811 (e.g., first carbon fiber) and the second member 3812 (second carbon fiber) may be twisted. As an example, the stretching directions of the first member 3811 (e.g., first carbon fiber) and the second member 3812 (second carbon fiber) may be different from each other. As an example, the stretching directions of the first member 3811 (e.g., first carbon fiber) and the second member 3812 (second carbon fiber) may be orthogonal to each other.

As an example, the fiber direction 3811a of the first members 3811 (e.g., first carbon fiber) of the planar portions 3810 may be the x-axis direction (e.g., the horizontal direction in FIG. 38). The fiber direction 3812a of the second members 3812 (second carbon fiber) of the planar portions 3810 may be the y-axis direction (e.g., the vertical direction in FIG. 38).

In a certain embodiment, the flexible portion 3820 may be arranged between the planar portions 3810. The flexible portion 3820 may include a third member (e.g., third carbon fiber). As an example, the third member (e.g., third carbon fiber) of the flexible portion 3820 may be provided to be connected to the first member 3811 (e.g., first carbon fiber) or the second member 3812 (second carbon fiber) of the planar portions 3810.

In a certain embodiment, the flexible portion 3820 may be provided in a form corrugated in a zig-zag manner to be stretchable and foldable.

As an example, the fiber direction of the third member (e.g., third carbon fiber) of the flexible portion 3820 may be a direction deviated by 45 degrees with respect the stretching direction of the first members 3811 (e.g., first carbon fiber) of the planar portions 3810.

As an example, the fiber direction of the third member (e.g., third carbon fiber) of the flexible portion 3820 may be a direction deviated by 45 degrees with respect the stretching direction of the second members 3812 (e.g., second carbon fiber) of the planar portions 3810.

Figure 39:
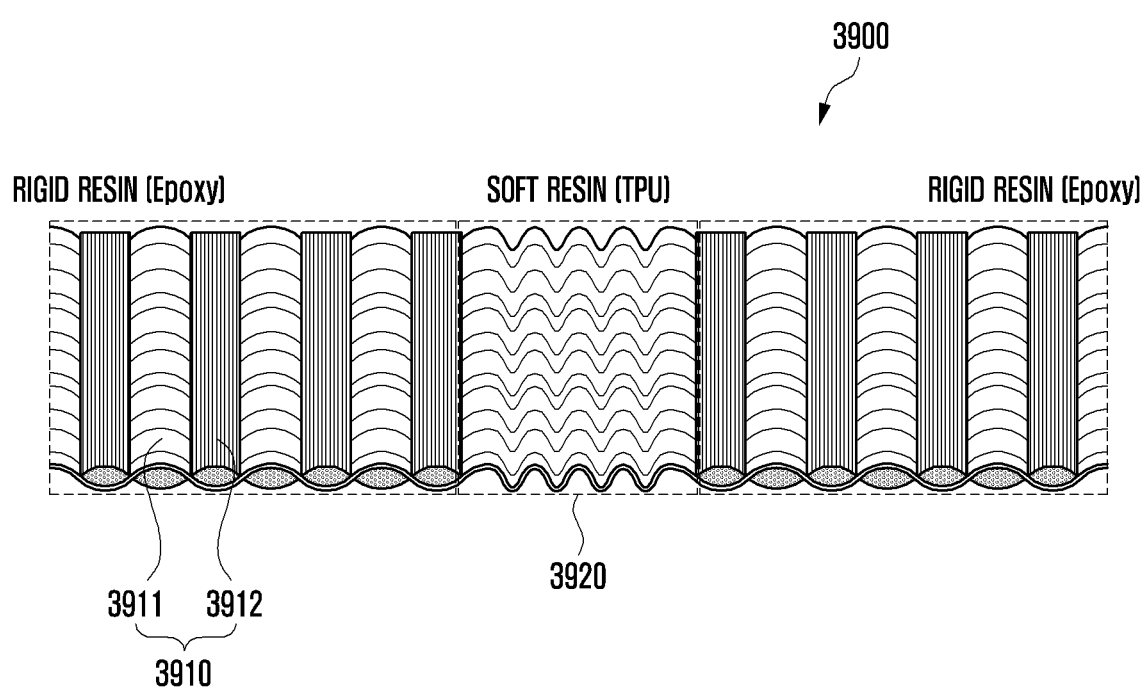
FIG. 39 is a view illustrating a flexible portion of the flexible plate illustrated in FIG. 37.

FIG. 39 is a view illustrating a flexible portion of the flexible plate illustrated in FIG. 37.

Referring to FIG. 39, In a certain embodiment, a flexible portion 3900 of a flexible plate (e.g., the conductive plate 700 in FIG. 7) may include planar portions 3910 (e.g., the first planar portion 701 and the second planar portion 702 in FIG. 7, the planar portions 3710 in FIG. 37, or the planar portions 3810 in FIG. 38) supporting a first area (e.g., the first area h1 and the second area h2 in FIG. 4B) of a display (e.g., the display 400 in FIG. 4B), and a flexible portion 3920 (e.g., the flexible portion 703 in FIG. 7, the flexible portion 3720 in FIG. 37, or the flexible portion 3820 in FIG. 38) supporting a third area (e.g., the third area h3 in FIG. 4B) of the display (e.g., the display 400 in FIG. 4B).

In a certain embodiment, the planar portions 3910 are hard areas and may include a first member 3911 (e.g., first resin) and a second member 3912 (second resin). As an example, the first member 3911 (e.g., first resin) and the second member 3912 (second resin) may be twisted. As an example, the first members 3911 of the planar portions 3910 may include a rigid resin. As an example, the stretching directions of the first member 3911 (e.g., first resin) and the second member 3912 (second resin) may be different from each other. As an example, the stretching directions of the first member 3911 (e.g., first resin) and the second member 3912 (second resin) may be orthogonal to each other.

For example, the first members 3911 (e.g., first resin) of the planar portions 3910 may be provided to extend in a horizontal direction (e.g., the x-axis direction). The second members 3912 (second resin) of the planar portions 3910 may be provided to extend in a vertical direction (e.g., the y-axis direction).

In a certain embodiment, the flexible portion 3920 may be arranged between the planar portions 3910. The flexible portion 3920 may include a third member (e.g., third resin). As an example, the third member (e.g., third resin) of the flexible portion 3920 may include a soft resin. As an example, the third member (e.g., third resin) of the flexible portion 3920 may be provided to be connected to the first member 3911 (e.g., first resin) or the second member 3912 (second resin) of the planar portions 3910.

In a certain embodiment, the flexible portion 3920 may be provided in a form corrugated in a zig-zag manner to be stretchable and foldable.

As an example, the third member (e.g., third resin) of the flexible portion 3920 may be stretched in a direction deviated by 45 degrees with respect the stretching direction of the first members 3911 (e.g., first resin) of the planar portions 3910.

As an example, the third member (e.g., third resin) of the flexible portion 3920 may be stretched in a direction deviated by 45 degrees with respect the stretching direction of the second members 3912 (e.g., second resin) of the planar portions 3910.

Figure 40:
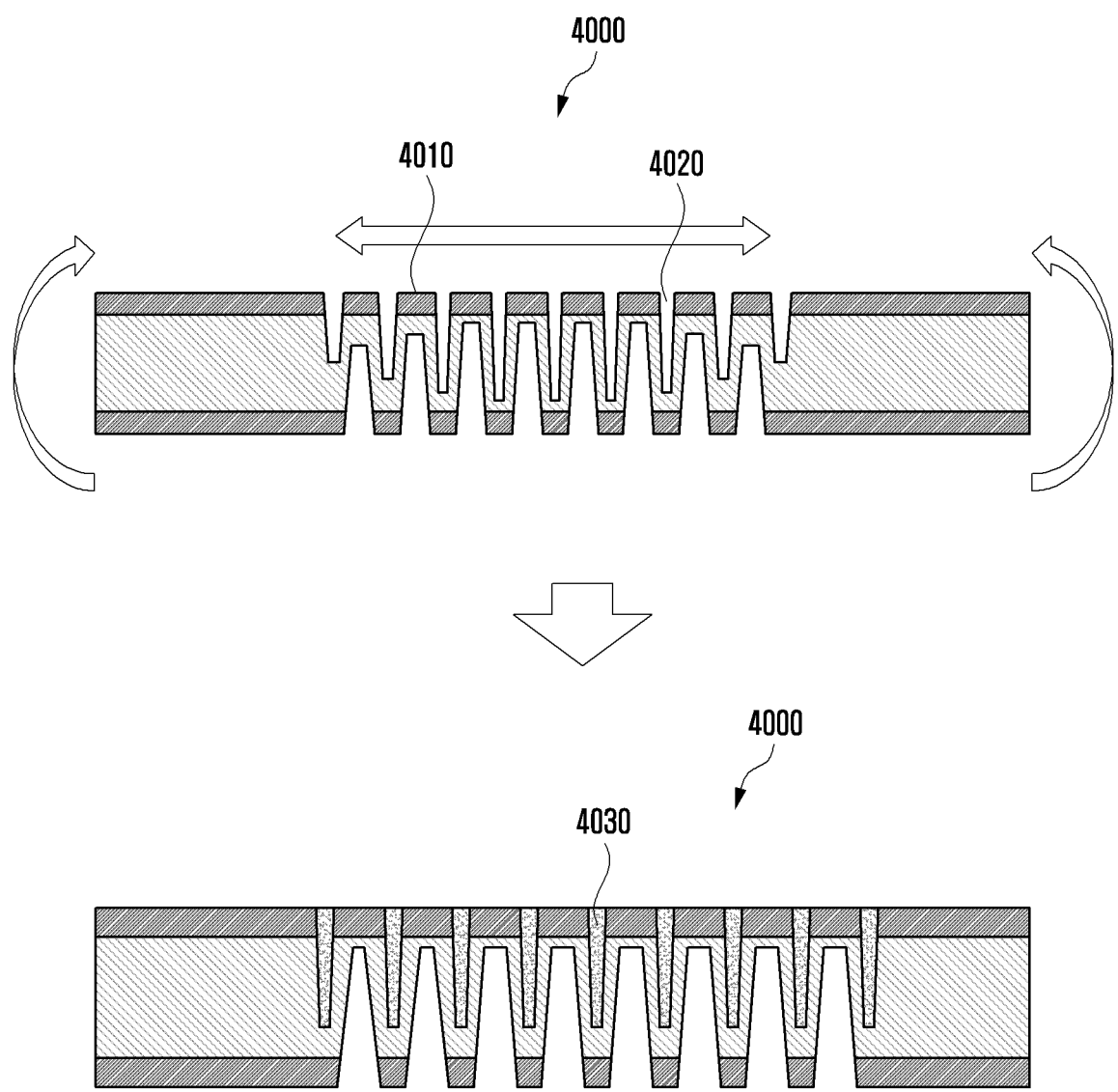
FIG. 40 is a view illustrating a flexible portion of the flexible plate illustrated in FIG. 37.

FIG. 40 is a view illustrating a flexible portion of the flexible plate illustrated in FIG. 37.

Referring to FIG. 40, In a certain embodiment, a flexible portion 4000 of a flexible plate (e.g., the conductive plate 700 in FIG. 7) may be provided in a form corrugated in a zig-zag manner to be stretchable and foldable.

As an example, the flexible portion 4000 may include a plurality of support pieces 4010, a plurality of grooves 4020 provided to have a predetermined depth between the plurality of support pieces 4010, and a resin layer 4030 provided to fill the plurality of grooves 4020 in the flexible portion 4000. The resin layer 4030 is provided to fill the plurality of grooves 4020 in the flexible portion 4000 to improve the surface quality of the flexible portion 4000.

An electronic device (e.g., the electronic device 100 in FIGS. 1 to 3, the electronic device 100 in FIG. 5A, the electronic device 1000 in FIG. 10, or the electronic device 1300 in FIG. 13) according to certain embodiments of the disclosure may include a hinge module (e.g., the hinge structure 164 in FIG. 3) arranged on a folding axis (e.g., "A" in FIG. 5A), a first housing (e.g., the first housing structure 110 in FIGS. 1 and 2 or the first housing structure 401 in FIG. 5A) connected to the hinge module 164, a second housing (e.g., the second housing structure 120 in FIGS. 1 and 2 or the second housing structure 402 in FIG. 5A) connected to the hinge module 164 to be foldable relative to the first housing structure 110 or 401, and a display (e.g., the display 400 of FIGS. 4A and 4B) arranged so as to be supported from at least a portion of the first housing 110 or 401 to at least a portion of the second housings 120 or 402 across the hinge module 164. The display 400 may include a display panel (e.g., the display panel 430 in FIGS. 4A and 4B), at least one polymer member (e.g., the polymer member 440 in FIGS. 4A and 4B) arranged on the rear surface of the display panel 430, and a flexible plate (e.g., the flexible plate 500 in FIG. 5A, the flexible plate 700 in FIG. 7, the flexible plate 900 in FIG. 9, the flexible plate 1100 in FIG. 11, the flexible plate 1200 in FIG. 12, the flexible plate 1310 in FIG. 13A, the flexible plate 1700 in FIG. 17, the flexible plate 1800 in FIG. 18, the flexible plate 1900 in FIG. 19, the flexible plate 2010 in FIG. 20, the flexible plate 2210 in FIG. 22, or the flexible plate 2310 in FIG. 23) arranged on the rear surface of the polymer member 440. The flexible plate 500, 700, 900, 1100, 1200, 1310, 1700, 1800, 1900, 2010, 2210, or 2310 may include a first planar portion (e.g., the first planar portion 501 in FIG. 5, the first planar portion 601 in FIG. 6, or the first planar portion 701 in FIG. 7) facing the first housing 110 or 401, a second planar portion 502, 602, or 702 facing the second housing 120 or 402, a flexible portion (e.g., the flexible portion 503 in FIG. 5, the flexible portion 603 in FIG. 6, or the flexible portion 703 in FIG. 7) interconnecting the first planar portion 501, 601, or 701 and the second planar portion (e.g., the second planar portion 502 in FIG. 5, the second planar portion 602 in FIG. 6, or the second planar portion 702 in FIG. 7), and arranged so as to be bendable. The flexible portion 503, 603, or 703 may include a plurality of support pieces (e.g., the support pieces 540 in FIG. 5, the support pieces 640 in FIG. 6, and the support pieces 740 in FIG. 7) arranged so as to be spaced apart from each other via a plurality of slits (e.g., the slits 530 in FIG. 5, the slits 630 in FIG. 6, or the slits 730 in FIG. 7) and a plurality of Velcro patterns (e.g., the Velcro patterns 1314 in FIGS. 13 to 15 or the Velcro patterns 2012, 2014, or 2016 in FIG. 20) extending in length from the plurality of support pieces 540, 640, or 740, and the Velcro patterns 1314, 2012, 2014, or 2016 of adjacent support pieces 540, 640, or 740 may be arranged so as to be engaged with each other in the form of a lattice.

According to an embodiment, the electronic device 100, 1000, or 1300 may include a conductive elastic member (e.g., the conductive elastic member 460 in FIG. 4B) electrically and physically interconnecting the first planar portion 501, 601, or 701, the plurality of support pieces 540, 640, or 740, and the second planar portion 502, 602, or 702.

According to an embodiment, the flexibility of the flexible portion 503, 603, or 703 may be determined by the conductive elastic member (e.g., the conductive elastic member 460 in FIG. 4B) interconnecting the plurality of support pieces 540, 640, or 740.

According to an embodiment, the flexibility of the flexible portion 503, 603, or 703 may be determined by width of the plurality of support pieces 540, 640, or 740.

According to an embodiment, the flexibility of the flexible portion 503, 603, or 703 may be determined by the length of the plurality of Velcro patterns 1314, 2012, 2014, or 2016.

According to an embodiment, the plurality of support pieces 540, 640, or 740 may be arranged to have a length in a first direction parallel to the folding axis (e.g., "A" in FIG. 5A) and to be spaced apart from each other at a predetermined interval in a second direction perpendicular to the first direction via the plurality of slits 530, 630, or 730.

According to an embodiment, the plurality of slits 530, 630, or 730 may include a resin.

According to an embodiment, the resin may be formed by being filled in the plurality of slits 530, 630, or 730 in a liquid form and being cured.

According to an embodiment, among the plurality of support pieces 540, 640, and 740, first support pieces 540, 640, or 740 may be decreased in width from the upper end of the flexible plate 500, 700, 900, 1100, 1200, 1310, 1700, 1800, 1900, 2010, 2210, or 2310 toward the central portion of the flexible plate. Among the plurality of support pieces 540, 640, or 740, second support pieces 540, 640, or 740 may be decreased in width from the lower portion of the flexible plate 500, 700, 900, 1100, 1200, 1310, 1700, 1800, 1900, 2010, 2210, or 2310 toward the central portion of the flexible plate.

According to an embodiment, the plurality of support pieces 540, 640, or 740 may be gradually increased or decreased in width leftward and rightward with respect to the folding axis (e.g., "A" in FIG. 5A) in the second direction.

According to an embodiment, the flexibility of the flexible portion 503, 603, or 703 may be determined based on the arrangement density of the plurality of support pieces 540, 640, or 740.

According to an embodiment, the plurality of support pieces 540, 640, or 740 may be gradually increased or decreased in interval leftward and rightward with respect to the folding axis (e.g., "A" in FIG. 5A) in the second direction.

According to an embodiment, the flexibility of the flexible portion 503, 603, or 703 may be determined by the widths of the plurality of support pieces 540, 640, or 740 which are different from each other in the first direction.

According to an embodiment, a first skin layer may be arranged in a partial area of the upper end of the flexible portion 503, 603, or 703.

According to an embodiment, a second skin layer may be arranged in a partial area of the lower end of the flexible portion 503, 603, or 703.

According to an embodiment, the flexibility of the flexible portion 503, 603, or 703 may be determined by the width of the plurality of Velcro patterns 1314, 2012, 2014, or 2016.

According to an embodiment, among the plurality of Velcro patterns 1314, 2012, 2014, or 2016, first Velcro patterns 1314a or 2012 may be arranged to have a first width at the upper end of the flexible plate 500, 700, 900, 1100, 1200, 1310, 1700, 1800, 1900, 2010, 2210, or 2310. Among the plurality of Velcro patterns 1314, 2012, 2014, or 2016, second Velcro patterns 1314b or 2014 may be arranged to have the first width at the lower end of the flexible plate 500, 700, 900, 1100, 1200, 1310, 1700, 1800, 1900, 2010, 2210, or 2310. Among the plurality of Velcro patterns 1314, 2012, 2014, or 2016, third Velcro patterns 2016 may be arranged to have a second width smaller than the first width in the central portion of the flexible plate 500, 700, 900, 1100, 1200, 1310, 1700, 1800, 1900, 2010, 2210, or 2310.

According to an embodiment, the flexible plate 500, 700, 900, 1100, 1200, 1310, 1700, 1800, 1900, 2010, 2210, or 2310 may include a front surface facing the polymer member 440 and a rear surface facing away from the front surface. The conductive elastic member (e.g., the conductive elastic member 460 in FIG. 4b) may be arranged on the rear surface of the flexible plate 500, 700, 900, 1100, 1200, 1310, 1700, 1800, 1900, 2010, 2210, or 2310 to block the flexible portion 503, 603, or 703.

According to an embodiment, the first planar portion 501, 601, or 701, the second planar portion 502, 602, or 702, and the flexible portion 503, 603, or 703 may include a carbon fiber reinforced plastic (CFRP).

According to an embodiment, the flexible plate 500, 700, 900, 1100, 1200, 1310, 1700, 1800, 1900, 2010, 2210, or 2310 may include at least one of Cu, Al, Mg, SUS, or CLAD in which SUS and Al are alternately arranged.

The embodiments of the disclosure disclosed in this specification and drawings are provided merely to propose specific examples in order to easily describe the technical features according to the embodiments of the disclosure and to help understanding of the embodiments of the disclosure, and are not intended to limit the scope of the embodiments of the disclosure. Accordingly, the scope of the certain embodiments of the disclosure should be construed in such a manner that, in addition to the embodiments disclosed herein, all changes or modifications derived from the technical idea of the certain embodiments of the disclosure are included in the scope of the certain embodiments of the disclosure.

What is claimed is:

1. An electronic device, comprising:
a hinge module forming a folding axis;
a first housing operatively connected to the hinge module;
a second housing operatively connected to the hinge module, so as to be foldable relative to the first housing; and
a display disposed on and spanning from at least a portion of the first housing to at least a portion of the second housing across the hinge module,
wherein the display includes:
a display panel,
at least one polymer member arranged on a rear surface of the display panel, and a flexible plate arranged on a rear surface of the at least one polymer member,
wherein the flexible plate includes:
a first planar portion facing the first housing,
a second planar portion facing the second housing, and
a flexible portion that is bendable, and interconnecting the first planar portion and the second planar portion,
wherein the flexible portion includes a plurality of support pieces arranged so as to be spaced apart from each other via a plurality of slits, and a plurality of Velcro patterns extending lengthwise from the plurality of support pieces, and
wherein the Velcro patterns of adjacent support pieces are disposed so as to be engaged with one another in a lattice form.

2. The electronic device of claim 1, further comprising:
a conductive elastic member electrically and physically connecting the first planar portion, the plurality of support pieces, and the second planar portion.

3. The electronic device of claim 2, wherein a flexibility of the flexible portion is based at least partly on the conductive elastic member connecting the plurality of support pieces.

4. The electronic device of claim 1, wherein a flexibility of the flexible portion is based at least partly on a width of the plurality of support pieces.

5. The electronic device of claim 1, wherein a flexibility of the flexible portion is based at least partly on a length of the plurality of Velcro patterns.

6. The electronic device of claim 1, wherein the plurality of support pieces each include a certain length extending in a first direction parallel to the folding axis, and
wherein each of the plurality of support pieces are spaced apart from each other at a predetermined interval via the plurality of slits extending in a second direction perpendicular to the first direction.

7. The electronic device of claim 6, wherein the plurality of slits are at least partially filled with a resin.

8. The electronic device of claim 7, wherein the resin is introduced into the plurality of slits in a liquid form, and then cured.

9. The electronic device of claim 1, wherein:
a first subset of the plurality of support pieces include a first taper decreasing in width from an upper end of the flexible plate toward a central portion of the flexible plate, and
a second subset of the plurality of support pieces include a second taper decreasing in width from a lower end of the flexible plate toward the central portion of the flexible plate.

10. The electronic device of claim 1, wherein the plurality of support pieces include a taper gradually increasing or decreasing in width in a second direction perpendicular to the first direction with respect to the folding axis.

11. The electronic device of claim 3, wherein flexibility of the flexible portion is determined at least in part by an arrangement density of the plurality of support pieces.

12. The electronic device of claim 11, wherein the plurality of support pieces gradually increase or decrease in interval both leftward and rightward along the second direction with respect to the folding axis.

13. The electronic device of claim 1, wherein flexibility of the flexible portion is determined at least in part by respective widths of the plurality of support pieces, and
wherein the respective widths of each of the plurality of support pieces are different from each other.

14. The electronic device of claim 1, further comprising:
a first skin layer arranged on at least a partial area of an upper end of the flexible portion.

15. The electronic device of claim 14, further comprising:
a second skin layer arranged on at least a partial area of a lower end of the flexible portion.

16. The electronic device of claim 1, wherein flexibility of the flexible portion that is determined at least in part by a width of each of the plurality of Velcro patterns.

17. The electronic device of claim 16, wherein, the plurality of Velcro patterns includes a first, second and third Velcro pattern,
wherein the first Velcro patterns have a first width at an upper end of the flexible plate,
wherein the second Velcro patterns have the first width at a lower end of the flexible plate, and
wherein the third Velcro patterns have a second width smaller than the first width in a central portion of the flexible plate.

18. The electronic device of claim 2, wherein the flexible plate includes a front surface facing the polymer member and a rear surface facing away from the front surface, and
wherein the conductive elastic member is arranged on the rear surface of the flexible plate, blocking the flexible portion.

19. The electronic device of claim 1, wherein the first planar portion, the second planar portion, and the flexible portion include a carbon fiber reinforced plastic (CFRP).

20. The electronic device of claim 1, wherein the flexible plate includes at least one of copper, aluminum, magnesium, stainless steel, or a clad material in which stainless steel and aluminum are alternately arranged.

* * * * *